United States Patent [19]

Nishimura et al.

[11] Patent Number: 4,916,558
[45] Date of Patent: Apr. 10, 1990

[54] CIRCUIT FOR FETCHING (1-7) RUN-LENGTH-LIMITED CODED WRITE DATA

[75] Inventors: Masahiro Nishimura, Yokohama; Fumiaki Nagakura, Kumagaya; Hiroyuki Mase, Kawasaki, all of Japan

[73] Assignee: Fujitsu Limited, Kawasaki, Japan

[21] Appl. No.: 246,339

[22] Filed: Sep. 19, 1988

[30] Foreign Application Priority Data

Sep. 18, 1987 [JP] Japan ................................. 62-232582
Sep. 18, 1987 [JP] Japan ................................. 62-232583
Sep. 18, 1987 [JP] Japan ................................. 62-232584

[51] Int. Cl.4 ............................................. G11B 5/09
[52] U.S. Cl. .................................................... 360/51
[58] Field of Search .................. 360/51, 210; 375/111, 375/23, 95

[56] References Cited

U.S. PATENT DOCUMENTS 4,768,208  8/1988  Cornett ................................. 360/51
4,823,209  4/1989  Minuhin ............................... 360/51

Primary Examiner—Vincent P. Canney
Attorney, Agent, or Firm—Staas & Halsey

[57] ABSTRACT

In writing (1-7) RLL coded write data into a magnetic disk, a write data fetching circuit wherein a clock signal of a frequency three times a fundamental frequency of a write clock signal is generated based on a signal from a servo head of the magnetic disk, three clock signals are generated from the clock signal, one of the three clock signals and the write clock signal are synchronized, and the write data output in accordance with the write clock signal is subjected to (1-7) RLL encoding using a clock signal synchronized with one of the three clock signals, whereby stable (1-7) RLL encoding is made possible without the use of a precise clock signal with a 50 percent duty ratio.

20 Claims, 35 Drawing Sheets

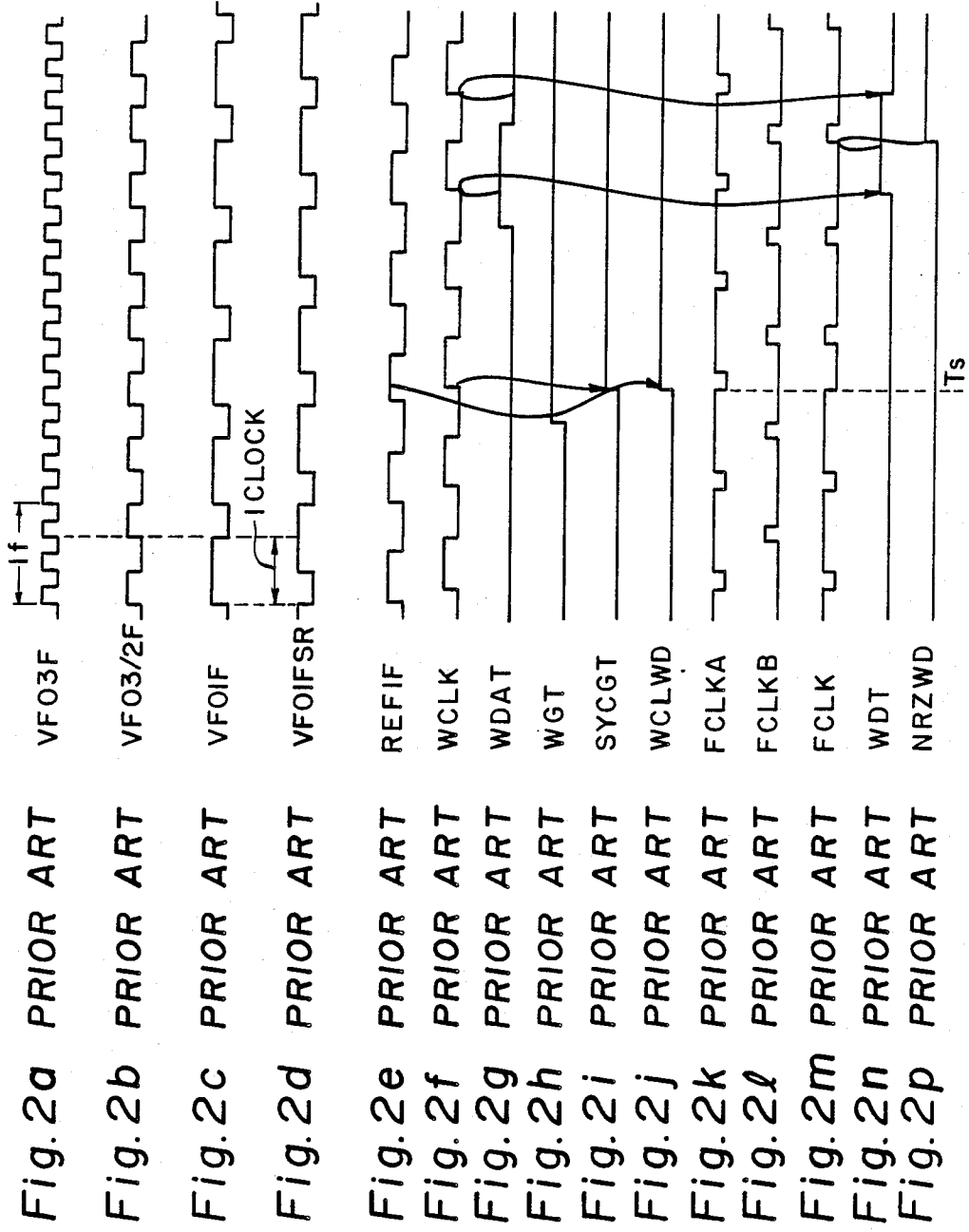

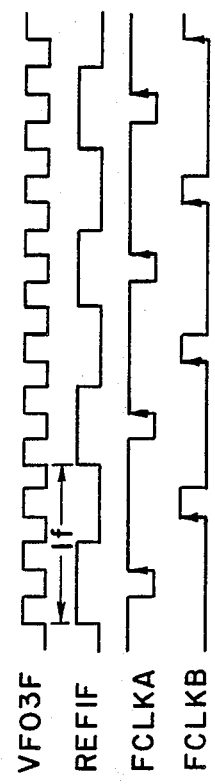
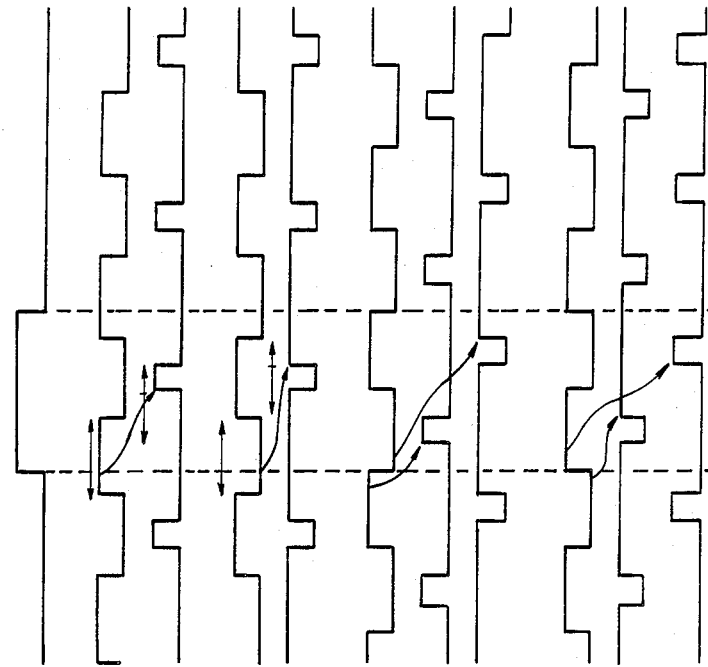
Fig. 3a PRIOR ART VFO3F
Fig. 3b PRIOR ART REFIF
Fig. 3c PRIOR ART FCLKA
Fig. 3d PRIOR ART FCLKB
Fig. 3e PRIOR ART WDT
Fig. 3f1 PRIOR ART REFIF
Fig. 3f2 PRIOR ART FCLKB
Fig. 3g1 PRIOR ART REFIF
Fig. 3g2 PRIOR ART FCLKA
Fig. 3h1 PRIOR ART REFIF
Fig. 3h2 PRIOR ART FCLKB
Fig. 3h3 PRIOR ART FCLKA
Fig. 3i1 PRIOR ART REFIF
Fig. 3i2 PRIOR ART FCLKA
Fig. 3i3 PRIOR ART FCLKB

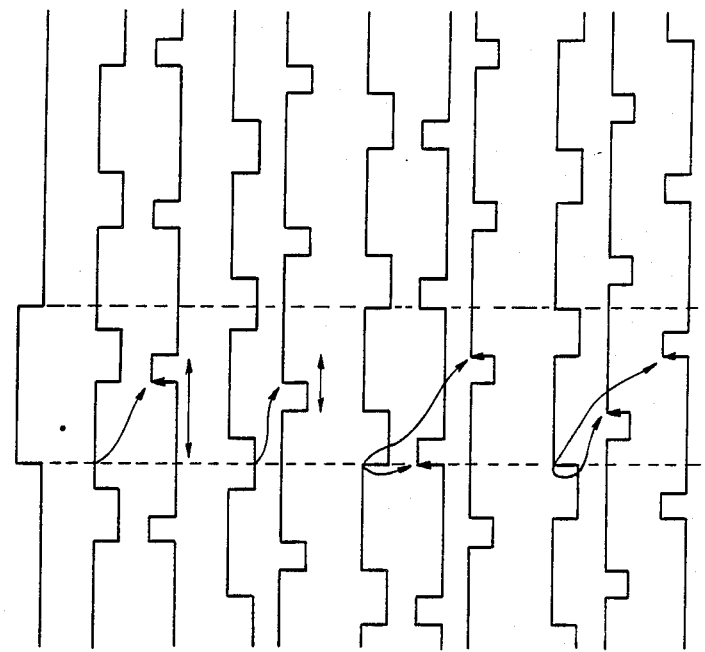

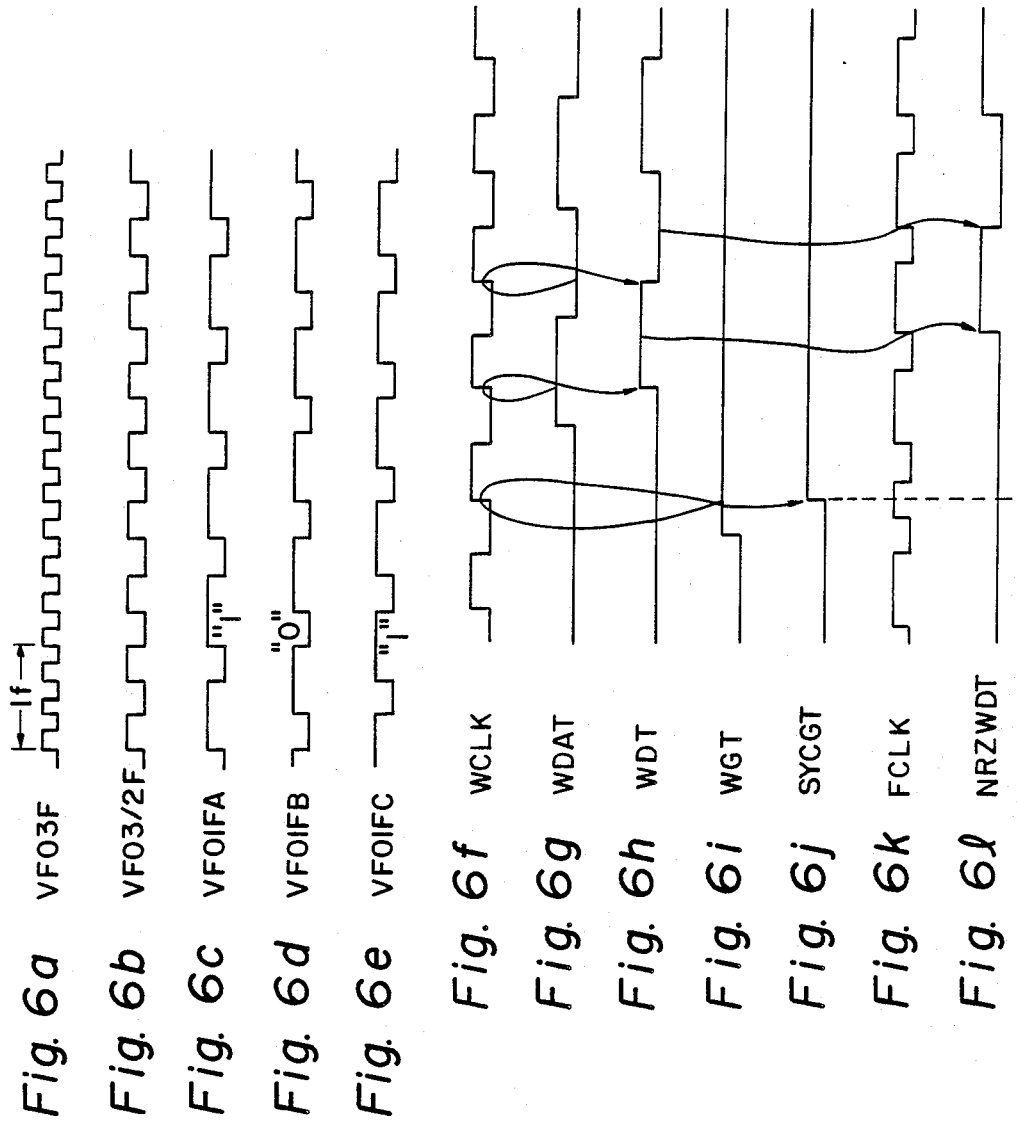

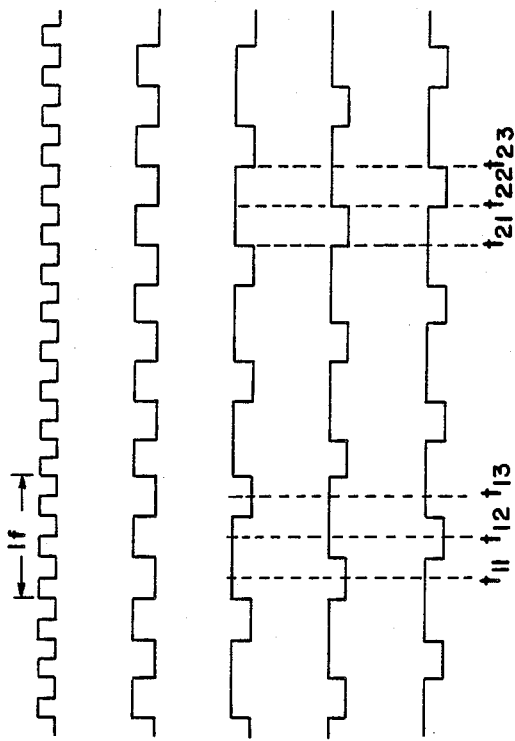

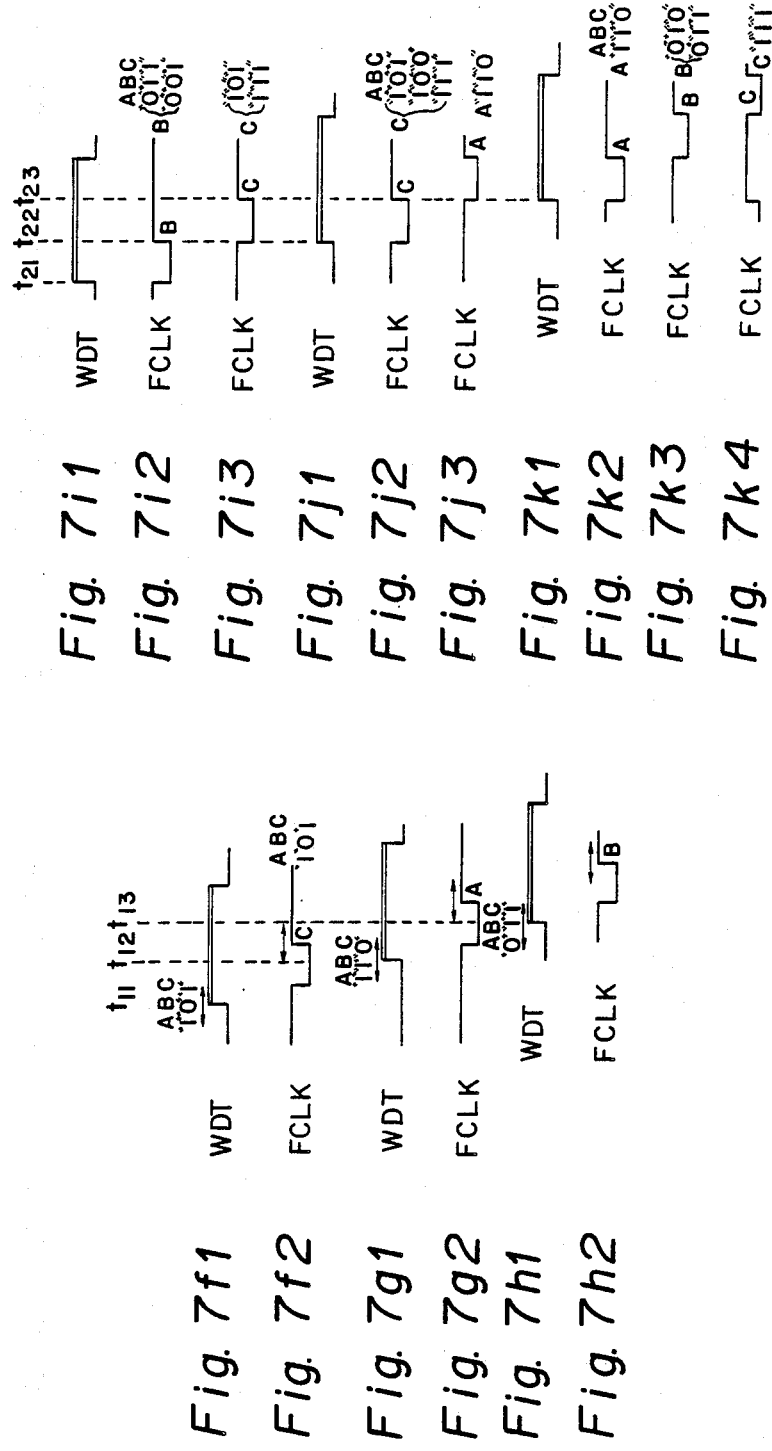

| Fig. 8A |
| Fig. 8B |

Fig. 10a  VFO3F
Fig. 10b  VFO3/2F
Fig. 10c  VFO1FA
Fig. 10d  VFO1/2F
Fig. 10e  VFO-5
Fig. 10f  VFO-1
Fig. 10g  VFO-2
Fig. 10h  VFO-4

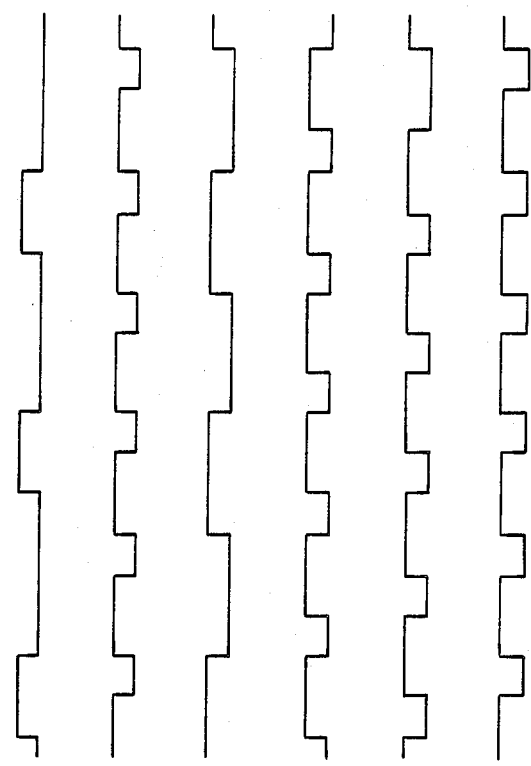

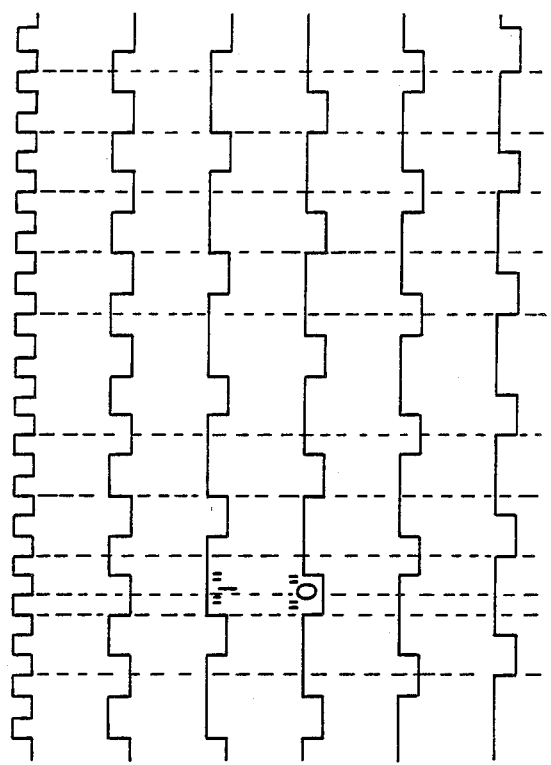
Fig. 12a  VFO3F
Fig. 12b  VFO3/2F
Fig. 12c  VFOIFA
Fig. 12d  VFOIFB
Fig. 12e  VFOIFC
Fig. 12f  DLVFOIFC

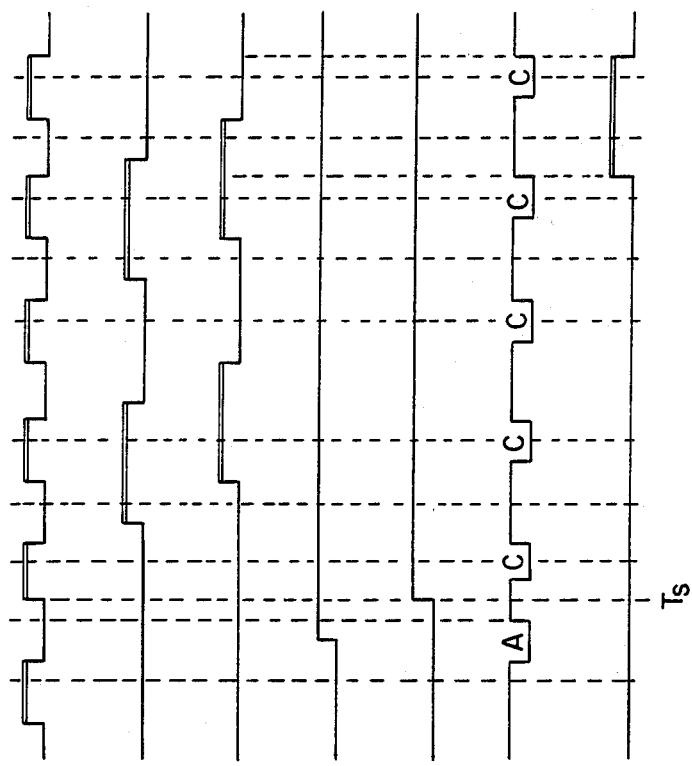
Fig. 12g WCLK
Fig. 12h WDAT
Fig. 12i WDT
Fig. 12j WGT
Fig. 12k SYCGT
Fig. 12ℓ FCLK(X.Y.Z)(1 0 1)
Fig. 12m NRZWDT

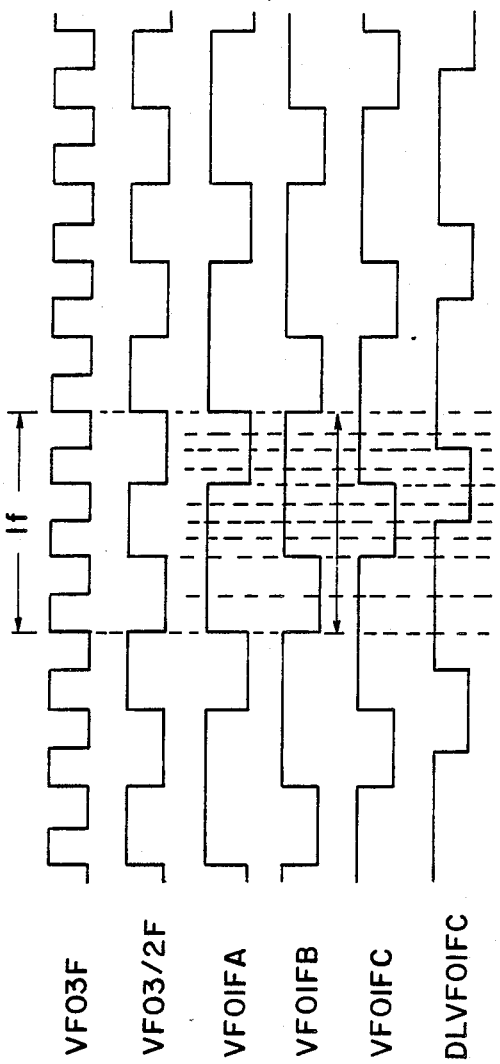
Fig. 13a  VFO3F
Fig. 13b  VFO3/2F
Fig. 13c  VFO1FA
Fig. 13d  VFO1FB
Fig. 13e  VFO1FC
Fig. 13f  DLVFO1FC

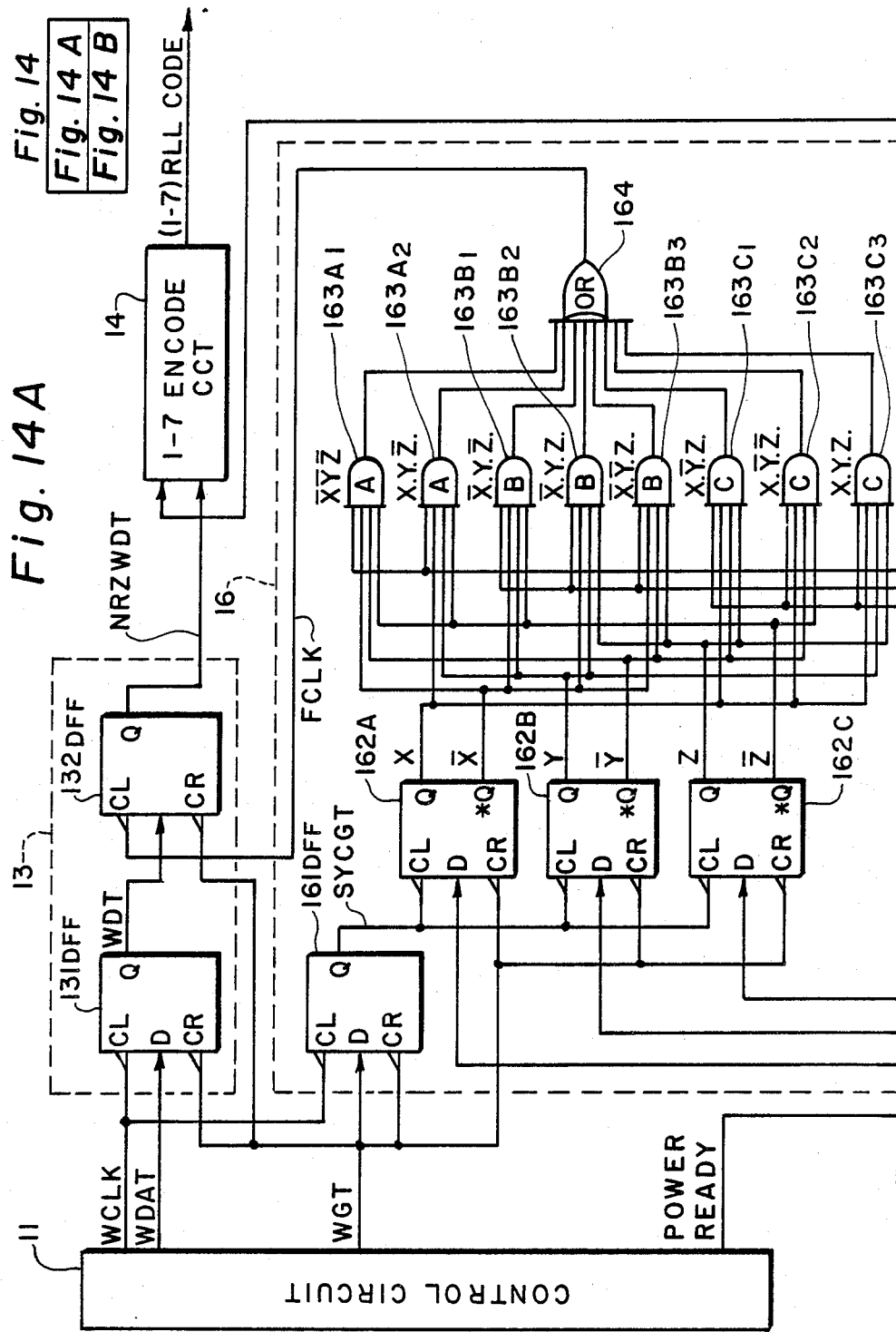

Fig. 16a  VFO 3F
Fig. 16b  VFO 3/2 F
Fig. 16c  VFO 1/2 FRA
Fig. 16d  VFO 1/2 FRB
Fig. 16e  VFO 1/2 FRC

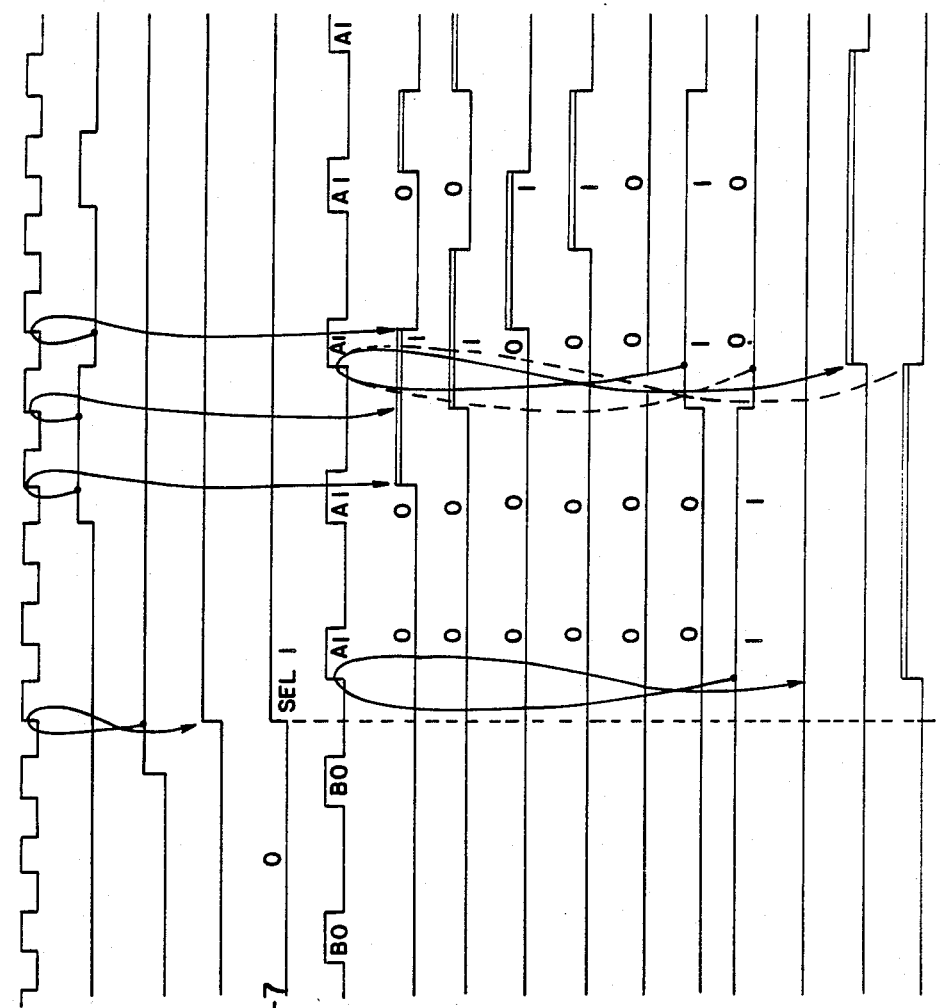

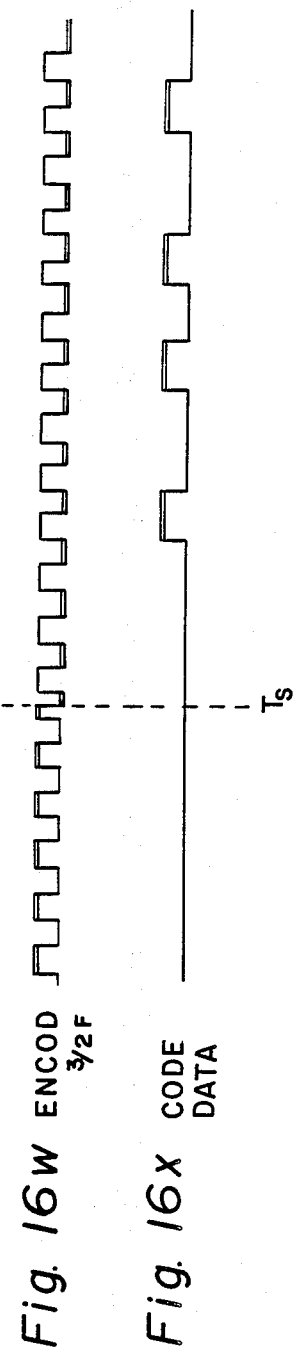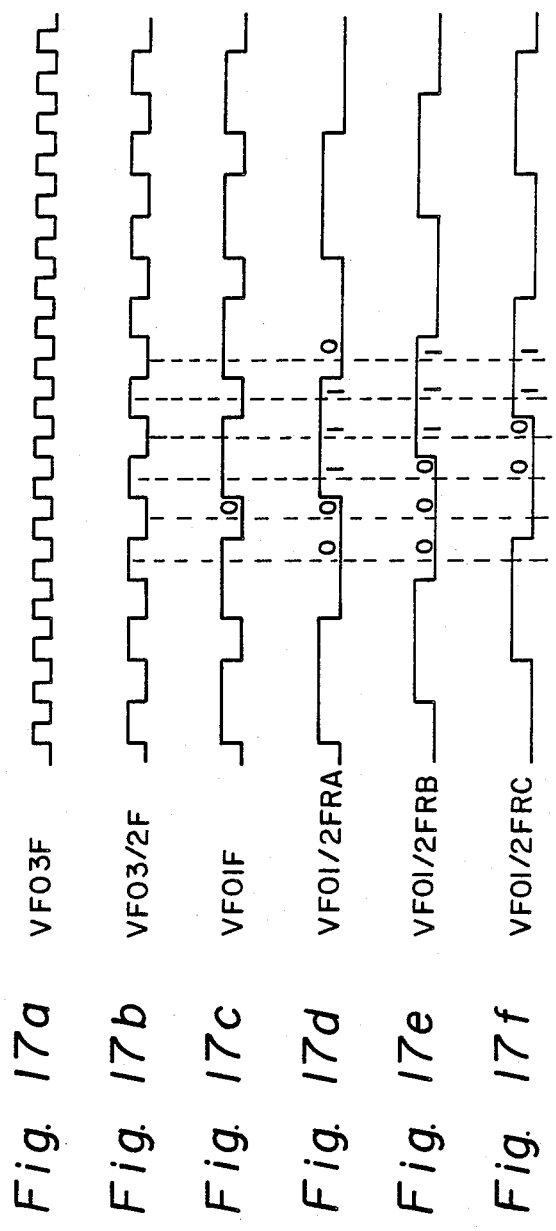

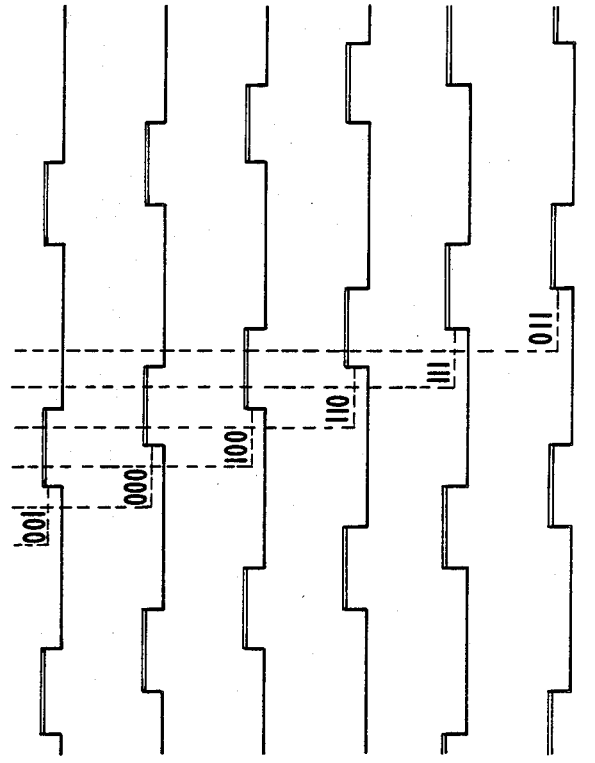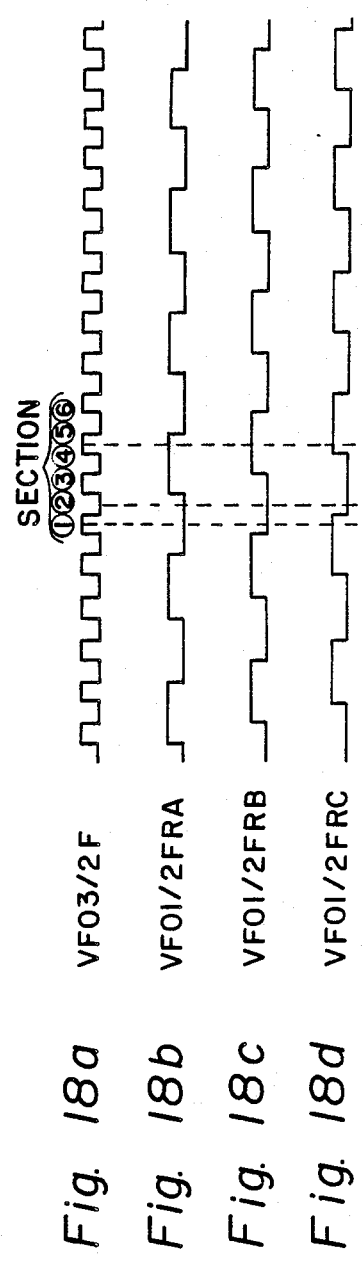
Fig. 17g
Fig. 17h
Fig. 17i
Fig. 17j
Fig. 17k
Fig. 17l
Fig. 18a
Fig. 18b
Fig. 18c
Fig. 18d

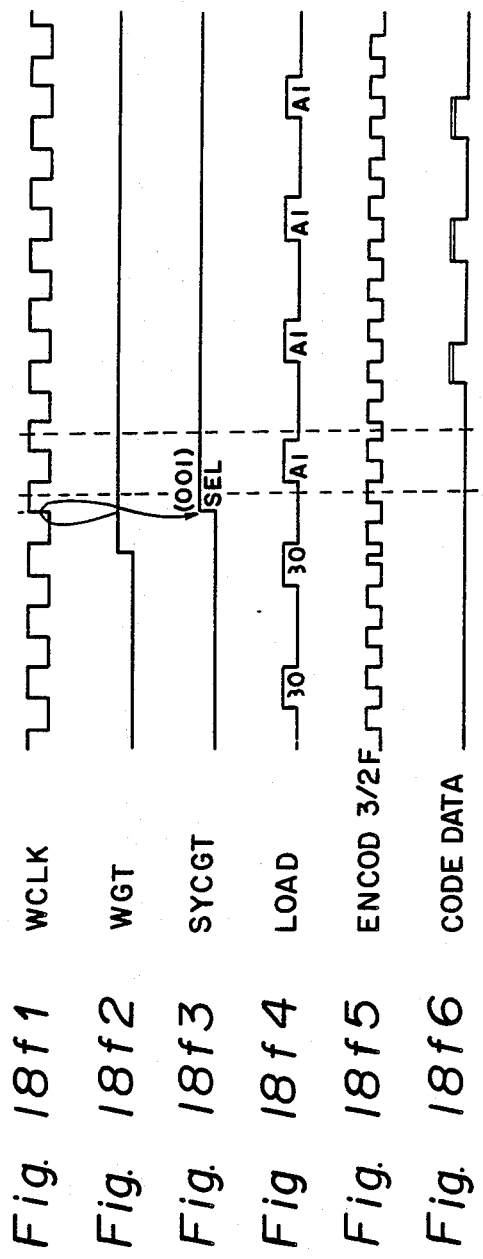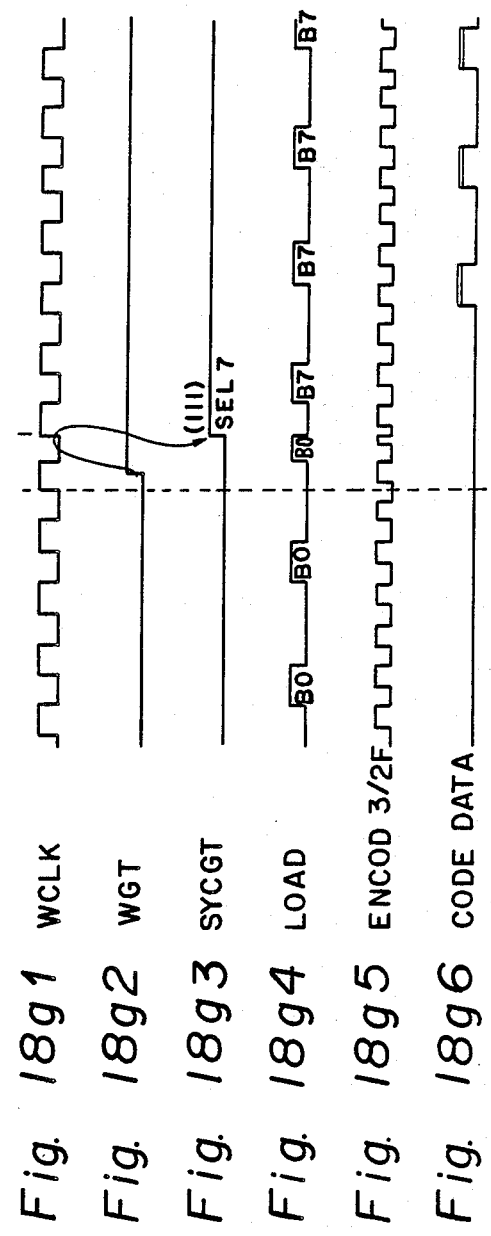

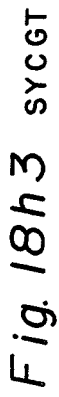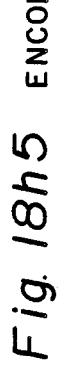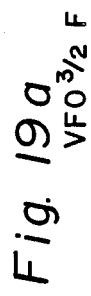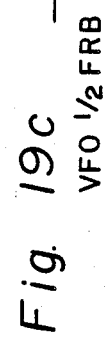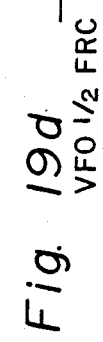
Fig. 18h1 WCLK
Fig. 18h2 WGT
Fig. 18h3 SYCGT
Fig. 18h4 LOAD
Fig. 18h5 ENCOD 3/2F
Fig. 18h6 CODE DATA
Fig. 19a VFO 3/2 F
Fig. 19b VFO 1/2 FRA
Fig. 19c VFO 1/2 FRB
Fig. 19d VFO 1/2 FRC

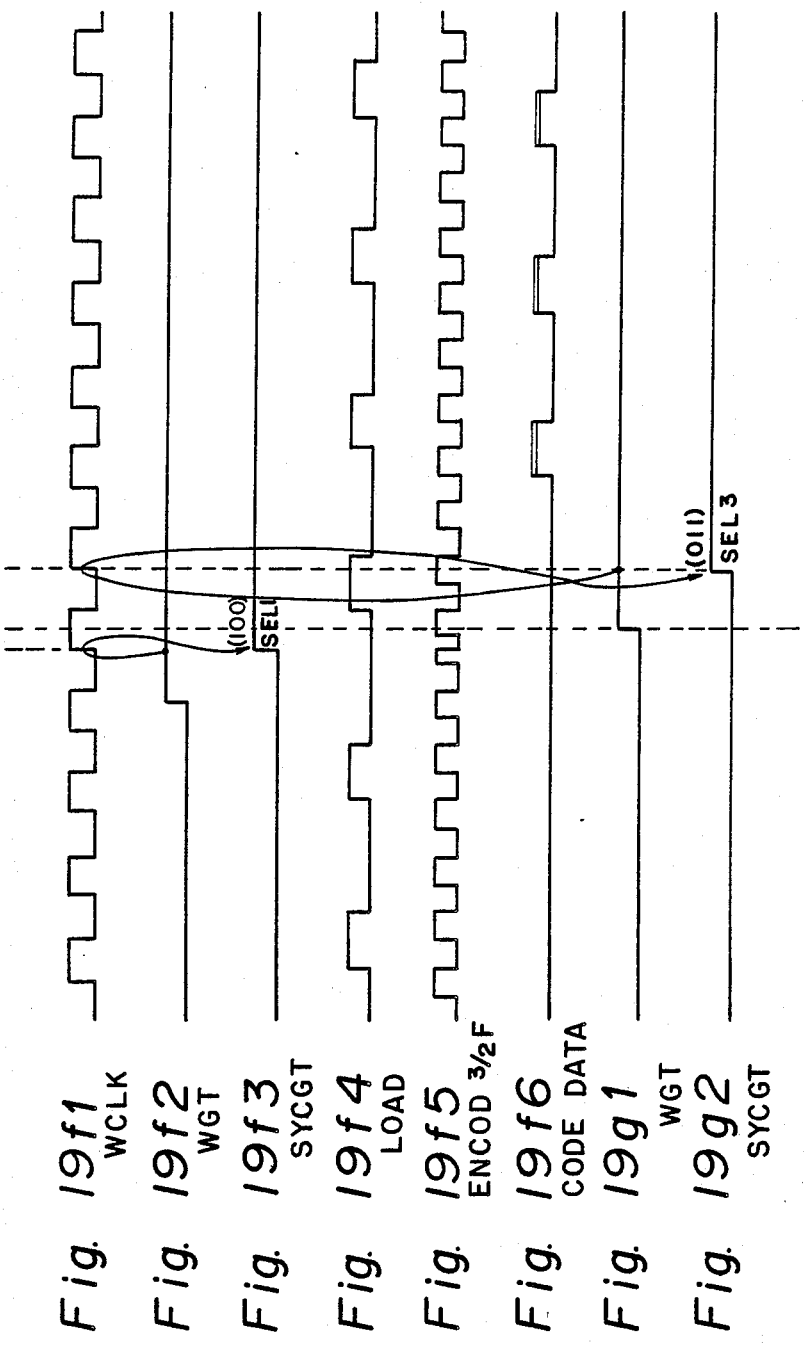

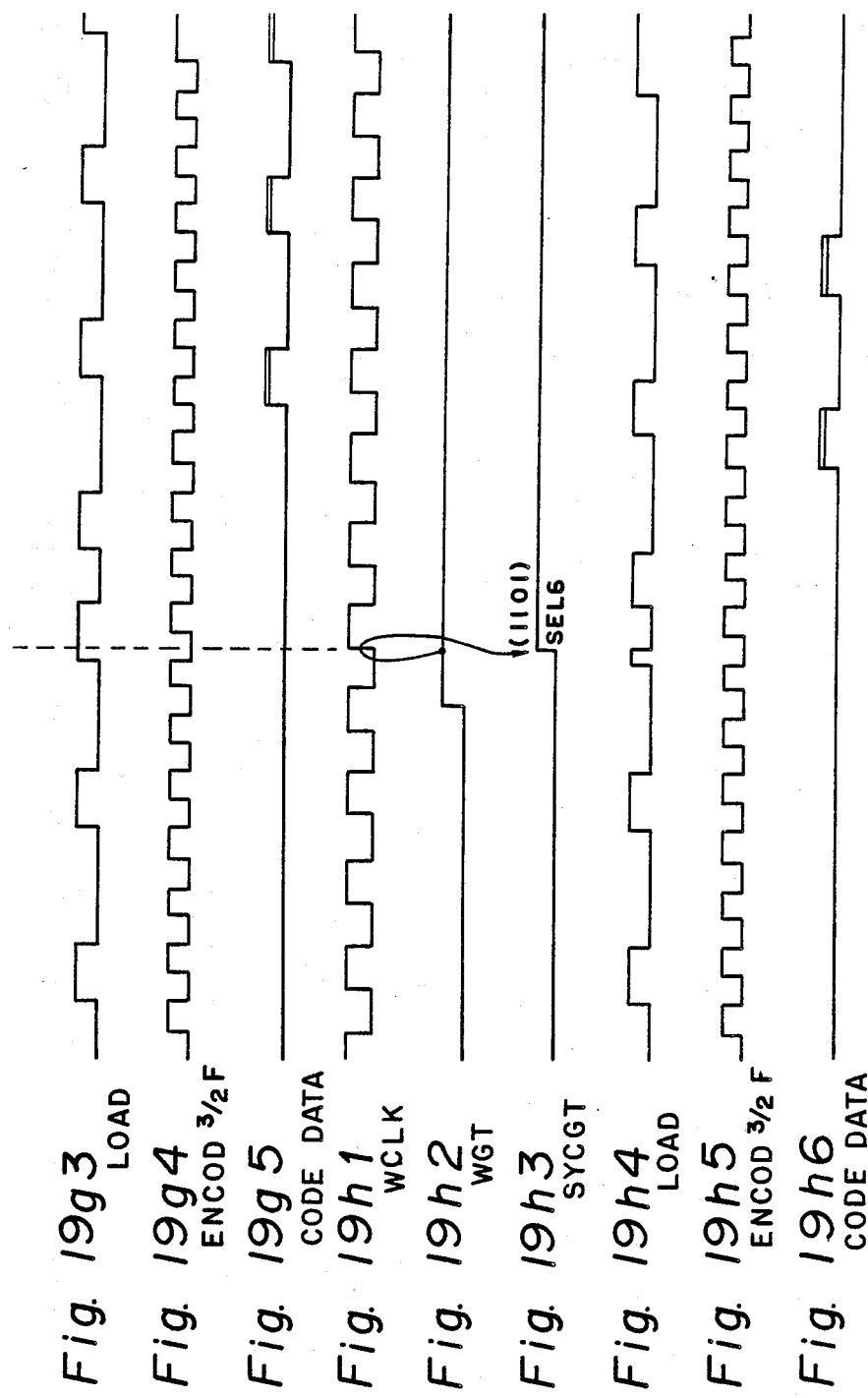

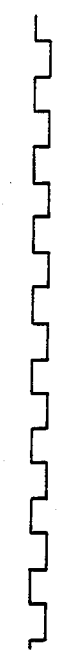
Fig. 22a  VFO3F
Fig. 22b  VFO3/2F
Fig. 22c  VFO1F
Fig. 22d  VFO1/2FRA
Fig. 22e  VFO1/2FA1
Fig. 22f  VFO1/2FA6
Fig. 22g  VFO-1
Fig. 22h  VFO-2
Fig. 22i  VFO-5

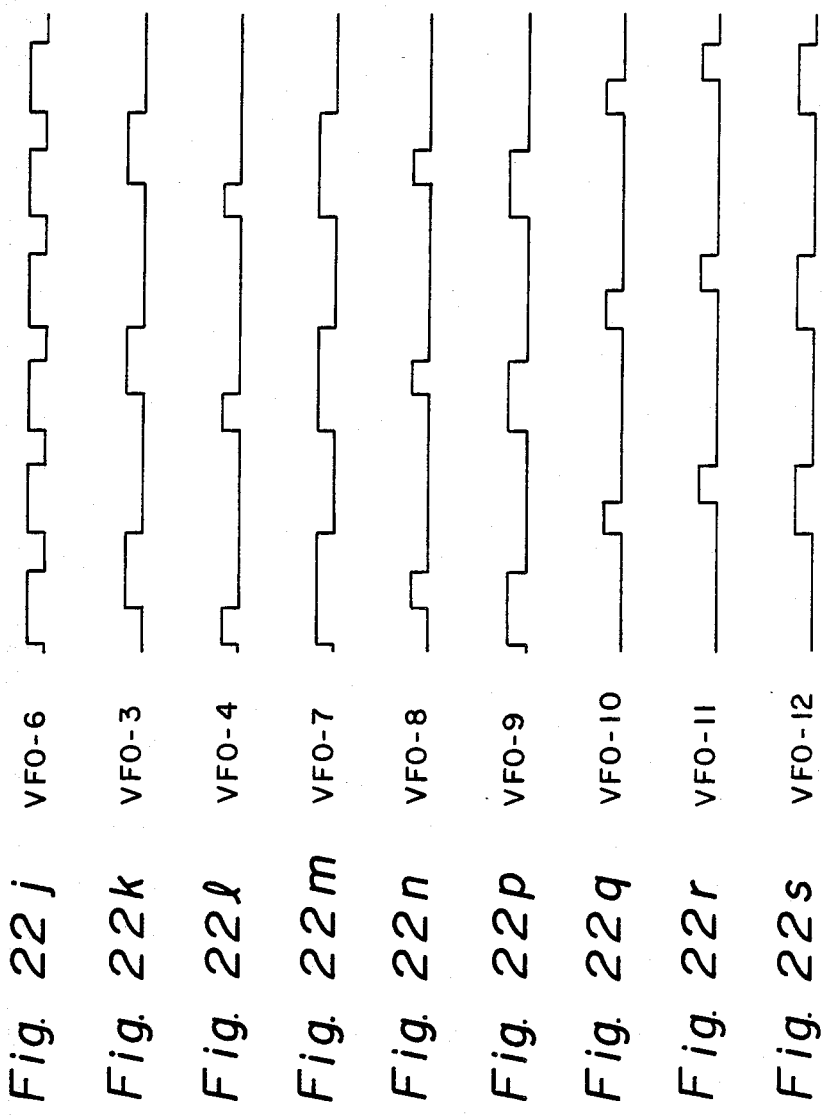

CIRCUIT FOR FETCHING (1-7) RUN-LENGTH-LIMITED CODED WRITE DATA

BACKGROUND OF THE INVENTION

1. Field of the Invention

The present invention relates to a magnetic disk apparatus, more particularly to a write data fetching circuit, provided in a magnetic disk apparatus, which fetches write data for an encoding circuit of one of the run-length-limited (RLL) codes, i.e., a (1-7) RLL code.

2. Description of the Related Art

To increase the capacity of magnetic disk apparatuses, the following methods are used: a. increasing the number of magnetic disks, b. raising the track density of the magnetic disks, c. raising the bit density, etc. The method a. can be easily realized, but since the number of disks increases, the cost of the product also rises. The method b. cannot be easily realized, so considerable development costs and time are required. The method c. is advantageous in terms of both product cost and development costs, so it is most often used for achieving larger capacities of magnetic disk apparatuses.

To raise the bit density of the magnetic disks, it is necessary to select a suitable recording code. That is, when the SN ratio, head floating height, thickness of the recording medium, magnetic characteristics, and other conditions are set, the recording code is selected so as to maximize the planar density. In this case, consideration is given to the characteristics of the magnetic recording medium, and it is demanded that the code be resistant to defects of the magnetic medium and inter-symbol interference and that a high recording density can be obtained.

To satisfy these demands, use is currently made of the non-return zero inversion (NRZI), 4/5 GCR, modified frequency modulation (MFM), run-length-limited (RLL), and other coding methods. The Rll code requires the presence of a minimum (d) and maximum (k) slots in the transition between two codes and is thus called a "(d-k) RLL code". For example, the RLL code includes a (2-7) RLL code and (1-7) RLL code. The (2-7) RLL encoding method is disclosed in, for example, the specification of U.S. Pat. No. 3,689,899, and the (1-7) RLL encoding method is disclosed in the specification of U.S. Pat. No. 4,488,142.

The frequency of the clock used in the transmission and reception of data between a magnetic disk apparatus using a (2-7) RLL code and the control apparatus of the host controller is a fundamental frequency $(1f)$, but in the (2-7) RLL-code encoding circuit in the magnetic disk apparatus, the frequency of the clock is two times the fundamental frequency $(2f)$. This double frequency $2f$ clock is prepared by a servocircuit in the magnetic disk apparatus. Below, this double frequency $2f$ clock will be abbreviated as VFO2F.

Since the fundamental frequency $1f$ and the VFO2F prepared in the magnetic disk apparatus are asynchronous, when fetching data from the control circuit to the encoding circuit in the magnetic disk apparatus, it is necessary to synchronize the fundamental frequency $1f$ with the clock VFO1F, which consists of the VFO2F prepared by the magnetic disk apparatus divided in half and which has the same frequency as the fundamental frequency. In this case, it is necessary to synchronize with the clock VFO1F of the fundamental frequency no matter what the state, so the VFO1F is made a two-phase clock so that data can be fetched. The VFO1F and two-phase clock signal at this time can be easily prepared from the VFO2F in the magnetic disk apparatus.

Even in a magnetic disk apparatus using the (1-7) RLL signal, the fundamental frequency for transmission and reception of data between the control circuit and encoding circuit is $1f$ just as in the case of use of a (2-7) RLL code.

However, a (1-7) RLL-code encoding circuit operates on a clock $(3/2)f$ of a frequency 1.5 times the fundamental frequency $1f$. In this case, the magnetic disk apparatus issues a clock VFO3F having a frequency $3f$ three times the fundamental frequency. By dividing this, a clock VFO3/2F is prepared having a frequency $3/2$ times the fundamental frequency.

The transmission and reception of data performed between the control circuit and encoding circuit are performed by a clock of the fundamental frequency $1f$, so it is necessary to divide the VFO3F prepared in the magnetic disk apparatus by three to prepare a clock VFO1F having a fundamental frequency and to synchronize it with the fundamental frequency $1f$.

In the case of the (1-7) RLL signal, as explained in detail next, it is necessary to prepare a precise clock VFO1F with a duty ratio of 50 percent and to synchronize it with the fundamental frequency $1f$. However, a clock of a digital signal with a high frequency differs from an analog signal. It is extremely difficult to precisely divide it into $1/m$, where m is any number other than $2^n$, except $\frac{1}{2}^n$, where n is an integer. Therefore, the resultant frequency-division circuit cannot have sufficient precision and stability.

The above problems will be explained later with reference to the drawings.

SUMMARY OF THE INVENTION

The present invention has as its object the provision of a highly reliable write data fetching circuit which does not use a clock of a fundamental frequency $1f$ with a 50 percent duty ratio and which can prepare a write data fetching clock with a simple circuit construction and perform fetching of write data without error.

According to a first aspect of the present invention, there is provided a circuit for fetching RLL coded write data including a triple frequency clock signal generating circuit which generates a triple frequency clock signal having a frequency three times a fundamental frequency of a write clock signal; a system clock signal generating circuit which receives as its input the triple frequency clock signal from the triple frequency clock signal generating circuit and generates three clock signals differing from each other by 120° in phase and a first frequency divided signal formed by dividing in half the triple frequency clock signal; a fetching clock generating circuit which receives a write gate signal, the write clock signal and the three clock signals from the system clock generating circuit and generates a fetching clock signal synchronized with at least one clock signal of the three clock signals at the point of change of the write clock signal directly after the generation of the write gate signal; a synchronization and fetching circuit which performs once a synchronization and fetching operation on the write data by the write clock signal and performs a further synchronization and fetching operation on the synchronized and fetched write data by the fetching clock signal; and a RLL encoding circuit which performs RLL coding on the synchronized and fetched write data from the synchronization and fetching circuit based on the first frequency divided signal of the system clock generating circuit.

Further, according to the present invention, the system clock generating circuit can receive the triple frequency clock signal and generate three signals differing by 120° and further can generate a clock signal formed by delaying one of the three clock signals by within 1/6 of the fundamental frequency.

According to a second aspect of the present invention, there is provided a circuit for fetching RLL coded write data including a triple frequency clock signal generating circuit which generates a triple frequency clock signal having a frequency three times a fundamental frequency of a write clock signal; a system clock signal generating circuit which receives the triple frequency clock signal from the triple frequency clock signal generating circuit and generates three reference clock signals having a frequency half that of the fundamental freque ncy of the write clock signal and being respectively successively shifted by a clock of a triple frequency of the triple frequency clock signal, a first frequency divided clock signal formed by dividing in half the triple frequency clock signal and a second frequency divided clock signal formed by inverting the first frequency divided clock signal, and six synchronization clock signals having a frequency half the fundamental frequency, having a 2-bit pulse width, and respectively successively shifted by once cycle of the triple frequency clock signal; a synchronization signal generating circuit which receives a write gate signal output in response to the output of write data, the write clock signal, the three reference clock signals from the system clock signal generating circuit, and the six synchronization clock signals and generates a load signal having a frequency half the fundamental frequency and synchronized with one of the six synchronization clock signals in accordance with the state of the three reference clock signals at the point of change of the write clock signal directly after the generation of the write gate signal and an encoding clock signal having a frequency 1.5 times the fundamental frequency and synchronized with one of the first or second frequency divided clock signals in accordance with the state of the three reference clock signals; a data shift circuit which receives the write data and write clock signal, synchronizes the write data to the write clock signal in phase, and outputs four pieces of data of 2-bit units each shifted by one bit; a RLL encoding circuit which receives the four pieces of data of the data shift circuit and performs RLL coding on them; and a synchronization circuit which receives the load signal and encoding clock signal from the synchronization signal generating circuit and converts to a serial format the parallel code data output from the RLL encoding circuit to 3-bit unit code data synchronized with the encoding clock signal.

BRIEF DESCRIPTION OF THE DRAWINGS

Other objectives and features of the present invention will be described below in detail with reference to the accompanying drawings, in which:

FIGS. 2a to 2a are signal waveform diagrams of a conventional (1–7) RLL code write data fetching circuit;

FIGS. 3a to 3a3 are signal waveform diagrams of when the REF1F of the conventional (1–7) RLL code write data fetching circuit has a 50 percent duty ratio;

FIG. 4a to 4i3 are signal waveform diagrams of when the REF1F of the conventional (1–7) RLL code write data fetching circuit does not have a 50 percent duty ratio;

FIGS. 6a and 6l are signal waveform diagrams of FIG. 5;

FIGS. 7a to 7k4 are signal waveform diagrams illustration the write data fetching operation of FIG. 5;

FIGS. 10a to 10n are signal waveform diagrams of the system clock preparing circuit of FIG. 9;

FIGS. 12a to 12m are signal waveform diagrams of FIG. 11;

FIGS. 13a to 13p are signal waveform diagrams of the write data fetching are operation of FIG. 11;

FIGS. 14A and 14B are circuit diagrams of the second embodiment of the present invention;

FIGS. 16a to 16x are signal waveform diagrams of FIG. 15;

FIGS. 17a to 17l are signal waveform diagrams of the system clock preparing circuit of FIG. 15;

FIG. 18a to 18h6 and FIGS. 19a to 19h6 are signal waveform diagrams of the synchronization signal generating circuit of FIG. 15;

FIGS. 22a to 22s are signal waveform diagrams of the system clock preparing circuit of FIG. 21.

DESCRIPTION OF THE PREFERRED EMBODIMENTS

Before explaining the preferred embodiments of the present invention, an explanation will be made of the conventional (1–7) RLL code write data reading circuit and its write data fetching operation with reference to FIGS. 1 to 4.

Figure 1:
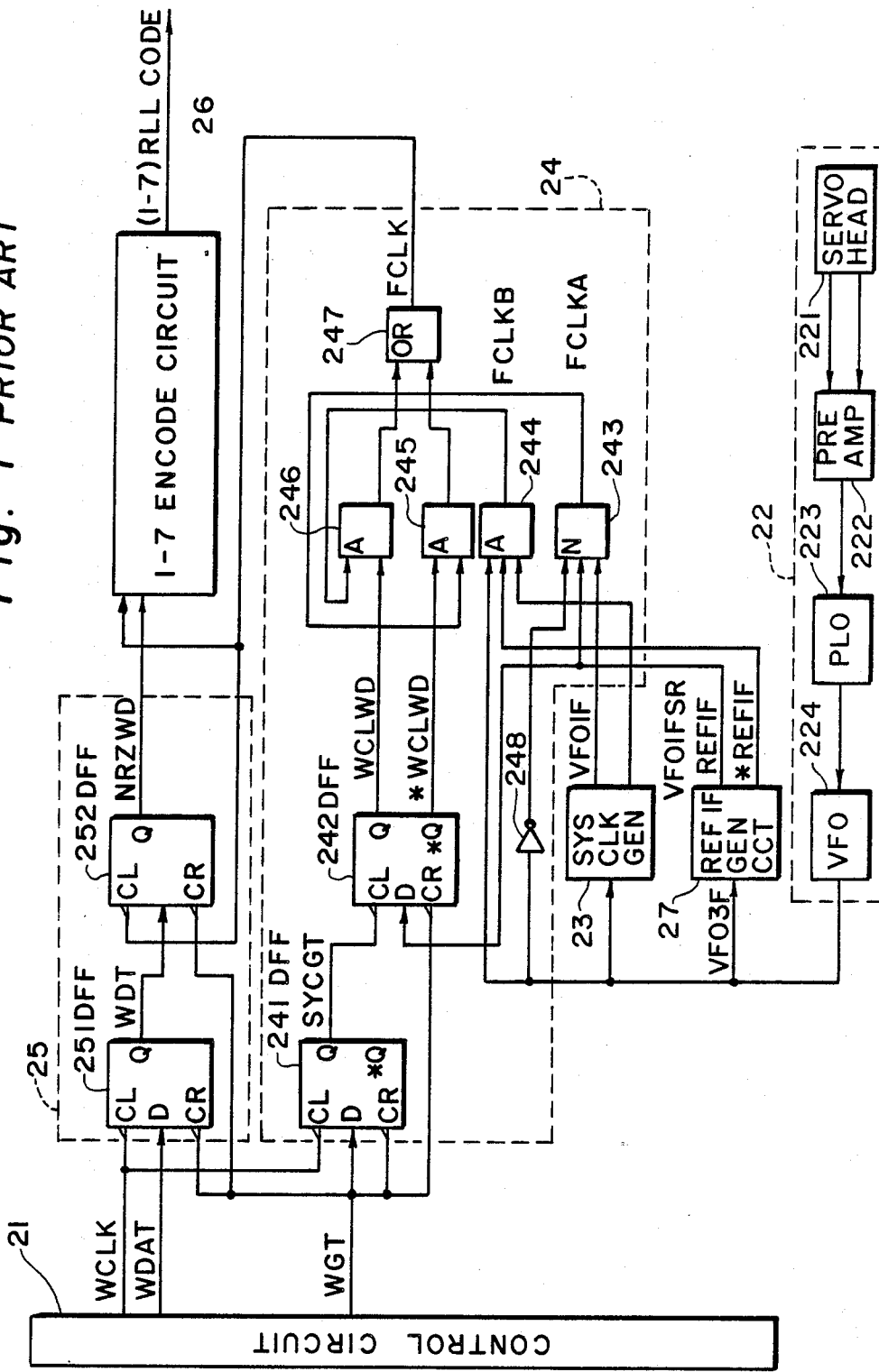
FIG. 1 is a block diagram of a conventional (1–7) RLL code write data fetching circuit; V$^c$

FIG. 1 is a block diagram of the structure of a write data fetching circuit in the case of a (1–7) RLL code. FIG. 2 is an overall signal waveform diagram. FIG. 3 is a signal waveform diagram in the case where the duty ratio of a reference signal REF1F with the fundamental frequency 1$f$ is 50 percent, and FIG. 4 is a signal waveform diagram in the case where the duty ratio of REF1F is not 50 percent.

In FIG. 1, when a control circuit 21 is writing into a magnetic disk apparatus (not shown), the control circuit 21 issues a write clock signal WCLK of the fundamental frequency 1$f$ (see FIG. 2$f$), a write data signal WDAT (see FIG. 2$g$), and a write gate signal WGT (see FIG. 2$h$). WDAT is issued synchronously with WCLK after a fixed time delay. WGT is issued asynchronously with WCLK.

The servo circuit 22 is provided internally with a servo head 221, a premplification circuit (PREAMP) 222, a phase-locked oscillation circuit (PLO circuit) 223, and a variable frequency oscillation circuit (VFO circuit) and issues a triple frequency clock signal VFO3F with a frequency $3f$ three times the fundamental frequency $1f$ (see FIG. 2a). This VFO3F is asynchronous with the WCLK of the frequency $1f$. Note that the frequency VFO3/2F, 3/2 the fundamental frequency $1f$, i.e., the signal VFO3F divided by ½, is produced in the process of preparation of the VFO1F.

The system clock preparing circuit 23 receives the VFO3F prepared by the servo circuit 22, divides this in 1/3, and prepares and outputs the VFO1F (see FIG. 2c) and shifts by one clock cycle of the VFO3F this VFO1F to prepare and output the one-clock cycle shifted signal VFO1FSR (see FIG. 2d). On the other hand, the frequency $1f$ reference signal (REF1F) preparing circuit 27 receives the VFO3F prepared by the servo circuit 22 and prepares and outputs REF1F, which has a duty ratio of 50 percent and a frequency of $1f$ (see FIG. 2e), and its inverted signal *REF1F. As such an REF1F preparing circuit, there may be mentioned the clock-pulse Dubler modules CDM102, CDM202, and CDM502 of JPC Co. Note that the "*" in *REF1F indicates inversion and is similarly used with other signals.

Reference numeral 24 is a fetching clock (FCLK) preparing circuit which is provided internally with D-type flip-flops (DFF) 241 and 242, a NAND circuit 243, AND circuits 244 to 246, an OR circuit 247, and an invertor 248 and issues a fetching clock signal FCLK for fetching write data. When DFF 241 receives WGT from the control circuit 21, it is latched at the rising edge of the first subsequent WCLK and issues a synchronization gate signal (SYCGT) (see timing Ts portions of FIGS. 2f, FIG. 2h, and FIG. 2i). DFF 242 is latched at the rising edge of SYCGT to REF1F issued by the REF1F preparing circuit 27, and DFF 242 issues the write clock window signal WCLWD from the terminal Q and issues the inverted signal *WCLWD from the terminal *Q (see timing Ts portions of FIG. 2i and FIG. 2j). Note that when the REF1F level is "0" at the rising edge of SYCGT, WCLWD does not rise and the WCLWD of the terminal Q remains at the "0" level and the *WCLWD of the terminal *Q remains at the "1" level. The NAND circuit 243 receives VFO1F from the system clock preparing circuit 23, REF1F from the REF1F preparing circuit 27, and *VFO3F from the invertor 248 and issues a fetching clock A (FCLKA) at the timing where the NAND conditions of these three signals stand (see FIG. 2k). This FCLKA is issued at the center of the first half cycle (1 level) of REF1F and has a frequency of $1f$. On the other hand, the AND circuit 244 receives the VFO1FSR from the system clock preparing circuit 23, the *REF1F from the REF1F preparing circuit 27, and the VFO3F from the servo circuit 22 and issues a fetching clock signal B (FCLKB) at the timing when the AND conditions of these three signals stand (see FIG. 2L). This FCLKB is issued at the center of the latter half cycle (0 level) of the REF1F and has the frequency $1f$. When the *WCLWD received from the DFF 242 is "1" (WCLWD is "0"), the AND circuit 245 supplies the FCLKA input from the NAND circuit 243 to the OR circuit 247. On the other hand, when the WCLWD received from the DFF 242 is "1", the AND circuit 246 supplies the FCLKB input from the AND circuit 244 to the OR circuit 247. Therefore, in the interval when the WCLWD is not issued from the OR circuit 247 (the interval where WGT is not input), the fetching clock signal FCLK is synchronized with the FCLKA. After timing Ts (illustrated in FIG. 2) when the WCLWD is issued (after WGT is input), the FCLK is synchronized with the FCLKB (see FIG. 2m). The FCLK issued in this way is supplied to the synchronization fetching circuit 25 and the 1-7 encoding circuit 26.

The synchronization fetching circuit 25 is comprised of two D-type flip-flops DFF 251 and DFF 252. The write clock signal WCLK issued from the control circuit 21 is input to the clock terminal CL of the first DFF 251 of the synchronization fetching circuit 25, WDAT is input to the terminal D, and WGT to the clear terminal CR. By this, WDAT is latched at the rising edges of the WCLK and is shaped to the write data WDT of $1f$ width (see FIG. 2f, FIG. 2g, and FIG. 2n). The FCLK output from the fetch preparing circuit 24 is input to the CL terminal of the second DFF 252, the WDT from the DFF 251 is input to the terminal D, and the WGT from the control circuit 21 is input to the terminal CR. By this, the WDT becomes "non-return to zero write data" (NRZWD) of a frequency $1f$ synchronized with the fetch clock signal FCLK (FCLK B).

The NRZWD, which is synchronized with the FCLK when prepared in this way, is input along with the FCLK to the (1-7) encoding circuit 26 and converted to a (1-7) RLL code, then written into the magnetic disk apparatus (not shown). Note that in FIG. 2, when the REF1F is at the 0 level at the rising edge of the SYCGT, the WCLWD does not rise but remains at the level of "0". In this case, the AND circuit 246 does not issue the FCLKB and the FCLKA output form the AND circuit 245 passes through the OR circuit 247 to become FCLK, so NDZWD is issued synchronously with the FCLK, i.e., FCLKA.

Next, referring to FIG. 3, an explanation will be given of the performance of the fetching of write data synchronized with FCLK in the case of REF1F with a 50 percent duty ratio.

From the phases and synchronization relationships of REF1F, WGT, SYCGT, WCLWD, WDT, FCLKA, FCLKB, and NRZWD of FIG. 2, when the rising edge of the WDT is at the "1" level of REF1F, the NRZWD is issued synchronously with the FCLKB. When the rising edge of the WDT is at the "0" level of the REF1F, the NRZWD is issued synchronously with the FCLKA, it is understood.

FIGS. 3a to 3e show the VFO3F, REF1F, FCLKA, FCLKB, and WDT of FIGS. 2a, 2e, 2k, 2l and 2n. VFO3F, REF1F, FCLKA, and FCLKB are in a synchronous relationship, and WDt is in an asynchronous relationship with the other four signals. Such relationships are illustrated in FIGS. 3f1 to 3f2, FIGS. 3g1 to 3g2, FIGS. 3h1 to 3h3, and FIGS. 3i1 to 3i3 which show synchronization being performed WDT with shown as a reference.

a. Case A: FIGS. 3f1 to 3f2

At the rising edge of the WDT, when the REF1F is the "1" level, the WDT is fetched synchronously with the FCLKB.

b. Case B: FIGS. 3g1 to 3g3

At the rising edge of the WDT, when the REF1F is the "0" level, the WDT is fetched synchronously with the FCLKA.

c. Case C: FIGS. 3h1 to 3h3

When the rising edge of the WDT and the trailing edge of the REF1F coincide, there are cases where the REF1F will be "1" at the rising edge of the WDT and will be "0". In the former case, the WDT is fetched synchronously with the FCLKB and in the latter case synchronously with the FCLKA. If either of FCLKB or FCLKA is first determined, as clear from the synchronization relationship of WGT, SYCGT, WCLWD, FCLKA, FCLKB, FCLK, and WDT of FIGS. 2h to 2n, there is subsequently synchronization with the same signal, so WDT is fetched synchronously with one of FCLKA or FCLKB.

d. Case D: FIGS. 3i1 to 3i3

When the rising edge of the WDT and the rising edge of the REF1F coincide, in this case too, depending on whether the REF1F is at the "1" or "0" level, the FCLKB or FCLKA will be synchronized with. If either of FCLKB or FCLKA is first determined, there is subsequently synchronization with the same signal, so WDT is fetched synchronously with one of FCLKA or FCLKB.

As explained above, in the case of an REF1F with a 50 percent duty ratio, no matter what phase relationship the WDT and REF1F are in, the WDT is fetched syncyronously with FCLK. However, when the duty ratio of REF1F is not 50 percent, there are cases where the WDT is not fetched synchronized with FCLK. Below, an explanation will be made of the fetching operation in this case with reference to FIGS. 4a to 4i3.

FIGS 4a to 4e show again the VFO3F, REF1F, FCLKA, FCLKB, and WDT of FIG. 2 and FIG. 3. However, the duty ratio of the REF1F is off from 50 percent.

a'. Case A': FIGS. 4f1 and 4f2

At the rising edge of the WDT, when the REF1F is the "1" level, the WDt is fetched synchronously with the FCLKB.

b'. Case B': FIGS. 4g1 to 4g2

At the rising edge of the WDT, when the REF1F is the "0" level, the WDT is fetched synchronously with the FCLKA.

c'. Case C': FIGS. 4h1 to 4h3

When the rising edge of the WDT and the trailing edge of the REF1F coincide, there are causes where the REF1F will be "1" at the rising edge of the WDT and will be "0". In the case of "0", the WDT is fetched synchronously with the FCLKA, so no problem arises. However, in the case of "1", WDT is fetched synchronously with the FCLKB. Since the rising edges of WDt and FCLKB coincide, the fetched data becomes "1" or "0" and is not constant. Therefore, the correct WDT cannot be fetched.

d'. Case D': FIGS. 4i1 to 4i3

When the rising edge of the WDT and the rising edge of the REF1F coincide, depending on whether the REF1F is at the "1" or "0" level, either FCLKB or FCLKA will be synchronized with. If either of FCLKB or FCLKA is first determined, there is subsequently synchronization with the same signal, so one of FCLKA or FCLKB is synchronized with the WDT fetched. In this way, if the duty ratio of the REF1F is not 50 percent, when the rising edge of the WDT and the trailing edge of the REF1F coincide, if the FCLKB is synchronized with, the WDT will not be fetched.

Moreover, if the duty ratio of the reference clock REF1F of the fundamental frequency 1$f$ is not accurately 50 percent, the conventional (1-7) RLL code write data fetching circuit will suffer from the disadvantages of incorrect fetching of write data in some cases.

In the case of digital signals, a $\frac{1}{2}^n$ frequency division can be easily and accurately performed, but a frequency division of an odd denomitor is difficult; therefore, it is difficult to prepare a clock REF1F of frequency 1$f$ and a duty ratio of 50 percent from the triple frequency clock VFO3F. The obtained frequency division circuit is also not satisfactory in precision and stability, so it is difficult to realize write data fetching circuit.

Below, an explanation will be made of embodiments of the present invention.

A. FIRST EMBODIMENT

BASIC CONSTRUCTION

An explanation will now be made of the basic structure of a first embodiment using the present invention with reference to FIG. 5.

Figure 5:
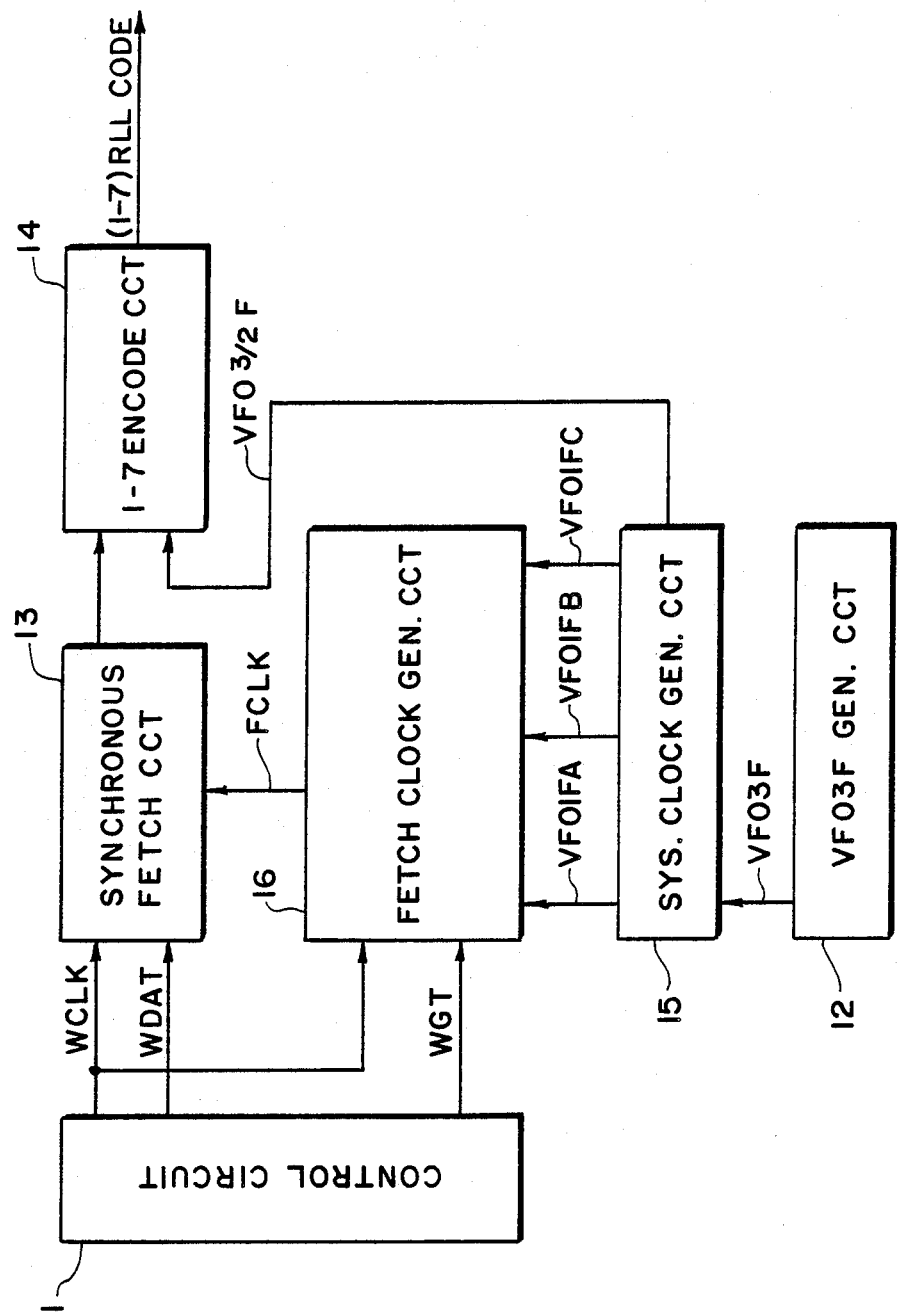
FIG. 5 is a block diagram of the basic construction of a first embodiment of the present invention.

In FIG. 5, reference numeral 11 is a control circuit which is connected to a host controller and which transmits a write clock signal WCLK of a fundamental frequency 1$f$, a write data WDAT issued synchronously with the WCLK, and a write gate signal WGT indicating the start of the write operation. Reference numeral 12 is a VFO3F generating circuit which generates, asynchronously with the WCLK, a clock signal VFO3F with a frequency three times the fundamental frequency 1$f$. Reference numeral 13 is a synchronization fetching circuit which receives WLCK and WDAT from the control circuit 11, shapes the WDAT to the write data WDT synchronized with the WCLK, and fetches the write data WDT synchronized with the FCLK received from the FCLK preparing circuit 16. Reference number 14 is a (1-7) encoding circuit which converts the write data input from the synchronization and fetching circuit 13 to a (1-7) RLL code. Reference numeral 15 is a system clock preparing circuit, which receives the VFO3F from the VFO3F generating circuit 12 and prepares the three clock signals VFO1FA, VFO1FB, and VFO1FC of the frequency 1$f$ synchronized with the VFO3F. Reference numeral 16 is a fetching clock preparing circuit which receives the WCLK and WGT from the control circuit 11, receives the VFO1FA, VFO1FB, and VFO1FC from the system clock preparing circuit 15, and, in accordance with the state of the VFO1FA, VFO1FB, and VFO1FC at the rising edge of the WCLK directly after the issuance of the WGT, prepares the fetching clock signal FCLK synchronized with one of the same.

The write data fetching operation of FIG. 5 will be explained with reference to the signal waveform diagrams of FIG. 6 and FIG. 7.

The control circuit 11 issues a WCLK of the fundamental frequency 1$f$ (see FIG. 6$f$), the WDAT issued synchronized with the WCLK (see FIG. 6$g$), and the WGT instructing the start of the write operation, which is issued asynchronously with these two signals (see FIG. 6$i$). On the other hand, the VFO3F generating circuit 12 issues, asynchronously with WCLK, the clock signal VFO3F with a frequency 3$f$ three times the fundamental frequency 1$f$ (see FIG. 2$a$). The system clock preparing circuit 15 prepares the three clocks VFO1FA, VFO1FB, and VFO1FC of the frequency 1*f* synchronized with the VFO3F (see FIGS. 6*c*, 6*d*, and 6*e*). Note that in the process of preparation of these three signals, the signal VFO3/2*f* of the frequency 3/2*f* is produced (see FIG. 6*b*). The signal VFO3/2*f* is supplied as a (1-7) RLL-code encoding clock signal to the (1-7) encoding circuit.

When the fetching clock preparing circuit 16 receives the WCLK and WGT from the control circuit 11 and receives the VFO1FA, VFO1FB, and VFO1FC from the system clock preparing circuit 15, in accordance with the state of the VFO1FA, VFO1FB, and VFO1FC at the rising edge of the WCLK directly after the issuance of the WGT (point of rise of WCLK in case of FIG. 2), it fetches one of the same and selects it as the clock signal FCLK. Table 1 shows an example of the correspondence between the state of the VFO1FA, VFO1FB, and VFO1FC and the signals selected as the FCLK. Details are explained in the explanation on the detailed circuit construction.

TABLE 1

| VFO1FA | VFO1FB | VFO1FC | Clock to which FCLK is synchronized |
|---|---|---|---|
| 0 | 0 | 0 | VFO1F A |
| 0 | 0 | 1 | VFO1F B |
| 0 | 1 | 0 | VFO1F B |
| 0 | 1 | 1 | VFO1F B |
| 1 | 0 | 0 | VFO1F C |
| 1 | 0 | 1 | VFO1F C |
| 1 | 1 | 0 | VFO1F A |
| 1 | 1 | 1 | VFO1F C |

For example, in the case of FIG. 6, the state of VFO1FA, VFO1FB, and VFO1FC at the rising edge (point of rise Ts) of the WCLK directly after the rise of the WGT is "101", so after the issuance of the WGT, the FCLK synchronizes with the VFO1FC (see FIGS. 6*i*, 6*f*, 6*c*, 6*d*, 6*e*, and 6*k*).

When the synchronization and fetching circuit 13 receives the WCLK and WDAT from the control circuit 11 and receives the FCLK from the fetching clock selection circuit 16, it synchronizes and shapes the WDAT into the write data WDT which is synchronized with the WCLK (see FIG. 6*h*), performs fetching of NRZ type write data (NRZWDT) synchronized with FCLK by the WDT, and inputs the same into the (1-7) encoding circuit 14. The (1-7) encoding circuit 14 performs (1-7) RLL encoding by the write data (NRZWDT) and VFO3/2F. Note that an explanation of the SYCGT of FIG. 6*i* will be given in the explanation of the detailed circuit construction.

Next, an explanation will be made of a write data fetching operation in accordance with the relationships of the three fetching clocks VFO1FA, VFO1FB, and VFO1FC and WDT.

Looking at the phases and the synchronization relationships of the signals of VFO1FA, VFO1FB, VFO1FC, WCLK, WDAT, WDT, WGT, and FCLK of FIG. 6, it will be understood that the clock to which FCLK is synchronized is selected from the state of the VFO1FA, VFO1FB, and VFO1FC at the rising edge of the WDT. Below, note is taken of this point and an explanation made of the write data fetching operation at the phase relationships of the three signals and WDT with reference to FIG. 7 and Table 1.

The signals of FIGS. 7*a* to 7*e* show the VFO3F, VFO2/2F, VFO1FA, VFO1FB, and VFO1FC of FIGS. 6*a* to 6*e*. FIGS. 7*f*1 to 7*k*4 show the relationship of the rising edge of the WDT and the states of the three clock signals and the one of the three clcok signals which becomes FCLK in each case.

a. Case A: FIGS. 7*f*1 to 7*f*2

If the rising edge of the WDT is made in reference to the VFO1FA, when it is in the first (1/3)f of the same, the state of the VFO1FA, VFO1FB, and VFO1FC is "101", so the FCLK is synchronized with the VFO1FC as shown in Table 1.

b. Case B: FIGS. 7*g*1 to 7*g*2

When the rising edge of the WDT is in the center (1/3)f of the VFO1FA, the state of the VFO1FA, VFO1FB, and VFO1FC is "110", so the FCLK is synchronized to the VFO1FA as shown in Table 1.

c. Case C: FIGS. 7*h*1 to 7*h*2

When the rising edge of the WDT is in the latter (1/3)f of the VFO1FA, the state of the VFO1FA, VFO1FB, and VFO1FC is "011", so the FCLK is synchronized to the VFO1FB as shown in Table 1.

d. Case D: FIGS. 7*i*1 to 7*i*3

When the rising edge of the WDT coincides with the rising edge of the VFO1FA, the state of the VFO1FA, VFO1FB, and VFO1FC becomes one of the following four states:
(i) 011
(ii) 001
(iii) 101
(iv) 111

In the case of (i) and (ii), the VFO1FB becomes FCLK from Table 1. In the case of (iii) and (iv), the VFO1FC becomes FCLK from Table 1. When synchronizing to either of the cases (i) and (ii) or (iii) and (iv) the same signal is synchronized to; therefore, the FCLK is synchronized to either of VFO1FB and VFO1FC.

e. Case E: FIGS. 7*j*1 to 7*j*3

When the rising edge of the WDT coincides with the rising edge of the VFO1FB, the state of the VFO1FA, VFO1FB, and VFO1FC becomes one of the following four states:
(i) 101
(ii) 100
(iii) 111
(iv) 110

In the case of (i) to (iii), the VFO1FC becomes FCLK as shown in Table 1. In the case of (iv), the VFO1FA becomes FCLK as shown in Table 1. That is, the FCLK is synchronized to either of VFO1FC or VFO1FA.

f. Case F: FIGS. 7*k*1 to 7*k*4

When the rising edge of the WDT coincides with the rising edge of the VFO1FC, the state of the VFO1FA, VFO1FB, and VFO1FC becomes one of the following four states:
(i) 010
(ii) 110
(iii) 011
(iv) 111

In the case of (i), the VFO1FA becomes FCLK as shown in Table 1. In the case of (ii) and (iii), the VFO1FB becomes FCLK as shown in Table 1. In the case of (iv), the FCLK is synchronized with VFO1FC from Table 1. That is, the FCLK is synchronized with one of the VFO1FA, VFO1FB, or VFO1FC.

In none of the above cases A to F other than case F(iv) does the rising edge of the FCLK coincide with the rising edge of the WDT, so it is possible to perform correct fetching of write data by the selected FCLK. In the case F(iv), the rising edge of the VFO1FC selected for the FCLK and the rising edge of the WDT coincide, so the fetching of the correct write data is not guaranteed. However, this case only rarely occurs and in practice does not present a particular problem.

Thus, it is possible to realize a simple, stable, and highly reliable write data fetching circuit using the three clock signals VFO1FA, VFO1FB, and VFO1FC, which can be easily and stably prepared from the VFO3F, without use of an REF1F with a 50 percent duty ratio. Note that the three clock signals VFO1FA, VFO1FB, and VFO1FC shown in FIGS. 6C to 6e show one embodiment of the three fetching clock signals used in the present invention, but the present invention is not limited to the same. The same if true for Table 1.

DETAILED CIRCUIT CONSTRUCTION

Figures 8, 8A:
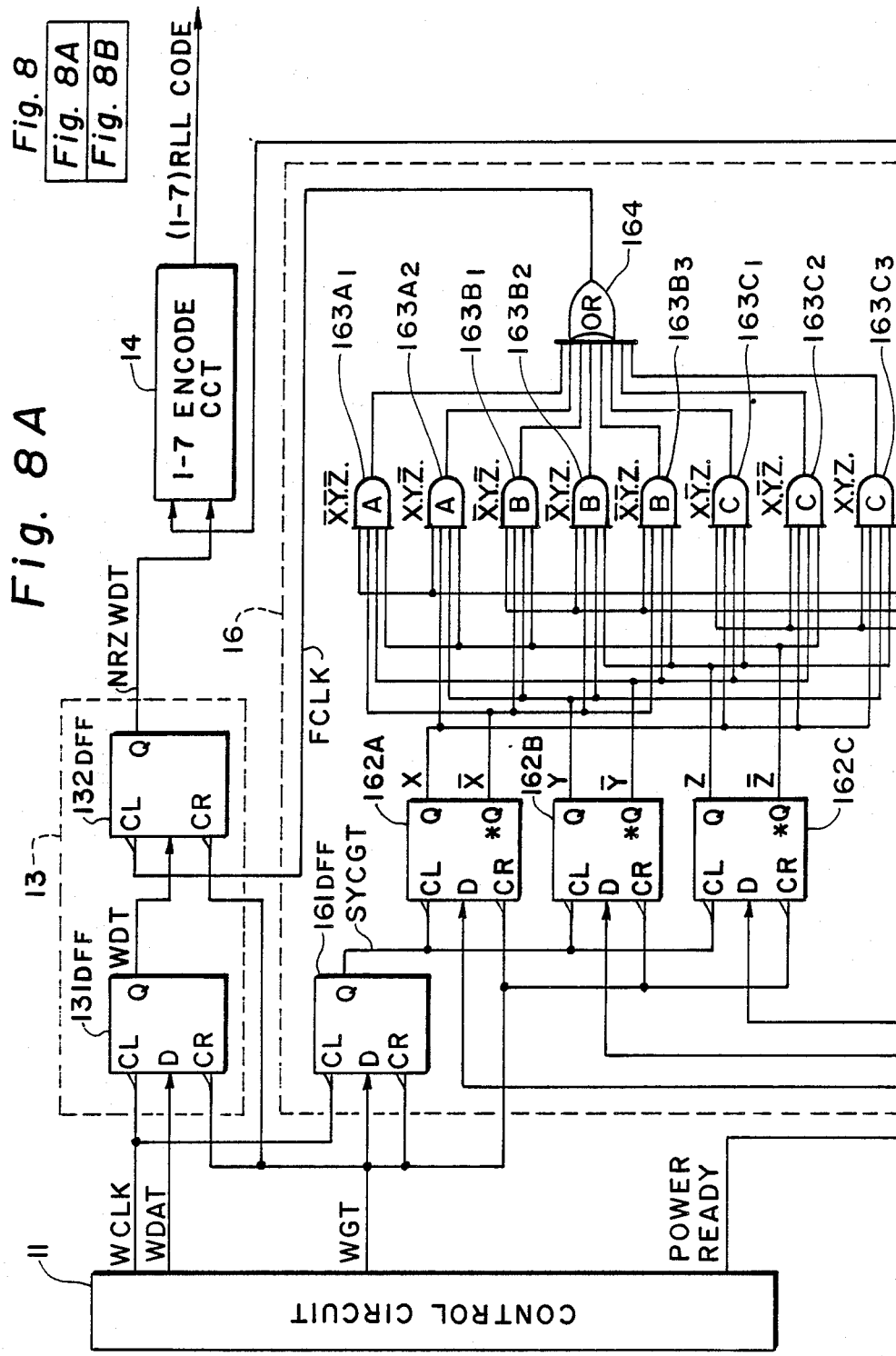
FIGS. 8A and 8B are circuit diagrams of an embodiment of the present invention.
Figure 8B:
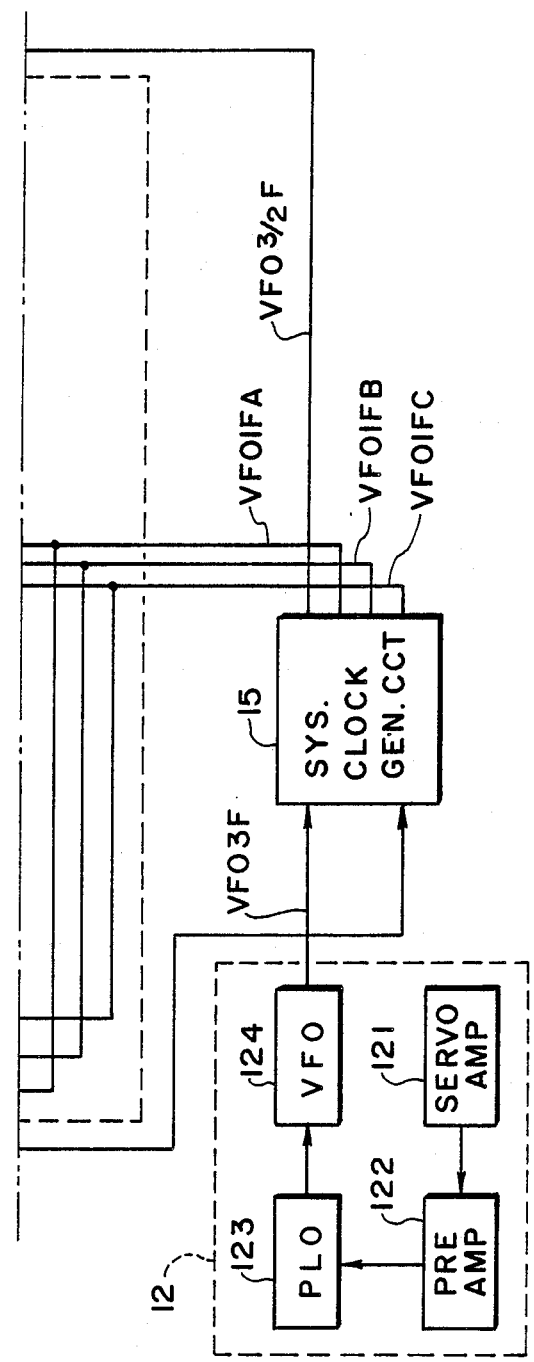
Figure 9:
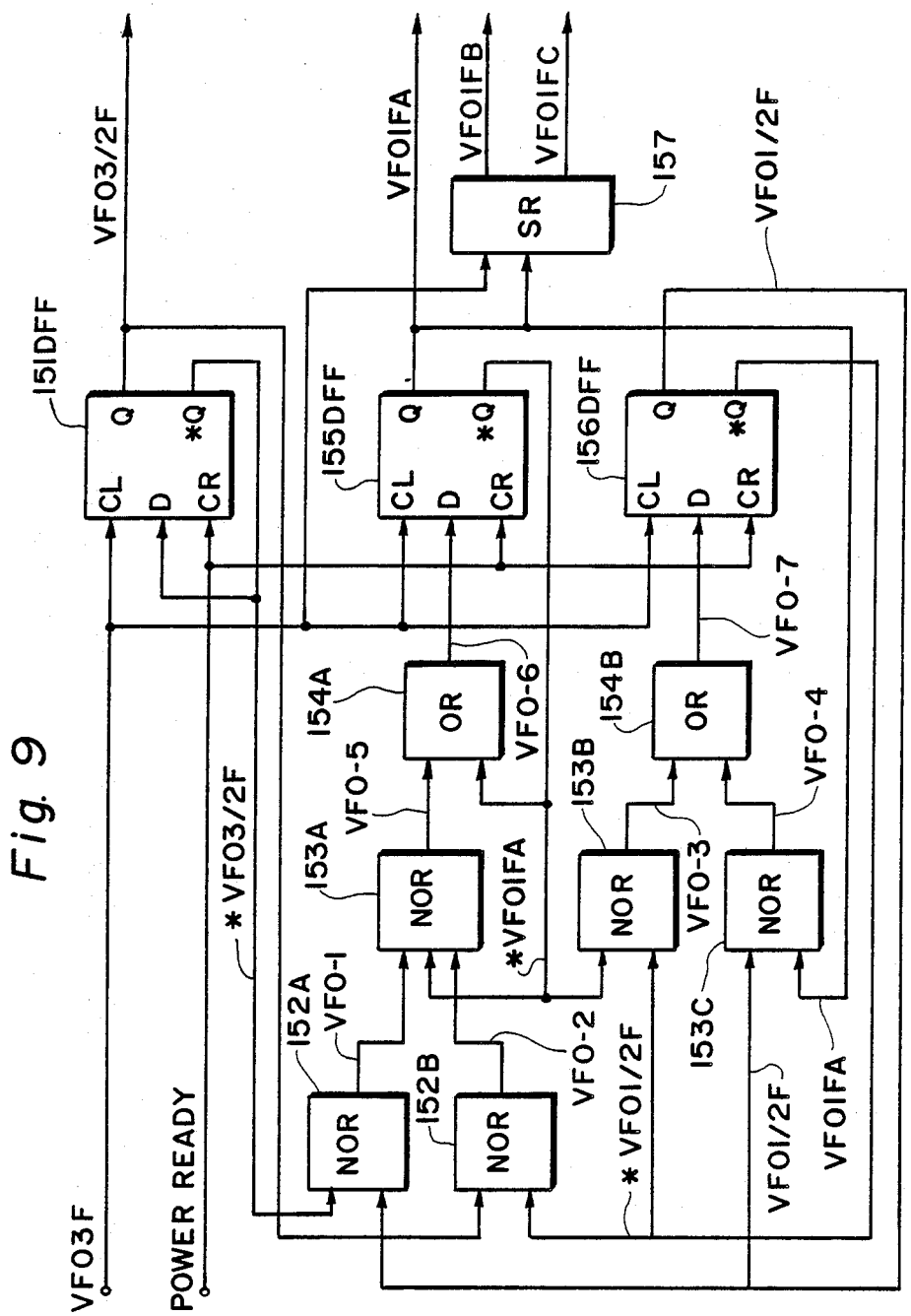
FIG. 9 is a block diagram of the system clock preparing circuit of FIG. 8.

An explanation will now be made, with reference to FIG. 6 to FIG. 10, of a more detailed embodiment of the above-mentioned first aspect of the invention. FIG. 8 is an explanatory view of the construction of an embodiment of the present invention, FIG. 9 is an explanatory view of a system clock preparing circuit of the same embodiment, and FIG. 10 is a signal waveform diagram of the system clock preparing circuit.

OVERALL CIRCUIT CONSTRUCTION

In FIG. 8, the control circuit 11, the VFO3F generating circuit 12, the synchronization fetching circuit 13, the (1–7) encoding circuit 14, the system clock preparing circuit 15, and the fetching clock preparing circuit 16 are the same as explained in FIG. 5.

In the VFO3F generating circuit 12, reference numeral 121 is a servo amplification circuit (SERVO AMP) which detects a clock signal from the magnetic disk (not shown). Reference numeral 122 is a preamplification circuit (PRE AMP) which amplifies the clock signals of the servo amplification circuit. Reference numeral 123 is a phase-locked oscillation circuit (PLO), which issues a signal of a frequency $3f$. Reference numeral 124 is a variable frequency oscillation circuit (VFO) which receives the output of the PLO 123 and generates a clock VFO3F.

In the synchronization and fetching circuit 13, reference numerals 131 and 132 are D-type flip-flops (DFF), CL is a clock terminal, D is a data input terminal, CR is a clear terminal, and Q is a data input terminal, CR is a clear terminal, and Q is an output terminal. To the CL, D, and CR terminals of the DFF 131 are input, respectively, the WCLK, WDAT, and WGT from the control circuit 11, whereby the write data WDT is output from the Q terminal. To the CL terminal of the DFF 132 is input the FCLK from the fetching clock preparing circuit 16. To the D terminal is input the WDT from the DFF 133. To the CR terminal is input the WGT from the control circuit 11. The NRZWDT is output from the Q terminal.

In the fetching clock preparing circuit 16, reference numeral 161 is a D-type flip-flop (DFF) which receives as inputs at the CL terminal and D terminal the WCLK and WGT, respectively, from the control circuit 11 and receives as an input at the CR terminal the WGT (cleared by the inverted signal of the WGT). Output from the Q terminal of DFF 161 is the synchronization gate signal SYCGT. Reference numerals 132A, 132B, 132B, and 132C are DFFs, to the CL terminals of which are input the SYCGT from the DFF 161 and to the CR terminals of which are input the WGT from the control circuit 11.

To the D terminal of the DFF 162A is input the clock VFO1FA from the system clock preparing circuit 15. At the rising edge of the SYCGT, this is latched and the latch signals X and *X are output from the Q and *Q terminals (* being a symbol of inversion, the same for all following symbols). To the D terminal of the DFF 162B is input the clock signal VFO1FB. This is latched at the rising edge of the SYCGT, and the latch signals Y and *Y are output form the Q and the *Q terminals. To the D terminal of the DFF 162C is input the clock signal VFO1FC. This is latched at the rising edge of the SYCGT, and the latch signals Z and *Z are output from the Q and the *Q terminals.

Reference numerals $163A_1$, $163A_2$, $163B_1$, $163B_2$, $162B_3$, $163C_1$, $163C_2$, and $163C_3$ are AND circuits which perform the logical operations of the aforementioned Table 1. That is, the AND circuit $163A_1$ receives the VFO1FA from the system clock preparing circuit 15, receives the *Y, *Y, and *Z latch signals from the DFFs 162A to 162C, and, when the AND conditions of the same are high, outputs and fetching clock FCLKA synchronized with the FVO1FA. Similarly, the AND circuit $163A_2$ outputs the FCLKA synchronized with the VFO1FA when the AND conditions of the VFO1FA, X, Y, and *Z are high.

The AND circuit $163B_1$ outputs the FCLKB synchronized with the VFO1FB when the AND conditions of the VFO1FB, *X, Y, and *Z are high. The AND circuit $163B_2$ outputs the fetching clock signal FCLKB synchronized with the VFO1FB and the AND conditions of the VFO1FB, *X, Y, and Z are high. Similarly, the AND circuit $163B_3$ outputs the fetching clock signal FCLKB synchronized with the VFO1FB when the AND conditions of the VFO1FB, *X, *Y, and Z are high.

The AND circuit $163C_1$ outputs the fetching clock signal FCLKC synchronized with the VFO1FC when the AND conditions of the VFO1FC, X, *Y and Z are high. Similarly, the AND circuit $163C_2$ outputs the fetching clock FCLKC synchronized with the VFO1FC when the AND conditions of the VFO1FC, X, *Y, and *Z are high. The AND circuit $163C_3$ ouputs the FCLKC synchronized with the VFO1FC when the AND conditions of the VFO1FC, X, Y, and Z are high.

Reference numeral 164 is an OR circuit which outputs the fetching clock FCLK using the FCLKA, FCLKB, and FCLKC as inputs from the AND circuits. Note that FCLKA, FCLKB, and FCLKC, as clear from the contents of the logical operations, are never simultaneously issued.

SYSTEM CLOCK PREPARING CIRCUIT

FIG. 9 shows an example of the system clock preparing ciruit 15, and FIG. 10 is a signal waveform diagram of the same.

DFF 151 functions as a ½ frequency divider, to the C1 terminal of which is input the VFO3F from the VFO3F generating circuit 12 (FIG. 10a). The *Q terminal and D terminal are connected and the CR terminal receives as an input the clear power ready signal from the control circuit 11. By this construction, the VFO3/2F of a frequency of (3/2)f is output to the Q terminal (FIG. 10b).

To one of the input terminals of the NOR circuit 152A is input the *VFO3/2F from the DFF 151. To the other input terminal is input the VFO1/2F (FIG. 10d) from the DFF 156, explained later. By this, the VFO-1 is output as the NOR output from the NOR circuit 152A (FIG. 10f). To one of the input terminals of the NOR circuit 152B is input the VFO3/2F from the DFF 151. To the other input terminal is input the *VFO1/2F (FIG. 10d) from the DFF 156, explained later. By this, the VFO-2 is output as the NOR output from the NOR circuit 152B (FIG. 10g).

To the first input terminal of the NOR circuit 153A is input the VFO-1 from the NOR circuit 152A. To the second input terminal is input the *VFO1FA (inverted signal of VFO1FA of FIG. c) from the DFF 155, explained later. To the third input terminal is input the VFO-2 from the NOR circuit 152B. By this, the VFO-5 is output as the NOR output of the three signals from the NOR circuit 153A (FIG. 10e). To one of the input terminals of the NOR circuit 153B is input the *VFO1FA from the DFF 155. To the other input terminal is input the *VFO1/2F (inverted signal of VFO1/2F of FIG. 10d) from the DFF 156. By this, the VFO-3 is output as the NOR output from the NOR circuit 153B (FIG. 10i). To one of the input terminals of the NOR circuit 153C is input the VFO1/2F from the DFF 156 (FIG. 10d). To the other input terminal is input the VFO1FA (FIG. 10c) from the DFF 155. By this, the VFO-4 is output as the NOR output from the NOR circuit 153C (FIG. 10h).

The OR circuit 154A outputs the VFO-6 as the OR output of the VFO-5 from the NOR circuit 153A and the *VFO1FA from the DFF 155 (FIG. 10j). The OR circuit 154B outputs the VFO-7 as the OR output of the VFO-3 from the NOR circuit 153B and the VFO-4 from the NOR circuit 153C (FIG. 10k).

The CL terminal of the DFF 155 receives as input the VFO3F (FIG. 10a). The D terminal receives as input the VFO-6 from the OR circuit 154A (FIG. 10j). The CR terminal receives as input the clear power ready signal. By this, the VFO1FA is output from the Q terminal of the DFF 155 (FIG. 10c). The *Q terminal outputs the *VFO1FA. On the other hand, the CL terminal of the DFF 156 receives as input the VFO3F (FIG. 10a), while the D terminal receives as input the VFO-7 from the OR circuit 154B. The OR terminal receives as input the power ready signal. By this, the Q terminal of the DFF 156 outputs the VFO1/2F (FIG. 10d), and the *Q terminal outputs the *VFO1/2F.

Reference numeral 157 is a shift register, which successively shifts the VFO1FA input from the DFF 155 by the VFO3F and outputs the VFO1FB and VFO1FC (FIGS. 10l, 10m, 10n). The VFO1FA of FIG. 10l shows again the VFO1FA of FIG. 10c. Thus, the VFO3/2F, VFO1FA, VFO1FB, and VFO1FC are output from the system clock preparing circuit 15.

EXPLANATION OF OPERATION

The operation of the embodiment of FIG. 8 will now be explained with reference to the signal waveform diagram of FIG. 6.

The control circuit 11 transmits the WCLK, the WDAT generated in synchronization with the WCLK, and the WGT generated asynchronously with these two signals (FIGS. 6f, 6g, 6i). On the other hand, the VFO3F generating circuit 12 generates the VFO3F asynchronously with the WCLK and inputs it to the system clock preparing circuit 15 (FIG. 6a). The system clock preparing circuit 15, when receiving the VFO3F, as explained in the afore-mentioned FIG. 5 and FIG. 6, outputs the VFO3/2F VFO1FA, VFO1FB, and VFO1FC (FIGS. 6b, 6c, 6d and 6e). The DFF 161 of the fetching clock prpearing circuit 16, when receiving the WCLK and WGT from the control circuit 11, issues the SYCGT at the rising edge (Ts) of the WCLK directly after the rising edge of the WGT (FIGS. 6f, 6i, 6j).

The DFF 162A receives the VFO1FA from the system clock preparing circuit 15 at the D terminal, receives the SYCGT from the DFF 161 at the CL terminal, latches the state of the VFO1FA at the rising edge (Ts) of the SYCGT, outputs the latching signal X to the Q terminal, and outputs the latching signal *X to the *Q terminal. In the case of FIG. 6, X=1 and *X=0. The DFF 162B latches the state of the VFO1FB received from the system clock preparing circuit 15 at the rising edge (Ts) of the SYCGT received from the DFF 161, outputs the latching signal Y to the Q terminal, and outputs the latching signal *Y to the *Q terminal. In the case of FIG. 6, Y=0 and *Y=1. The DFF 162C, in the same way, latches the state of the VFO1FC received from the system clock preparing circuit 15 at the rising edge of the SYCGT received from the DFF 161, outputs the latching signal Z to the Q terminal, and outputs the latching signal *Z to the *Q terminal. In the case of the FIG. 6, z=1 and *Z=0.

The AND circuit $163A_1$ receives the VFO1FA from the system clock preparing circuit 15, receives the latching signals *X, *Y, and *Z from the DFFs 162A to 162C, and, when the AND conditions of the same are high, outputs the FCLKA synchronized with the VFO1FA. Similarly, the AND circuit $163A_2$, when the AND conditions of the VFO1FA, X, Y, and *Z stand, outputs the FCLKA synchronized with the VFO1FA. In the case of FIG. 6, X=1, *X=0, Y=0, *Y=1, Z=1, *Z=0, so the FCLKA is not output.

Similarly, the AND circuit $163B_1$, when the AND conditions of the VFO1FB, *X, Y, and *Z are high, outputs the FCLKB synchronized with the VFO1FB. The AND circuit $163B_2$, when the AND conditions of the signal VFO1FB, *X, Y, and Z are high, and the AND circuit $163B_3$, when the AND conditions of the VFO1FB, *X, *Y, and Z are high, respectively output the FCLKB synchronized with the VFO1FB. In the case of FIG. 6, the FCLKB is not output.

Likewise, the AND circuit $163C_1$, when the AND conditions of the signal VFO1FC, X, *Y, and Z are high, the AND circuit $163C_2$, when the AND conditions of the VFO1FC, X, *Y, and *Z are high, and the AND circuit $163C_3$, when the AND conditions of the VFO1FC, X, Y, and Z are high, respectively output the FCLKC synchronized with the VFO1FC. In the case of FIG. 6, X=1, Y=0, and Z=1, so the AND conditions of the AND circuit $163C_1$ are high and the FCLKC is output.

The OR circuit 164 outputs the FCLKC input from the AND circuit $163C_1$ as the FCLK and supplies the same to the CL terminal of the DFF 132.

Recall, the afore-mentioned Table 1 shows to which of the three clock signals the FCLK is synchronized with in accordance with the various states of the VFO1FA, VFO1FB, and VFO1FC latched at the rising edge of the SYCGT.

On the other hand, the DFF 131 of the synchronization and fetching circuit 13, when receiving the WCLK, WDAT, and WGT from the control circuit 11, issues the WGT, then synchronizes and shapes the WDAT by the WCLK and output the resultant DAT to the Q terminal (FIGS. 6f, 6g, 6h, and 6i). The DFF 132 synchronizes and shapes the DAT received from the DFF 131 by the FCLK received from the fetching clock preparing circuit 16 and outputs the NRZ type write data NRZWDT (FIGS. 6h, 6k, and 6l). The (1–7) encoding circuit 14 receives the write data NRZWDT from the DFF 132, receives the VFO3/2F from the system clock preparing circuit 15, and prepares the (1–7) RLL code.

By performing the fetching operation of the write data from the WDT by the FCLK prepared in this way, it is possible to perform a correct write data fetching operation, as explained with reference to FIG. 7 previously.

Above, an explanation was made of an embodimewnt of the present invention, but the present invention is not limited to this embodiment. For example, for the three clock signals, use may be made of three clock signals different from the waveforms shown in FIG. 6.

EFFECTS OF THE FIRST EMBODIMENT

As explained above, according to the first embodiment of the present invention, the following effects are obtained:

(1) The write data fetching clock signal is prepared by three stable, precise phase signals, so it is possible to fetch write data with less error than by the past method.

(2) Instead of a 50 percent duty ratio REF1F, use is made of three easy, stable, and precise clock signals, so the system clock preparing circuit and the overall write data fetching circuit are simplified and the reliability is improved.

B. SECOND EMBODIMENT

The write data fetching circuit of the first embodiment does not require a clock VFO1F (REF1F) of a 50 percent duty ratio. As a result, it is possible to fetch write data of (1–7) RLL encoding with a simple circuit construction and no errors. However, as mentioned above, in the case F when the state of the three clocks is "111", the rising edge of the VFO1FC which becomes the FCLK and the rising edge of the WDT coincide; therefore, the write data becomes "1" or "0" and is unstable, making it is impossible to guarantee the fetching of the correct write data. This case occurs only very rarely, but to completely eliminate errors during fetching of write data, it is desirable to fetch the correct data even in such very rare cases.

The second embodiment has as its object the providing of a highly reliable (1–7) RLL coded write data fetching circuit which prepares the write data fetching clock FCLK with a simple circuit construction without using a clock REF1F of a 50 percent duty ratio and a fundamental frequency 1f and which completely eliminates the errors occurring when fetching write data.

BASIC CONSTRUCTION OF SECOND EMBODIMENT

Figure 11:
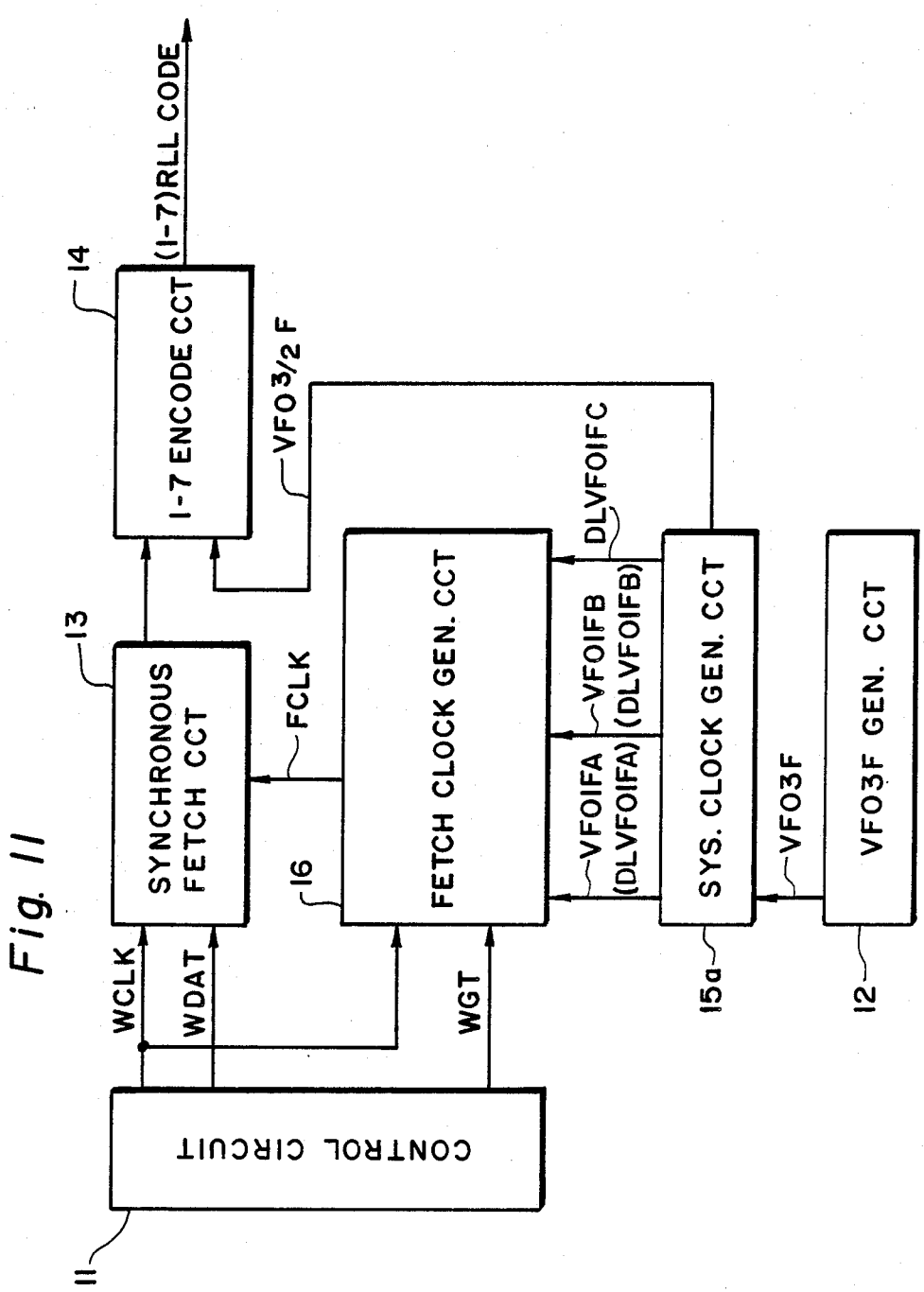
FIG. 11 is a block diagram of the basic construction of a second embodiment of the present invention.

The basic structure of the second embodiment, as shown in FIG. 11, is the same as that in FIG. 5, which showed the basic structure of the first embodiment. The difference is that one of the three signals sent from the system clock preparing circuit 15a to the fetching clock preparing circuit 16 is DLVFO1FC. Below, the embodiment will be explained base on the points of difference with the first embodiment.

Reference numeral 15a is a system clock preparing circuit which receives the VFO3F from the VFO3F generating circuit 12 and which prepares three clock signals of the frequency 1f synchronized with the VFO3F, one of the clock signals among the same being delayed within the range of 1 clock cycle (1/6)f from the correct phase (VFO1FA, VFO1FB, DLVFO1FC: VFO1FC).

Reference numeral 16 is a fetching clock preparing circuit which receives the WCLK and WGT from the control circuit 11, receives the three clock signals (VFO1FA, VFO1FB, and DLVFO1FC) from the system clock preparing circuit 15, and prepares a fetching clock signal FCLK synchronized with one of the same in accordance with the state of the three clock signals (FVO1FA, VFO1FB, and DLVFO1FC) at the rising edge of the WCLK directly after the generation of the WGT.

Note that the invention is not limited to only VFO1FC being given a delay of the three clock signals. The VFO1FA or the VFO1FB may also be delayed.

The operation of the write data fetching circuit of FIG. 11 will be explained with reference to the signal waveform diagrams of FIG. 12 and FIG. 13.

The control circuit 11 transmits the WCLK of the fundamental frequency 1f (FIG. 12g), the WDAT generated synchronously with the WCLK (FIG. 12h), and the WGT which indicates the start of the write operation and is generated asynchronously with these two signals (FIG. 12j). On the other hand, the VFO3F generating circuit 12 generates the VFO3F of a frequency three times the fundamental frequency 1f asynchronously with the WCLK (FIG. 12a).

The system clock preparing circuit 15a prepares the three phase clock signals of the frequency 1f synchronized with the VFO3F, one of the phase clocks being delayed in the range of one clock ((1/6)f) from the correct phase. In the case of FIG. 12, there is shown the case where the VFO1FC among the correct three phase clock signals VFO1FA, VFO1FB, and VFO1FC is delayed by one clock's worth (shown as DLVFO1FC) (FIGS. 12c, 12d, 12e, and 12f).

Note that in the process of preparation of the three clock signals, the VFO3/2F of a 3/2 frequency is produced (FIG. 12b), the VFO3/2 is supplied to the (1–7) encoding circuit as the synchronization clock for the (1–7) RLL-code encoding.

The fetching clock preparing circuit 16, when receiving the WCLK and WGT from the control circuit 11 and receiving the VFO1FA, VFO1FB, and the DLVFO1FC) from the system clock preparing circuit 15a, selects as the fetching clock signal FCLK one of the same (in FIG. 12, in accordance with the state of the VFO1FA, VFO1FB, and DLVFO1FC) at the rising edge (Ts) of the WCLK directly after the generation of the WGT (FIGS. 6f, 6i, 6j). Table 2 shows an example of the correspondence relationship between the state of the VFO1FA, VFO1FB, and DLVFO1FC and the FCLK synchronized clock signals. Note that the asterisk mark indicates cases which actually never occur. Further, the meansings of X, Y, and Z are as mentioned later.

TABLE 2

| VFO1FA (X) | VFO1FB (Y) | DLVFO1FC (Z) | FCLK sync'ed clock |
|---|---|---|---|
| 0 | 0 | 0 | 0 | VFO1FA |
| 1 | 0 | 0 | 1 | VFO1FB |
| 2 | 0 | 1 | 0 | VFO1FB |
| 3 | 0 | 1 | 1 | VFO1FB |
| *4 | 1 | 0 | 0 | DLVFO1FC |
| 5 | 1 | 0 | 1 | DLVFO1FC |
| 6 | 1 | 1 | 0 | VFO1FA |
| 7 | 1 | 1 | 1 | DLVFO1FC |

For example, in the case of FIG. 12, the state of the VFO1FA, VFO1FB, and DLVFO1FC at the point of change (point of rise Ts) of the WCLK directly after the rising edge of the WGT is "101", so after the generation of the WGT, the FCLK synchronizes with the DLVFO1FC (FIGS. 12c, 12d, 12f, 12g, 12j, and 12l).

The synchronization and fetching circuit 13, when it receives the WCLK and the WDAT from the control circuit 11 and receives the FCLK from the fetching clock preparing circuit 16, synchronizes and shapes the write data WDT by synchronizing the WDAT to the WCLK (FIG. 12m). By this WDT, the fetching of the NRZ type write data (NRZWDT) synchronized with the FCLK is performed and the result input to the (1–7) encoding circuit. The (1–7) encoding circuit 14 performs (1–7) RLL encoding by the write data (NRZWDT) and the VFO3/2F.

Next, an explanation will be given of the write data fetching operation at the various correspondence relationships of the three clocks VFO1FA, VFO1FB, and DLVFO1FC and WDT.

Looking at the phases and the synchronization relationships of the signals of VFO1FA, VFO1FB, DLVFO1FC, WCLK, WDAT, WDT, WGT, and FCLK of FIG. 12, it will be understood that the clock signal to which FCLK is synchronized is selected from the state of the VFO1FA, VFO1FB, and DLVFO1FC at the rising edge of the WDT. Below, note is taken of this point and an explanation made of the write data fetching operation at the phase relationships of the three clock signals and the WDT with reference to FIG. 13 and Table 2.

FIGS. 13a to 13f show the VFO3F, VFO3/2F, VFO1FA, VFO1FB, VFO1FC and DLVFO1FC of FIGS. 12a to 12f. FIGS. 13g to 13p show the relationship of the rising edge of the WDT and the states of the three clocks as well as which of the three clocks the FCLK becomes synchronized with in each case.

Figures 13G, 13H, 13I, 13J, 13K, 13L, 13M, 13N, 13O, 13P:
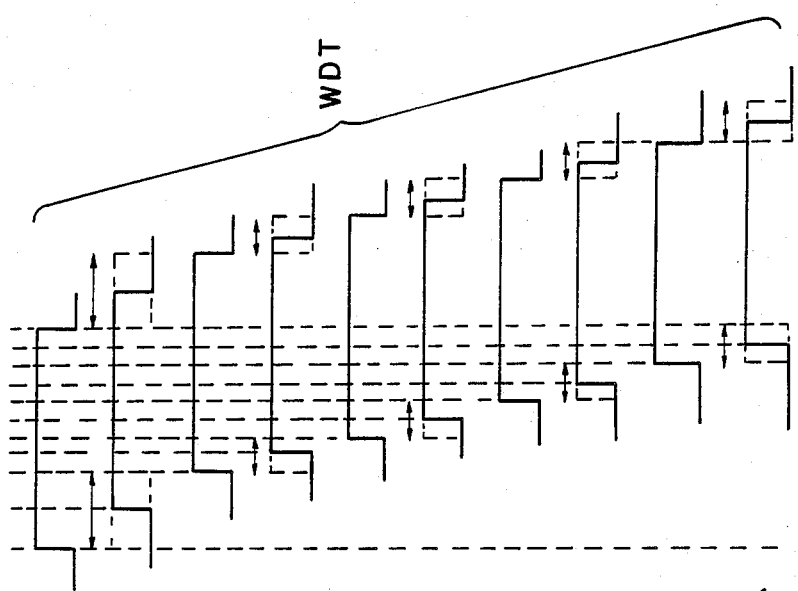

For example, in FIG. 13g (case A), if the rising edge of the WDT coincides with the rising edge of the VFO1FA, the state of the VFO1FA, VFO1FB, and DLVFO1FC becomes one of the following:

(i) 011
(ii) 001
(iii) 111
(iv) 101

Referring to the above-mentioned Table 2, in the case of (i) and (ii), the FCLK synchronizes with the VFO1FB. In the case of (iii) and (iv), the FCLK synchronizes with the DLVFO1FC. Similarly below, for FIGS. 13g to 13p (case A to J), the types of states occurring in the three clock signals at the rising edge of the WDT and the clock signals to which the FCLK synchronizes at that time are summarized and shown in Table 3. Note that A and B in the "FCLK synchronized VFO1F clock" column mean VCO1FA and VFO1FB and that (DL)C means the DLVFO1FC. The meanings of X, Y, and Z are explained later.

TABLE 3

| | Phase relation of WDT rising edge and 3 clocks | VFO1FA (X) | VFO1FB (Y) | DLVFO1FC (Z) | FCLK sync. VFO1F clock |
|---|---|---|---|---|---|
| (A) | Coincides with rising edge VFO1FA | 0 | 1 | 1 | B |
| | | 0 | 0 | 1 | B |
| | | 1 | 1 | 1 | (DL)C |
| | | 1 | 0 | 1 | (DL)C |
| (B) | Between rising edges VFO1FA and VFO1FB | 1 | 0 | 1 | (DL)C |
| (C) | Coincides with rising edge VFO1B | 1 | 0 | 1 | (DL)C |
| | | 1 | 1 | 1 | (DL)C |
| (D) | Between rising edge VFO1FB and trailing edge DLVFO1FC | 1 | 1 | 1 | (DL)C |
| (E) | Coincides with trailing edge DLVFO1FC | 1 | 1 | 1 | (DL)C |
| | | 1 | 1 | 0 | A |
| (F) | Between trailing edge DLVFO1FC and trailing edge VFO1F | 1 | 1 | 0 | A |
| (G) | Coincides with trailing edge VFO1FA | 1 | 1 | 0 | A |
| | | 0 | 1 | 0 | B |
| (H) | Between trailing edge VFO1FA and rising edge DLVFO1FC | 0 | 1 | 0 | B |
| (I) | Coincides with rising edge DLVFO1FC | 0 | 1 | 0 | B |
| | | 0 | 1 | 1 | B |
| (J) | Between rising edges DLVFO1FC and VFO1FA | 0 | 1 | 1 | B |

As shown in Table 3, for all the cases A to J, the rising edges of the FCLKs do not coincide with the rising edge of the WDT, thus it is possible to fetch the correct write data without error using the selected FCLK. Note that the delayed clock is not limited to the VFO1FC, as mentioned earlier.

Thus, it is possible to realize a simple, stable, and error-free, highly reliable write data fetching circuit by using three clock signals (VFO1FA, VFO1FB, and DLVFO1FC) which can be easily prepared from the VFO3F without use of a REF1F signal with a 50 percent duty ratio.

DETAILED CONSTRUCTION OF THE SECOND EMBODIMENT

Figure 14B:
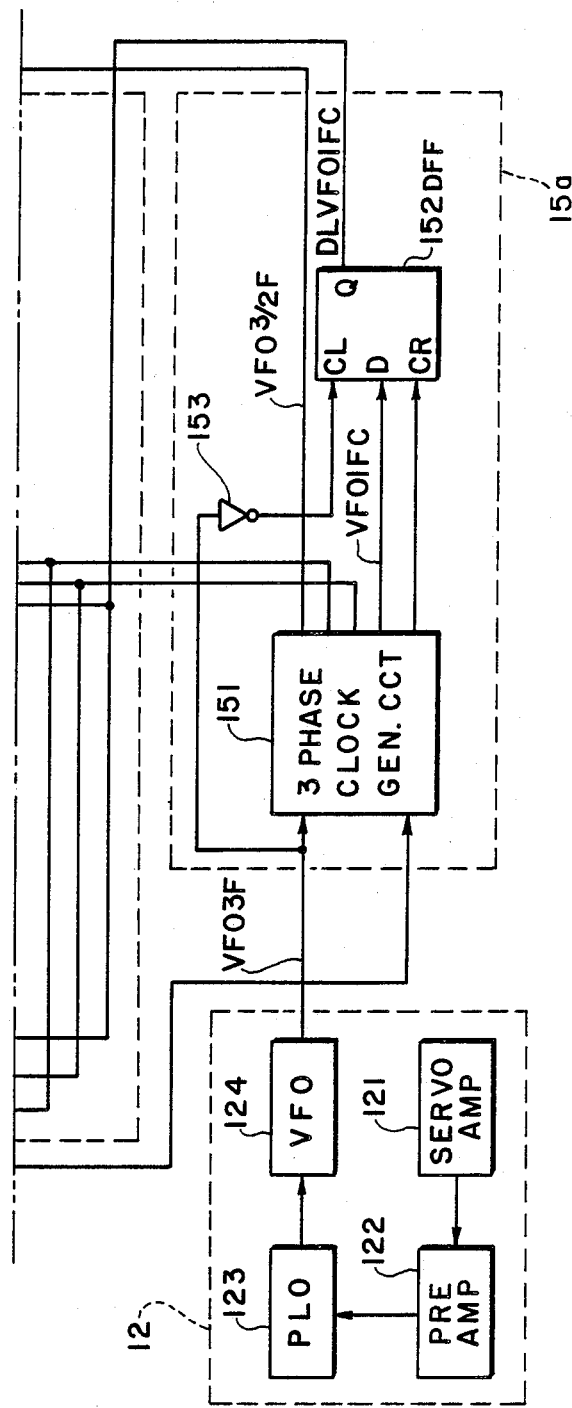

Details of the second embodiment will be explained now with reference to FIG. 12 to FIG. 14. FIG. 14 is a detailed circuit diagram of the second embodiment of the present invention. The signal waveform diagrams of FIGS. 12 and 13 may be also used as the signal waveform diagrams for the circuit of the embodiment of FIG. 14.

In FIG. 14, the control circuit 11, the VFO3F generating circuit 12, the synchronization and fetching circuit 13, the (1-7) encoding circuit 14, and the fetching clock preparing circuit 16 are the same as explained with reference to the first embodiment.

In the system clock preparing circuit 15a, reference numeral 151 is a three-clock generating circuit which as the same construction as the system clock preparing circuit 15 (FIG. 9) in the write data fetching circuit of the first embodiment and issues the VFO3/2F, VFO1FA, VFO1FB, and VFO1FC (FIGS. 12b, 12c, 12d, and 12e). Reference numeral 152 is a DFF to whose D terminal is input the VFO1FC from the three-clock generating circuit 151, to whose CL terminal is input the *VFO3F signal via an invertor 153, and to whose CR terminal is input the reset signal from the three-clock generating circuit 151. By this construction, the delayed clock signal DLVO1FC delayed from the VFO1FC by one clock cycle (f/6) is prepared.

In the fetching clock preparing circuit 16, reference numberal 161 is a D-type flip-flop (DFF), to whose CL terminal and D terminal are input the WCLK and WGT from the control circuit 11 and to whose CR terminal is input the WGT (cleared by the inverted signal of the WGT). The synchronization gate signal SYCGT is output from the Q terminal of DFF 161. Reference numerals 162A, 162B, and 162C and DFFs, to whose CL terminals are input the SYCGT from the DFF 161 and to whose CR terminals are input the WGT from the control circuit 11. The D terminal of the DFF 162A receives as input the VFO1FA from the system clock preparing circuit 15. This is latched at the rising edge of the SYCGT, and the latching signals X and *X are output from the Q and *Q terminals. The D terminal of the DFF 162B receives as input the VFO1FB. This is latched at the rising edge of the SYCGT, and the latching signals Y and *Y are output from the Q and *Q terminals. The D terminal of the DFF 162C receives as input the DLVFO1FC. This is latched at the rising edge of the SYCGT, and the latch signals z and *z are output from the Q and *Q terminals.

Reference numerals 163A$_1$, 163A$_2$, 163B$_1$, 163B$_2$, 163B$_3$, 163C$_1$, 163C$_2$, and 163C$_3$ are AND circuits which perform the logical operations of the afore-mentioned Table 2. That is, the AND circuit 163A$_1$ receives the VFO1FA from the system clock preparing circuit 15, receives the *X Y, and *Z from the DFF 162A to 162C, and, when the AND conditions of the same are high, outputs the fetching clock signal FCLKA synchronized with the VFO1FA. Similarly, the AND circuit 163A$_2$ outputs the FCLKA synchronized with the VFO1FA when the AND conditions of the VFO1FA, X, Y, and *Z are high. The AND circuit 163B$_1$ outputs the fetching clock signal FCLKB synchronized with the VFO1FB when the AND conditions of the VFO1FB, *X, Y, and *Z stand. Similarly, the AND circuit 163B$_2$ outputs the fetching clock signal FCLKB synchronized with the VFO1FB when the AND conditions of the VFO1FB, *X, Y, and Z are high. The AND circuit 163B$_3$ outputs the FCLKB synchronized with the VFO1FB when the AND conditions of the VFO1FB, *X, *Y, and Z are high. The AND circuit 163C$_1$ outputs the fetching clock FCLKC synchronized with the VFO1FC when the AND conditions of the VFO1FC, X, *Y, and Z are high. Similarly, the AND circuit 163C$_2$ outputs the fetching clock signal FCLKC synchronized with the DLVFO1FC when the AND conditions of the DLVFO1FC, X, *Y, and *Z are high. The AND circuit 163C$_3$ outputs the FCLKC synchronized with the DLVFO1FC when the AND conditions of the DLVFO1FC, X, Y, and Z are high.

Reference numeral 164 is an OR circuit which outputs the fetching clock signal FCLK using as the OR output one of the FCLKA, FCLKB, and FCLKC input from the AND circuits. Note that FCLKA, FCLKB, and FCLKC, as clear from the contents of the logical operations, are never simultaneously issued.

Note also that the AND conditions X, *Y, and *Z of the AND circuit 163C$_2$ are never high, but by providing this AND circuit 163C$_2$, there is the advantage of common use of the circuit with the fetching clock preparing circuit 16 of the write data fetching circuit of the first embodiment.

EXPLANATION OF OPERATION

The operation of the circuit of FIG. 14 will now be explained with reference to the signal waveform diagram of FIG. 12.

The system clock preparing circuit 15a, when receiving the VFO3F, outputs the VFO$_{3/2}$F, VFO1FA, VFO1FB, and DLVFO1FC (FIGS. 12b, 12c, 12d, and 12f).

The DFF 161 of the fetching clock preparing circuit 16, when receiving the WCLK and WGT from the control circuit 11, issues the SYCGT at the rising edge (Ts) of the WCLK directly after the rising edge of the WGT (FIGS. 12g, 12j, and 12k). The DFF 162A receives the VFO1FA from the system clock preparing circuit 15a at the D terminal, receives the SYCGT from the DFF 161 at the CL terminal, latches the state of the VFO1FA at the rising edge (Ts) of the SYCGT, outputs the latching signal X to the Q terminal, and outputs the latching signal *X to the *Q terminal. In the case of FIG. 12, X=1 and *X=0. The DFF 162B similiarly latches the state of the VFO1FB received from the system clock preparing circuit 15a at the rising edge (Ts) of the SYCGT received from the DFF 161, outputs the latching signal Y to the Q terminal, and outputs the latching signal *Y to the *Q terminal. In the case of FIG. 12, Y=0 and *Y=1. The DFF 162C, in the same way, latches the state of the DLVFO1FC received from the system clock preparing circuit 15a at the rising edge (Ts) of the SYCGT received from the DFF 161, outputs the latching signal Z to the Q terminal, and outputs the latching signal *Z to the *Q terminal. In the case of FIG. 12, Z=1 and *Z=0.

The AND circuit 163A$_1$ receives the VFO1FA from the system clock preparing circuit 15a, receives the latching signals *X, *Y, and *Z from the DFFs 162A to 162C, and, when the AND conditions of the same are high, outputs the FCLKA synchronized with the VFO1FA. Similarly, the AND circuit 163A$_2$, when the AND conditions of the VFO₁FA, X, Y, and *Z are high, outputs the FCLKA synchronized with the VFO1FA. In the case of FIG. 12, x=1, *X=0, Y=0, *Y=1, Z=1, *Z=0, so the FCLKA is not output.

Similarly, the AND circuit 163B₁, when the AND conditions of the VFO1FB, *X, *Y, and *Z are high, the AND circuit 163B₂, when the AND conditions of the signal VFO1FB, *X, Y, and Z are high, and the AND circuit 163B₃, when the AND conditions of the VFO1FB, *X, *Y, and Z are high, respectively output the FCLKB synchronized with the VFO1FB. In the case of FIG. 12, the FCLKB is not output.

Likewise, the AND circuit 163C₁, when the AND conditions of the signal DLVFO1FC, X, *Y, and Z are high, the AND circuit 163C₂, when the AND conditions of the DLVFO1FC, X, *Y, and *Z are high, and the AND circuit 163C₃, when the AND conditions of the DLVFO1FC, X, Y, and Z are high, respectively output the FCLKC synchronized with the DLVFO1FC. In the case of FIG. 12, X=1, Y=0, and Z=1, so the AND conditions of the AND circuit 163C₁ are high and the FCLKC is output. Then, in the case of FIG. 12, the OR circuit 164 outputs the FCLKC input from the AND circuit 163C₁ as the FCLK and supplies the same to the CL terminal of the DFF 132.

The afore-mentioned Table 2 and Table 3 show to which of the three clock signals the FCLK is synchronized in accordance with the various states of the VFO1FA, VFO1FB, and DLVFO1FC latched at the rising edge of the SYCGT.

On the other hand, the DFF 131 of the synchronization and fetching circuit 13, when receiving the WCLK, WDAT, and WGT from the control circuit 11, issues the WGT, then synchronizes and shapes the WDAT by the WCLK and outputs the resultant WDT to the Q terminal (FIGS. 12g, 12h, 12i, and 12j). DFF 132 synchronizes and shapes the WDT received from the DFF 131 by the FCLK received from the fetching clock preparing circuit 16 and outputs the NRZ type write data NRZWDT (FIGS. 12i, 12l, and 12m). The (1-7) encoding ciricuit 14 receives the write dta NRZWDT from the DFF 132, receives the VFO3/2F from the system clock preparing circuit 15a, and prepares the (1-7) RLL code.

By performing the fetching operation of the write data from the WDT by the FCLK prepared in this way, it is possible to perform a correct write data fetching operation, as explained with reference to FIG. 13 previously.

Above, an explanation was made of a second embodiment of the present invention, but the present invention is not limited to this embodiment. For example, the clock signal given the delay may be VFO1FA or VFO1FB instead of VFO1FC. Further, it is possible to set the amount of delay given to the clock anywhere within the range of one clock ((1/6)f).

EFFECTS OF THE SECOND EMBODIMENT

As explained above, according to the second embodiment of the present invention, the following effects are obtained:

(1) The writer data fetching clock is prepared by three clocks of a fundamental freqeuncy 1f, one clock signal of which is delayed within the range of one clock cycle (f/6) from the correct phase, so that it is possible to fetch write data without any error.

(2) Instead of a 50 percent duty ratio VFO1F, use is made of three easy, stable, and precise clock signals, thus the system clock preparing circuit and the overall write data fetching circuit are simplified and the reliability is improved.

C. Third Embodiment

As explained above, the conventional (1-7) RLL coded write data fetching circuit suffered from the problem that it sometimes could not fetch the correct write data unless the REF1F signal had a duty ratio of exactly 50 percent. In the case of digital signals, it is difficult to prepare an REF1F with a duty ratio of 50 percent from the VFO3F and the resultant frequency division circuit is unsatisfactory in precision and stability, so realization of a reliable write data fetching circuit is difficult.

The third embodiment of the present invention, like the first embodiment but using a method different from the first embodiment, has as its object performing without error a write data fetching operation by a simple circuit construction and the provision of a highly reliable write data fetching circuit.

BASIC CONSTRUCTION OF THIRD EMBODIMENT

The reason why conventional write data fetching circuit required a REF1F signal with a duty ratio of 50 percent was that, in the conventional write data fetching circuit, the handling of data between the control circuit and the encoding circuit was performed in units of the fundamental frequency 1f, i.e., 1 bit. However, in a (1-7) RLL code, 3-bit encoded data is prepared based on the current 2-bit data and the next 2-bit data. That is, the write data is fetched in the (1-7) encoding circuit in 2-bit units, whereby normally (1-7) RLL encoding is possible. In this case, as explained below, a REF1F signal with a duty ratio of 50 percent is not required. The third embodiment of the present invention was made based on this idea.

Figure 15:
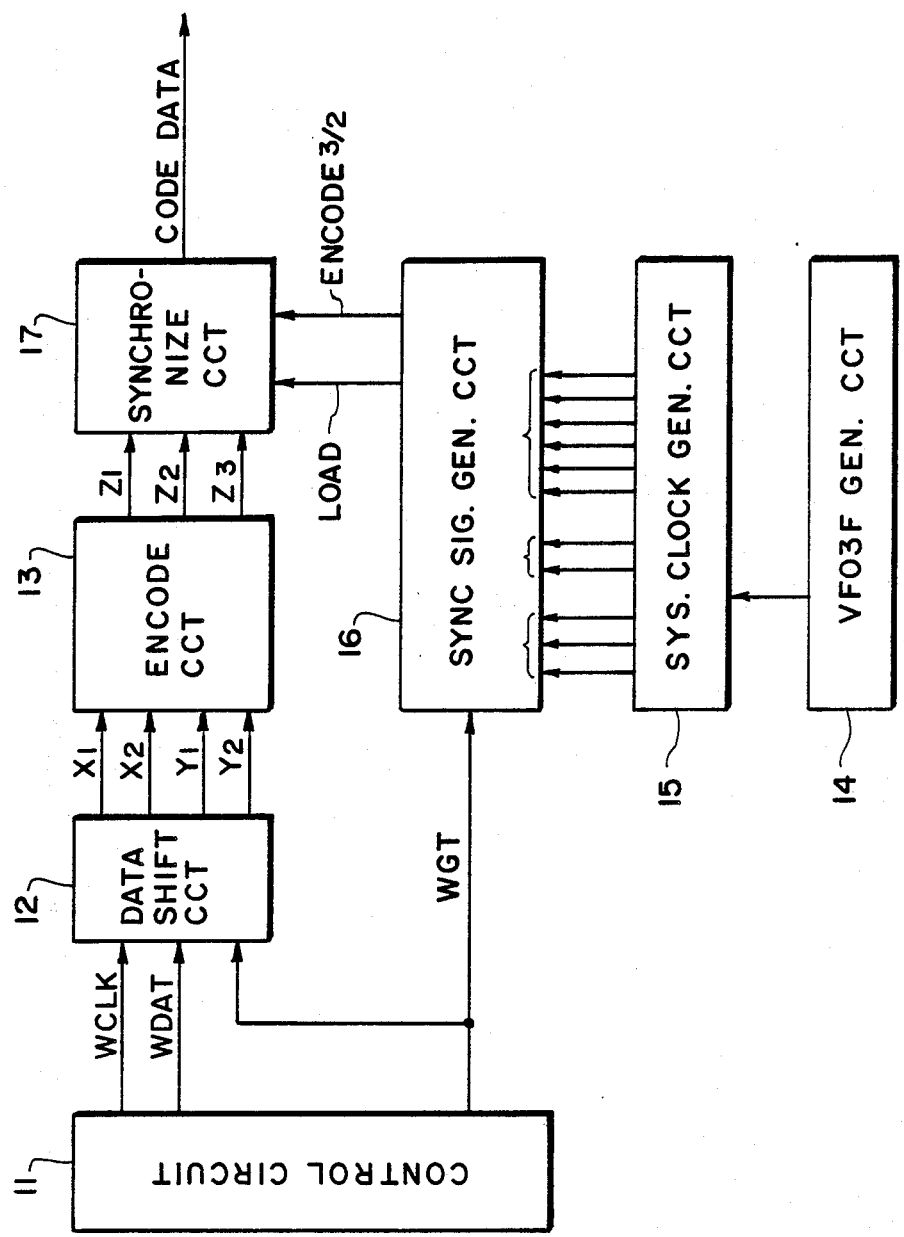
FIG. 15 is a block diagram of the basic construction of a third embodiment of the present invention.

FIG. 15 shows the basic structure of the third embodiment of the present invention by a block diagram.

In FIG. 15, reference numeral 11 is a control circuit which transmits a write clock signal WCLK of a fundamental frequency 1f, a write data WDAT by which data is generated at 1 bit/1f synchronized with the WCLK, and a write gate signal WGT which indicates the start of the write operation. Reference numeral 12 is a data shift circuit which makes the WDAT input from the control circuit phase-synchronized with the WCLK and generates four bits of data, $X_1$, $X_2$, $Y_1$, and $Y_2$ in units of 2 bits and shifted one bit each. Reference numeral 13 is a (1-7) encoding circuit which performs (1-7) RLL coding processing based on the $X_1$, $X_2$, $Y_1$, and $Y_2$ input from the data shift circuit 12 and outputs a three-bit unit parallel code data $Z_1$, $Z_2$, and $Z_3$.

Reference numeral 14 is a VFO3F generating circuit which generates asynchronously with the WCLK the clock signal VFO3F of a frequency three times the fundamental frequency 1F. Reference numeral 15 is a system clock preparing circuit which receives the VFO3F from the VFO3F generating circuit and issues the three reference clock signals VFO1/2FRA, VFO1/2FRB, and VFO1/2FRC of the frequency 1/2(f) shifted by one clock each and synchronized with VFO3F, the clock VFO3/2F and its inverted clock *VFO3/2F (where * is an inversion symbol, same below for other symbols) divided from VFO3F and with a frequency of (3/2)f, the six synchronization clock signals VFO1/2A1, VFO1/2FB0, VFO1/2FC4, VFO1/2FA6, VFO1/2FB7, and VFO1/2FC3 shifted one clock cycle each and synchronized with the VFO3F and having a frequency of (1/2)f and a width of 2 bits.

Reference numeral 16 is a synchronizational signal generating circuit which receives the WGT from the control circuit 11, receives the three reference clock signals from the system clock preparing circuit 15, the VFO3/2F, the *VFO3/2F, and the six synchronization clock signals, and outputs a load signal LOAD of a frequency of (1/2)f synchronized with one of the six synchronization clocks in accordance with the state of the three reference clock signals at the rising edge of the WCLK directly after the generation of the WGT and an encoding clock ENCOD3/2F of a frequency of (3/2)f synchronized with one of the VFO3/2F and *VFO3/2F in accordance with the state of the three reference clock signals.

Reference numeral 17 is a synchronization circuit which receives the LOAD signal and the ENCOD3/2F from the synchronization signal generating circuit 16 and converts to a serial format the parallel code data $Z_1$, $Z_2$, and $Z_3$ input from the (1–7) encoding circuit 13 to a 3-bit unit code data CODE DATA synchronized with the ENCOD3/2F.

The operation of FIG. 15 will be explained with reference to the operational waveform diagrams of FIGS. 16 to 19. FIG. 16 is an overall signal waveform diagram, FIG. 17 is a signal waveform diagram of the system clock preparing circuit, and FIGS. 18 and 19 are signal waveform diagrams of the synchronization signal generating circuit.

The control circuit 11 transmits the clock signal WCLK with the fundamental frequency 1f, the write data WDAT synchronized with the WCLK having data generated at 1 bit/1f, and the WGT generated asynchronously with the two signals and indicating the start of the write operation (FIGS. 16f, 16g, and 16h).

After the generation of the WGT, the data shift circuit 12 synchronizes the phases of the WDAT and WCLK input from the control circuit 11 and generates the four pieces of data $X_1$, $X_2$, $Y_1$, and $Y_2$ in 2-bit units shifted one bit each (one clock's worth) (FIGS. 16f, 16g, 16h, and 16l to 16p). The (1–7) encoding circuit 13 performs the known (1–7) RLL encoding processing based on the $X_1$, $X_2$, $Y_1$, and $Y_2$ input from the data shift circuit 12 outputs the 3-bit unit parallel code data $Z_1$, $Z_2$, and $Z_3$. When the WDAT is all "0", "$X_1$, $X_2$" and "$Y_1$, $Y_2$" are both "00". In that case, the "$Z_1$, $Z_2$, $Z_3$" is coded as "001" (FIGS. 16g, 16l to 16s).

On the other hand, the VFO3F generating circuit 14 generates asynchronously with WCLK the clock signal VFO3F of a frequency three times the fundamental frequency 1f (FIGS. 16a and 16f). The system clock preparing circuit 15 receives the VFO3F form the VFO3F generating circuit 14 and generates the three reference clock signals VFO1/2FRA, VFO1/2FRB, and VFO1/2FRC of the frequency (1/2)f shifted by one clock signal each and synchronized with VFO3F (FIGS. 16a, 16c, 16d, 16e, and 17a, 17d, 17e, and 17f), the clock signal VFO3/2F and its inverted clock signal *VFO3/F divided from VFO3F and with a frequency of (3/2)f (FIGS. 16b and 17b, however, *VFO3/2F not shown), and the six snchronization clock signals VFO1/2A1, VFO1/2FB0, VFO1/2FC4 VFO1/2FA6, VFO1/2FB7, and VFO1/2FC3 shifted one clock cycle each and synchronized with the VFO3F and having a frequency of (1/2)f and a width of 2 bits (FIGS. 17a, 17g to 17l).

The synchronization signal generating circuit 16 receives the WGT from the control circuit 11, receives the three reference clock signals from the system clock preparing circuit 15, the VFO3/2F, the *VFO3/2F, and the six synchronization clock signals, and outputs both the LOAD signal of a frequency of (1/2)f synchronized with one of the six synchronization clock signals in accordance with the state of the three reference clock signals at the rising edge of the WCLK directly after the generation of the WGT, and further outputs the ENCOD3/2F of a frequency of (3/2)f is synchronized with one of the VFO3/2F and *VFO3/2F in accordance with the state of three reference clock signals. Note that the synchronization gate signal SYCGT shown in FIG. 16i is a gate signal generated inside the synchronization signal generating circuit 16 at the rising edge (Ts) of the WCLK directly after the generation of the WGT.

Table 4 shows an example of the correspondence relationship between the state of the three reference clock signals VFO1/2FRA, VFO1/2FRB, and VFO1/2FRC at the point of time (Ts) of generation of the SYCGT and the six synchronization clock signals to which the LOAD signal is synchronized.

TABLE 4

|   | VFO1/2FRA | VFO1/2FRB | VFO1/2FRC | LOAD signal sync'ed with sync. clock |
|---|---|---|---|---|
| 0 | 0 | 0 | 0 | VFO1/2FB0 |
| 1 | 0 | 0 | 1 | VFO1/2FA1 |
| 3 | 0 | 1 | 1 | VFO1/2FC3 |
| 4 | 1 | 0 | 0 | VFO1/2FC4 |
| 6 | 1 | 1 | 0 | VFO1/2FA6 |
| 7 | 1 | 1 | 1 | VFO1/2FB7 |

As clear from a comparison of FIG. 17 and Table 4, seen from the reference point of time of the state of the three reference clock signals covered, the next rising synchronization clock signal is synchronized to. For example, in the case of FIG. 16, the state of the reference clock signals VFO1/2FRA, VFO1/2FRB, and VFO1/2FRC at the point of change (point of rise Ts) of the WCLK directly after the rising edge of the WGT is "001", so a LOAD signal synchronized with the VFO1/2FRA1 is generated after the generation of the WGT (FIGS. 16c, 16d, 16e, 16f, 16h, and 16k).

Further, when the state of the reference clock signals VFO1/2FRA, VFO1/2FRB, and VFO1/2FRC at the rising edge of the WCLK directly after the rising edge of the WGT, i.e., the point of generation (point of rise Ts) of the SYCGT, is "000", "110", "011", that is, "0,6,3", the ENCOD3/2F synchronizes with the VFO3/2F and when "001", "100", or "1 11", that is, "1,4,7", the ENCOD3/2F synchronizes with the *VFO3/2F.

The synchronization circuit 17 receives the LOAD signal and the ENCOD3/2F from the synchronization signal generating circuit 16 and converts the parallel code data $Z_1$, $Z_2$, and $Z_3$ input from the (1–7) encoding circuit 13 to a serial format with a 3-bit unit CODE DATA synchronized with the ENCOD3/2F.

Note that the content of the waveforms and circuits in FIG. 16 and FIG. 17 not explained will be discussed later.

By using the LOAD signal at ENCOD3/2F preparing in this way, as explained in reference to FIGS. 18 and 19 next, it is possible to reliably synchronize the coding data output by the (1-7) encoding circuit at each of the states of the three clock signals at the generation of the SYCGT.

Looking at the phases and the synchronization relationships of the signals of VFO1/2FRA, VFO1/2FRB, VFO1/2FRC, WCLK, WDAT, SYCGT, LOAD and ENCOD3/2F, it will be understood that the six synchronization clock signals which synchronize the LOAD signal and ENCOD3/2F are determined from the state of the VFO1/2FRA, VFO1/2FRB, and VFO1/2FRC at the rising edge of the SYCGT. Below, note is taken of this point and an explanation made of the synchronization and generating operation of the LOAD signal and the ENCOD3/2F at the phase relationships of the three reference clock signals and the SYCGT with reference to FIGS. 18 and 19 and Table 4.

FIGS. 18b and 18d and FIGS. 19b to 19d show the VFO1/2FRA, VFO1/2FRB, and VFO1/2FRC shown in FIGS. 16b to 16e. FIGS. 18f1 to 18f6 through FIGS. 18h1 to 18h6 (cases 1 to 3) and FIGS. 19f1 to 19f6 through FIGS. 19h1 to 19h6 (cases 4 to 6) shown the SYCGT generated synchronized with the WCLK directly after the rising edge of the WGT at the zones (1) to (6) and the six synchronization clock signals for synchronizing the LOAD signal and ENCOD3/2F and VFO3/2F (*VFO3/2F) based upon the relation of the states of the three reference clock signals at the rising edge of the SYCGT.

For example, in case 1, the state of VFO1/2FRA, VFO1/2FRB, and VFO1/2FRC at the point of rise of the SYCGT (zone (1)) is "001". Referring to Table 4, in the case 1, the LOAD signal synchronizes with the synchronization clock signal VFO1/2FA1 and the ENCOD3/2F synchronizes with the *VFO3/2F.

Table 5 summarizes and shows the types of states caused by the three reference clock signals at the rising edge of the SYCGT (zone (1) to (6)) for the cases 1 to 6, the one of the six synchronization clock signals to which the LOAD signal synchronizes, and the VFO3/2F (*VFO3/2F) to which the ENCOD 3/2F synchronizes.

TABLE 5

| Case | Corres. bet. SYCGT rising edge and ref. clock | VFO1/2 FRA | VFO1/2 FRB | VFO1/2 FRB | LOAD signal sync'ed sync. clock | EDCOD3/2F sync'ed VFO3/2F |
| --- | --- | --- | --- | --- | --- | --- |
| 1 | zone (1) | 0 | 0 | 1 | VFO1/2FA1 | *VFO3/2F |
| 2 | zone (5) | 1 | 1 | 1 | VFO1/2FB7 | *VFO3/2F |
| 3 | zone (2) | 0 | 0 | 0 | VFO1/2FB0 | VFO3/2F |
| 4 | zone (3) | 1 | 0 | 0 | VFO1/2FC4 | *VFO3/2F |
| 5 | zone (6) | 0 | 1 | 1 | VFO1/2FC3 | VFO3/2F |
| 6 | zone (4) | 1 | 1 | 0 | VFO1/2FA6 | VFO3/2F |

As shown in Table 5, even if the point of the rise of the SYCGT is in the zone (1) or (2), LOAD signal and the ENCOD3/2F are unilaterally synchronized. Further, even if the rising edge of the SYCGT occurs a the boundary of zones, the LOAD signal and ENCOD3/2F are unilaterally synchronized. For example, if the rising edge of the SYCGT occurs at the boundary of the zones (1) and (2), the state of the VFO1/2FRA, VFO1/2FRB, and VFO1/2FRC becomes either "001" or "000". The former case is the same as case 1, where the LOAD signal synchronizes with the VFO1/2FA1 and the ENCOD3/2F synchronizes with the *VFO3/2F. The latter case is the same as the case 3, where the LOAD signal synchronizes with the VFO1/2FB0 and the ENCOD3/2F synchronizes with the VFO1/2F. The same applies when the SYCGT is generated at the boundary of other zones and synchronization is effected by one of the cases of the two zones. In either case, the sunchronized LOAD signal and ENCOD3/2F subsequently maintain that synchronization state.

In this way, by fetching directly the WDAT in 2-bit units into the (1-7) encoding circuit, it is possible to perform a fetching operation without using a REF1F with a 50 percent duty ratio. Further, it is possible to synchronize the encoding data to the ENCOD3/2F signal by the LOAD signal and ENCOD3/2F prepared using the three reference clocks and the six synchronization clock signals, which can be easily and stably prepared from the VFO3F. Thus, it is possible to perform a write data fetching operation without error by using a simpler circuit construction than available in the past and to realize a highly reliable write data fetching circuit.

DETAILED CONSTRUCTION OF THIRD EMBODIMENT

Figure 20A:
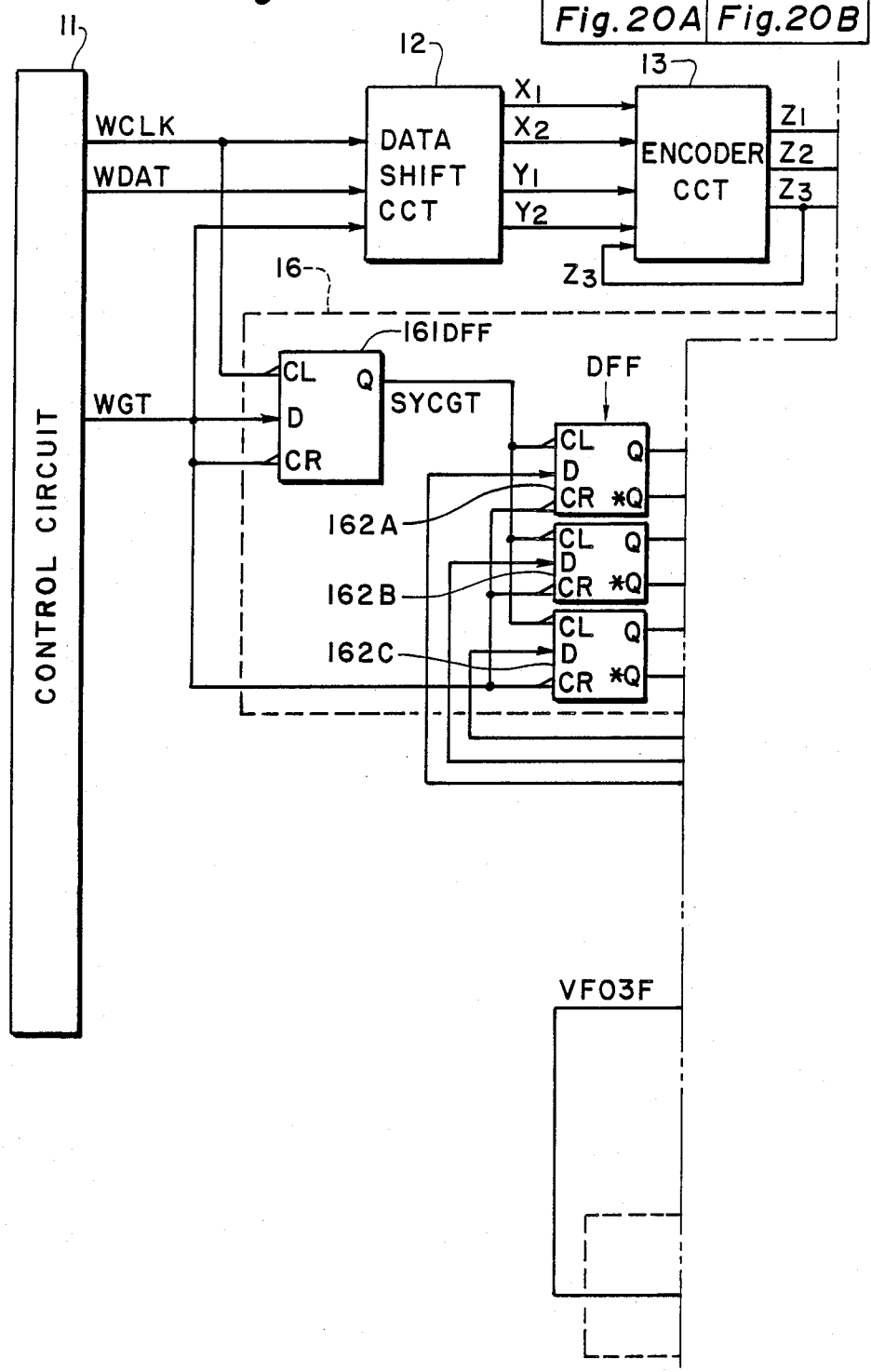
FIGS. 20A and 20B are detailed circuit diagrams of the third embodiment of the present invention.
Figure 20B:
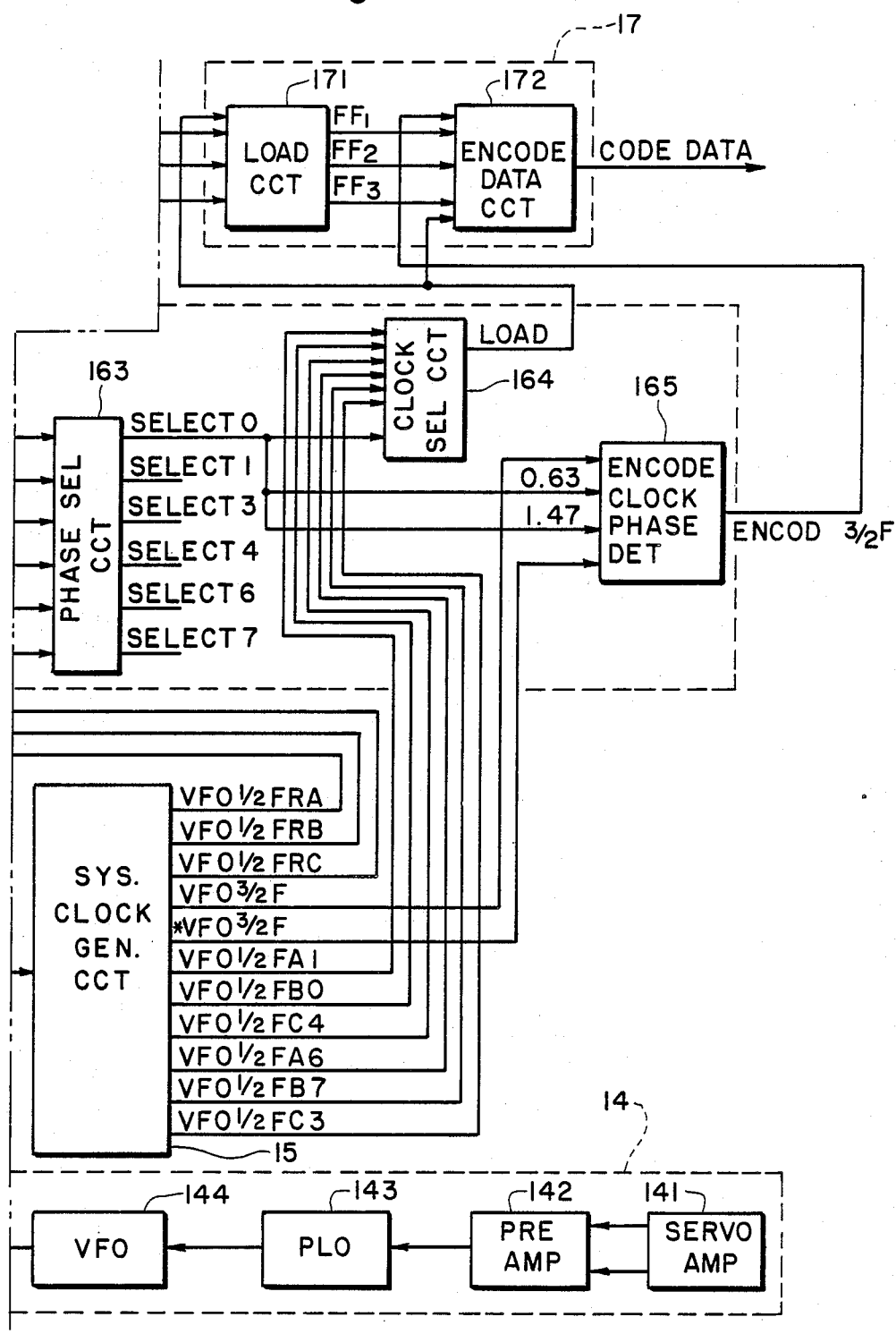
Figure 21:
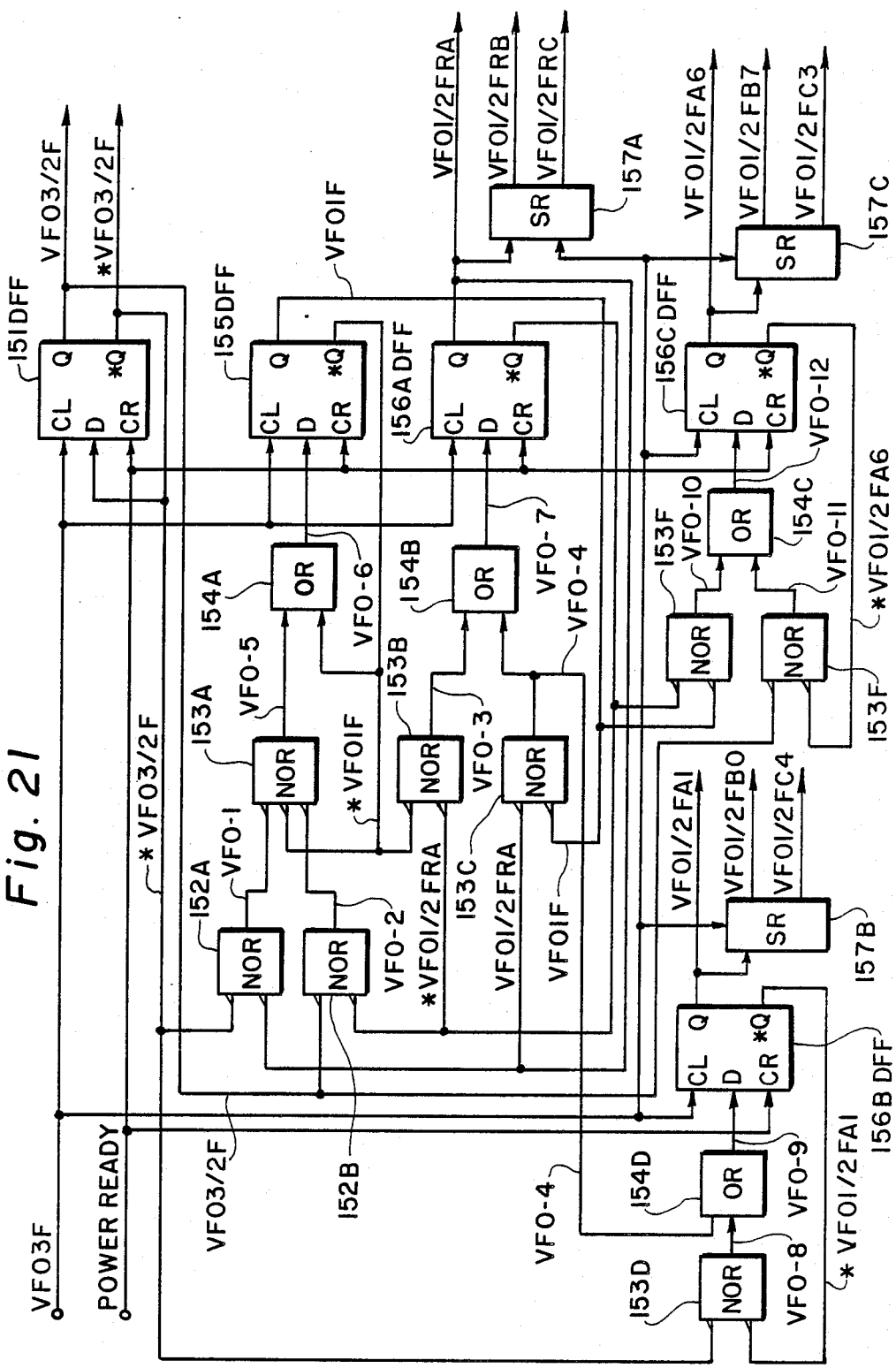
FIG. 21 is a block diagram of the system clock preparing circuit of the same embodiment.
Figure 23:
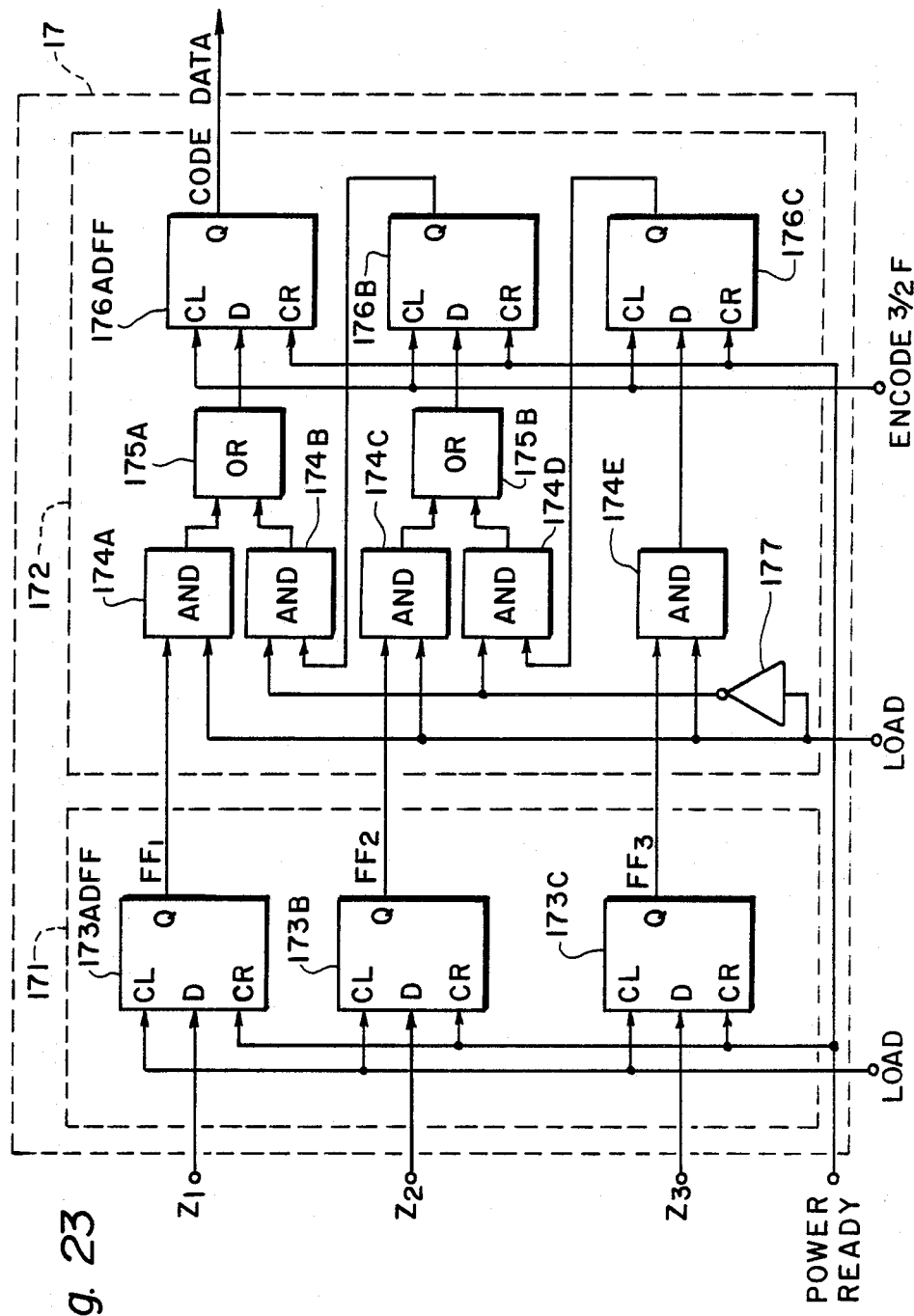
FIG. 23 is a block diagram of the synchronization circuit of the third embodiment.

Details of the third embodiment of the present invention will be explained with reference to FIGS. 16 to 23. FIG. 20 is a circuit diagram of the third embodiment of the present invention, FIG. 21 is a diagram of the system clock preparing circuit of the embodiment, FIG. 22 is a signal waveform diagram of the system clock preparing circuit, and FIG. 23 is an explanatory view of the synchronization circuit of the embodiment. The operational waveform diagrams of FIG. 16 to FIG. 19 are also used for the explanation of the operation of the circuit of the embodiment of FIG. 20.

DETAILED CIRCUIT OF THIRD EMBODIMENT

In FIG. 20, the control circuit 11, the data shift circuit 12, the (1-7) encoding circuit 13, the VFO3F generating circuit 14, the system clock preparing circuit 15, the synchronization signal generating circuit 16, and the synchronization circuit 17 are as explained with reference to FIG. 15.

In the VFO3F generating circuit 14, reference numeral 141 is a servo amplification circuit (SERVO AMP) which detects a clock signal form a magnetic disk (not shown). Reference numberal 142 is a preamplification circuit (PRE AMP) which amplifies the clock signal of the servo amplification circuit 141. Reference numeral 143 is a phase locked oscillation circuit (PLO) which receives the clock of the PRE AMP 142 and generates the signal of the frequency 3f. Reference numeral 144 is a variable frequency oscillation circuit which receives the output of the PLO 143 and generates the clock VFO3F.

In the synchronization signal generating circuit 16, reference numeral 161 is a DFF which receives as input at its clock (CL), data (D), and clear (CR) terminals the WCLK and WGT from the control circuit 11 and outputs the SYCGT from its Q terminal. The clear operation is performed by the inverted signal (trailing edge) of the WGT.

Reference numerals 162A, 162B, and 162C are three stages of DFFs which receive as inputs at their CL terminals the SYCGT from the DFF 161 and receive as inputs at their CR terminals the WGT. The D terminal of the DFF 162 receives as input the VFO1/2FRA from the system clock preparing circuit 15 and the output terminals Q and *Q output, respectively, the value of the VFO1/2FRA latched at the point of the rising edge of the SYCGT and its inverted value. The D terminal of the DFF 162B receives as input the VFO1/2FRB and the output terminals Q and *Q output, respectively, the value of the VFO1/2FRB latched at the rising edge of the SYCGT and its inverted value. The D terminal of the DFF 162C receives as input the VFO1/2FRC and its output terminals Q and *Q output, respectively, the value of the VFO1/2FRC latched at the point of the rising edge of the SYCGT and its inverted value.

Reference numeral 163 is a phase selection circuit which generates one of the signals SELECT 0, 1, 3, 4, 6, and 7 for selecting one of the six synchronization clock signals in accordance with the valves of the DFF 162A to 162C, i.e., the states "000", "001", "011", "100", "110", and "111" (that is, "0", "1", "3", "4", "6", and "7") of the reference clock signals VFO1/2FRA to VFO1/2FRC at the rising edge of the SYCGT. The SELECT 0 selects the VFO1/2FB0, SELECT 1 selects the VFO1/2FA1, SELECT 3 selects the VFO1/2FC3, SELECT 4 selects the VFO1/2FC4, SELECT 6 selects the VFO1/2FA6, and SELECT 7 selects the VFO1/2FB7.

Reference numeral 164 is a clock selection circuit which receives the six synchronization clock signals VFO1/2FA1 to VFO1/2FC3 from the system clock preparing circuit 15, receives the SELECT 0 to 7 from the phase selection circuit 163 (only input of SELECT 0 is shown), and outputs the input synchronization clock signal indicated by the SELECT (0 to 7) as the LOAD signal.

Reference numeral 165 is an encoding clock phase detection circuit which receives the VFO3/2F and *VFO3/2F from the system clock preparing circuit 15, receives the SELECT 0, 6, and 3 and the SELECT 1, 4, and 7 from the phase selection circuit 163. When one of the SELECT 0, 6, and 3 is input, the encoding clock phase detection circuit 165 outputs the VFO3/2F as the ENCOD3/2F and, when one of the SELECT 1, 4, and 7 is input, it outputs the *VFO3/2F as the ENCOD3/2F.

In the synchronization circuit 17, reference numeral 171 is a LOAD circuit which receives for the (1-7) encoding circuit the parallel coding data $Z_1$, $Z_2$, and $Z_3$ and receives from the clock selection circuit 164 the LOAD signal. The LOAD circuit 17 latches the parallel coding data $Z_1$, $Z_2$, and $Z_3$ at the rising edge of the LOAD signals and outputs the latching signals $FF_1$, $FF_2$, and $FF_3$. Reference numeral 172 is an ENCODE DATA circuit which receives the latching signals $FF_1$, $FF_2$, and $FF_3$ from the LOAD circuit 171, receives the LOAD signal from the clock selection circuit 164, receives the ENCOD3/2F form the encoding clock phase detection circuit 165, and converts the latching signals $FF_1$, $FF_2$, and $FF_3$ input from the LOAD circuit 171 to serial CODE DATA synchronized with the ENCOD3/2F.

SYSTEM CLOCK PREPARING CIRCUIT

FIG. 21 shows an example of the system clock preparing circuit, and FIGS. 17 and 22 are signal waveform diagrams of the same.

DFF 151 functions as a 1/2 frequency divider and receives as input at its CL terminal the VFO3F from the VFO3F generating circuit 14 (FIG. 22a). The *Q terminal and D terminal are connected and the CR terminal receives as input the clear power ready signal from the control circuit 11. By this construction, the VFO3/2F of a frequency of (3/2)f is output to the Q terminal (FIG. 22b) and the *VFO3/2F is output to the *Q terminal.

To one of the input terminals of the NOR circuit 152A is input the *VFO3/2F from the DFF 151. To the other input terminal is input the VFO1/2FRA (FIG. 22d) from the DFF 156A, explained later. By this, the VFO-1 is output as the NOR output of the two from the NOR circuit 152A (FIG. 22g). To one of the input terminals of the NOR circuit 152B is input the VFO3/2F from the DFF 151. To the other input terminal is input the *VFO1/2FRA from the DFF 156A, explained later. By this, the VFO-2 is output and the NOR output of the two from the NOR circuit 152B (FIG. 22h).

To the first input terminal of the NOR circuit 153A is input the VFO-1 from the NOR circuit 152A. To the second input terminal is input the *VFO1F (inverted signal of VFO1F of FIG. 22c) from the DFF 155, explained later. To the third input terminal is input the VFO-2 from the NOR circuit 152B. By this, the VFO-5 is output as the NOR output of the three from the NOR circuit 153A (FIG. 22i). To one of the input terminals of the NOR circuit 153B is input the *VFO1F from the DFF 155. To the other input terminal is input the *VFO1/2FRA (inverted signal of VFO1/2FRA of FIG. 22d) from the DFF 156A. By this, the VFO-3 is output as the NOR output of the two from the NOR circuit 153B (FIG. 22k). To one of the input terminals of the NOR circuit 153C is input the VFO1/2FRA from the DFF 156A (FIG. 22d). To the other input terminal is input the VFO1F (FIG. 22c) from the DFF 155. By this, the VFO-4 is output as the NOR output of the two from the NOR circuit 153C (FIG. 22l).

The OR circuit 154A outputs the VFO-6 as the OR output of the VFO-5 from the NOR circuit 153A and the *VFO1F from the DFF 155 (FIG. 22j). The OR circuit 154B outputs the VFO-7 as the OR output of the VFO-3 from the NOR circuit 153B and the VFO-4 from the NOR circuit 153C (FIG. 22m).

The CL terminal of the DFF 155 receives as input the VFO3F (FIG. 22a). The D terminal receives as input the VFO-6 from the OR circuit 154A (FIG. 22j). The CR terminal receives as input the clear power ready signal. By this, the VFO1F is output from the Q terminal of the DFF 155 (FIG. 22c). The *Q terminal outputs the *VFO1FA.

On the other hand, the CL terminal of the DFF 156A receives as input the VFO3F (FIG. 22a), while the D terminal receives as input the VFO-7 from the OR circuit 154B. The CR terminal receives as input the power ready signal. By this, the Q terminal of the DFF 156A outputs the VFO1/2FRA (FIG. 22d and FIG. 17d), and the *Q terminal outputs the *VFO1/2FRA.

Reference numeral 157A is a shift register, which successively shifts the VFO1/2FRA input from the DFF 156A by the VFO3F and outputs the VFO1/2FRB and VFO1/2FRC (FIGS. 17a, 17d, 17e, 17f).

Next, to one of the input terminals of the NOR circuit 153D is input the *VFO3/2F from the DFF 151. To the other input terminal is input the *VFO1/2FA1 (FIG. 16e) from the DFF 156B, explained later. The VFO-8 is output as the NOR output (FIG. 22n). To one of the input terminals of the NOR circuit 154D is input the VFO-4 from the NOR circuit 153C. To the other input terminal is input the VFO-8 from the NOR circuit 153D. The VFO-9 is output as the OR output (FIG. 22p).

To the CL terminal of the DFF 156B is input the VFO3F. The D terminal receives as input the VFO-9 from the OR circuit 154D. The CR terminal receives as input the power ready signal. By this, the VFO1/2FA1 is output from the Q terminal of the DFF 156B, and the *VFO1/2FA1 is output from the *Q terminal (FIGS. 22a, 22e, 22p, and 17g.). Reference numeral 157B is a shift register, which successively shifts the VFO1/2FA1 input from the DFF 156B by the VFO3F and outputs the VFO1/2FB0 and VFO1/2FC4 (FIGS. 17a, 17g, 17h, and 17i).

To one of the input terminals of the NOR circuit 152E is input the *VFO1/2FRA from the DFF 156A. To the other input terminal is input the VFO1F from the DFF 155. The VFO-10 is output as the NOR output of the same (FIG. 22q). Further, one of the input terminals of the NOR circuit 153F receives as input the VFO3/2F from the DFF 151. The other input terminal receives as input the *VFO1/2FA6 (FIG. 17j) from the DFF 156C, explained later. The VFO-11 is output as the NOR output (FIG. 22r). One of the input terminals of the OR circuit 154C receives as input the VFO-10 from the NOR circuit 153E. The other input terminal receives as input the VFO-11 from the NOR circuit 153F. The VFO-12 is output as the OR output (FIG. 22s).

The CL terminal of the DFF 156C receives as input the VFO3F. The D terminal receives as input the VFO-12 from the OR circuit 154C. The CR terminal receives as input the power ready signal. By this, the VFO1/2FA6 is output from the Q terminal of the DFF 156C, and the *VFO1/2FA6 is output from the *Q terminal (FIG. 22f and 17j). Reference numeral 157C is a shift register, which successively shifts the VFO1/2FA6 input from the DFF 156C by the VFO3F and outputs the VFO1/2FB7 and VFO1/2FC3 (FIGS. 17j, 17k, and 17l).

In the way, the system clock preparing circuit 15 can prepare the three reference clock signals VFO1/2FRA to VFOFRC, VFO3/2F, *VFO3/2F, and the six cycle clocks VFO1/2FA1 to VFO1/2FC3.

SYNCHRONIZATION CIRCUIT

FIG. 23 shows an example of the synchronization circuit.

The LOAD circuit 171 is comprised of a parallel circuit of the three DFFs 173A to 173C. The CL terminals receive as input the LOAD signal from the clock selection circuit 164 and the CR terminal receives as input the clear power ready circuit. The D terminals of the DFF 173A, 173B, and 173C receive as input the parallel code data $Z_1$, $Z_2$, and $Z_3$ from the (1-7) encoding circuit 13. By this the $Z_1$, $Z_2$, and $Z_3$ are latched at the rising edge of the LOAD signals and the latching outputs $FF_1$, $FF_2$, and $FF_3$ are output to the Q terminal of the DFF 173A, 173B, and 173C.

In the ENCODE DATA circuit 172, reference numerals 174A to 174E are AND circuits, 175A and 175B are OR circuits, 176A to 176C are DFFs, and 177 is an inverter. One of the input terminals of the AND circuits 174A, 174C, and 174E receive as inputs the LOAD signal from the clock selection circuit 164. The other terminal receives as input the $FF_1$, $FF_2$, and $FF_3$ from the DFF 173A to 173C. One of the input terminals of the AND circuit 174B and 174D receive as input the *LOAD signal through the inverter 177. The other input terminal of the AND circuit 174B receives as input the output of the Q terminal of the DFF 176B. The other input terminal of the AND circuit 174D receives as input the output of the Q terminal of the DFF 176C.

The CL terminals of the DFF 176A to 176C receives as input the ENCOD3/2F, while the CR terminals receive as input the clear power ready signals. The D terminal of the DFF 176A is supplied with the OR output of the OR circuit 175A. The D terminal of the DFF 176B is supplied with the OR output of the OR circuit 175B. The D terminal of the DFF 176C is supplied with the output of the AND circuit 174E.

In this configuration, when the LOAD signal turns on (1 level), the AND circuits 174B and 174D are shut off by the *LOAD signal, and the latching signals $FF_1$, $FF_2$, and $FF_3$ are latched to the DFF 173A, 173B, and 173C, respectively, and then passed through the AND circuits 174A, 174C, and 174E. When the LOAD signal is off (0 level), the AND circuits 174A, 174C, and 174E are closed and, during the serial conversion, the $FF_1$ to $FF_3$ of the DFF 173A to 173C are prevented from being input to the DFF 176A to 176C. On the other hand, the AND circuits 174B and 174D turn on and, together with the DFF 176A to 176C, constitute a shift register. The $FF_1$ to $FF_3$ latched to the DFF 176A to 176C, i.e., the $Z_1$ to $Z_3$, are output serially synchronously with the ENCOD3/2F and converted to serial CODE DATA (FIG. 16k, 16q to 16x).

As mentioned above, processing is performed to latch the parallel code data from the (1-7) encoding circuit by the LOAD signal and to convert this to the 3-bit unit serial CODE DATA synchronized with the ENCOD3/2F.

EXPLANATION OF OPERATION OF THIRD EMBODIMENT

The operation of the third embodiment will now be explained with reference to the signal waveform diagrams of FIG. 16 to FIG. 19.

The control circuit 11 transmits the WCLK having the fundamental frequency 1f, the WDAT by which data is generated by 1 bit/1f in synchronization with the WCLK, and the WGT generated asynchronously with these two signals indicates the start of the write operation (FIGS. 16f, 16g, 16h). The data shift circuit 12 synchronizes in phase the WDAT input from the control circuit 11 to the WCLK after the generation of the WGT and issues the four pieces of data $X_1$, $X_2$, $Y_1$ and $Y_2$ of 2-bit units shifted 1 bit each (one clock) (FIGS. 16f, 16g, 16h, 16l to 16p).

The 1-7 encoding circuit 13 performs the known (1-7) RLL encoding processing based on the $X_1$, $X_2$, $Y_1$, and $Y_2$ input form the data shift circuit 12 and outputs the 3-bit unit parallel code data $Z_1$, $Z_2$, and $Z_3$.

When the WDAT is all "0", the "$X_1$, $X_2$" and the "$Y_1$, $Y_2$" are both "00". The "$Z_1$, $Z_2$, and $Z_3$" in the case is encoded to "001" (FIG. 16g, 16l to 16s). On the other hand, the VFO3F generating circuit 14 generates, asynchronously with the WCLK, the clock signal VFO3F with a frequency three times the fundamental frequency 1f (FIGS. 16a and 16f).

The system clock preparing circuit 15 receives the VFO3F from the VFO3F generating circuit 14 and outputs the VFO1/2FRA, VFO1/2FRB, and VFO1/2FRC of the frequency (1/2)f synchronized with the VFO3F and shifted by one clock cycle each (FIGS. 16a, 16c to 16e and FIG. 17a, 17d to 17f), the clock signal VFO3/2F formed by dividing the VFO3F and with a frequency of (3/2)f and its inverted clock *VFO3/2F (FIG. 16b and FIG. 17b, however, *VFO3/2F not shown), and the six synchronization clock signals VFO1/2FA1, VFO1/2FB0, VFO1/2FC4, VFO1/2FA6, VFO1/2FB7, and VFO1/2FC3 (FIGS. 17a, 17g to 17l) synchronized with the VFO3F shifted one clock cycle each and with a frequency of (1/2)f and a width of 2 clocks (2 bits).

The DFF 161 of the synchronization signal generating circuit 16 receives the WCLK and the WGT from the control circuit 11, generates the SYCGT at the rising edge of the WCLK directly after the generation of the WGT, and inputs the same to the CL terminals of the DFF 162A to 162C (FIGS. 16f, 16h, and 16i). The three parallel DFFs 162A, 162B, and 162C, receive the three reference clock signals VFO1/2FRA, VFO1/2FRB, and VFO1/2FRC from the system clock preparing circuit 15 at their D terminals, latch the state of the reference clock signals at rising edge (Ts) of the SYCGT input from the DFF 161 and input the latched values to the phase selection circuit 163. In the case of FIG. 16, the state of the DFF 162A, 162B, and 162C at the rising edge (Ts) of the SYCGT is "001".

The phase selection circuit 163 generates the signal SELECT (0 to 7) for selecting one of the six synchronization clock signals in accordance with the state of the DFFs 162A to 162C. In the case of FIG. 16, the state of the DFF 162A to 162C is "001", so the SELECT 1 for selecting the synchronization clock signal VFO1/2FA1 is output and supplied to the clock selection circuit 164 and the encoding clock phase detection circuit 165. The clock selection circuit 164, receives the six synchronization clock signals VFO1/2FA1 to VFO1/2FC from the system clock preparing circuit 15, selects the VFO1/2FA1 in accordance with the SELECT 1 as the LOAD signal and inputs it into the LOAD circuit 17. The encoding clock phase detection circuit 165, receives the VFO3/2F and *VFO3/2F from the system clock preparing circuit 15, selects the *VFO3/2F as the ENCOD3/2F in accordance with the SELECT 1 input from the phase selection circuit 163 and supplies it to the ENCODE DATA circuit 172.

In this way, regardless of the phase of the VFO3F signal at the rising edge of the SYCGT, the LOAD signal and ENCOD3/2F are unilaterally prepared, as explained in reference to Table 4, Table 5, and FIGS. 18 and 19. Furthermore, the parallel code data $Z_1$ to $Z_2$ are fetched from the (1–7) encoding circuit 13 by the LOAD circuit 171 upon receiving the LOAD signal. Using the ENCODE DATA circuit 172 upon receiving the ENCOD3/2F and LOAD signal, the parallel code data $Z_1$ to $Z_3$ is converted to a serial format to prepare the CODE DATA, as mentioned above.

Above, an explanation was made of an embodiment of the present invention, but the present invention is not limited to the configuration of this embodiment and various modifications are possible.

EFFECTS OF THIRD EMBODIMENT

As explained above, according to the third embodiment of the present invention, the following effects can be obtained:

(1) By fetching the WDAT directly into the (1–7) encoding circuit in 2-bit units, it is possible to fetch data without use of a REF1F with a 50 percent duty ratio.

(2) Encoded data can be synchronized with the ENCOD3/2F by the LOAD signal and ENCOD3/2F prepared using the three reference clock signals and the six synchronization clock signals which can be easily and stably prepared from the VFO3F.

(3) By the above (1) and (2), write data can be fetched without error by a circuit construction simpler than available in the past, thus making it possible to realize a highly reliable write data fetching circuit.

Many widely different embodiments of the present invention may be constructed without departing from the spirit and scope of the present invention. It should be understood that the present invention is not limited to the specific embodiments described in this specification except as defined in the appended claims.

What is claimed is:

1. A circuit for fetching run-length-limited (RLL) coded write data upon receiving a write clock signal having a fundamental frequency, a write gate signal, and write data, said circuit comprising:
   triple frequency clock signal generating means for generating a triple frequency clock signal having a frequency three times the fundamental frequency of the write clock signal;
   system clock signal generating means for receiving the triple frequency clock signal from said triple frequency clock signal generating means and for generating three clock signals, differing from each other by 120° in phase and having output states, and a first frequency divided signal formed by dividing in half the triple frequency clock signal;
   fetching clock generating means for receiving the write gate signal, the write clock signal and the three clock signals and for generating a fetching clock signal synchronized with at least one of the three clock signals depending upon the output states of the three clock signals at the time of change of the write clock signal directly after the generation of the write gate signal;
   synchronization and fetching means for performing a first synchronization and means for performing a first synchronization and fetching operation on the write data by the write clock signal to produce a first synchronized write data and for performing a second synchronization and fetching operation on the first synchronized write data by the fetching clock signal to produce a second synchronized write data; and
   RLL encoding means for RLL encoding on the second synchronized write data from said synchronization and fetching means based on the first frequency divided signal from said system clock signal generating means.

2. A circuit according to claim 1, wherein the write data is stored in a disk apparatus having a servo head receiving a servo clock signal with a phase, and wherein said triple frequency clock signal generating means includes phase synchronization means for synchronizing the triple frequency clock signal with the phase of the servo clock signal from the servo head of the disk apparatus and for outputting a triple frequency signal.

3. A circuit according to claim 2,
wherein the three clock signals include first, second and third clock signals,
wherein said system clock signal generating means comprises:
 a first NOR gate,
 a second NOR gate,
 a third NOR gate,
 a fourth NOR gate,
 a fifth NOR gate,
 a first OR gate,
 a second OR gate,
 a first D-type flip-flop,
 a second D-type flip-flop,
 a third D-type flip-flop, and
 a shift register,
wherein said first, second, third, fourth and fifth NOR gates have input terminals and an output terminal,
wherein said first and second OR gates have input terminals and an output terminal,
wherein said first, second and third D-type flip-flops have a clock terminal, a data input terminal, a positive output terminal, and a negative output terminal,
wherein the triple frequency clock signal is input to the clock terminal of said first D-type flip-flop, the negative output terminal of said first D-type flip-flop is connected to the data input terminal of said first D-type flip-flop, and the first frequency divided signal, comprised of the triple frequency clock signal divided into half, is output from the positive output terminal of said first D-type flip-flop,
wherein the triple frequency clock signal is input to the clock terminal of said second and third D-type flip-flops and said shift register, the input terminals of said first NOR gate are connected to the negative output terminal of said first D-type flip-flop and the positive output terminal of said third D-type flip-flop, the input terminals of said second NOR gate are connected to the positive output terminal of said first D-type flip-flop and the negative output terminal of said third D-type flip-flop, the input terminals of said third NOR gate are connected to the output terminal of the first and second NOR gates and the negative terminal of said second D-type flip-flop, the input terminals of the fourth NOR gate are connected to the negative output terminal of said second and third D-type flip-flops, the input terminals of said fifth NOR gate are connected to the positive output terminal of said second and third D-type flip-flops, the input terminals of said first OR gate are connected to the output terminal of said third NOR gate and the negative output terminal of said second D-type flip-flop, the input terminals of said second OR gate are connected to the output terminal of said fourth and fifth NOR gates, the output of said first OR gate is connected to the data input gate of said second D-type flip-flop, the output of said second OR gate is connected to the data input terminal of said third D-type flip-flop, the first clock signal of the three clock signals is output from the positive output terminal of said second D-type flip-flop, the first clock signal is applied to said shift register, and the second and third clock signals of the three clock signals delayed successively 120° from the first clock signal are output from said shift register.

4. A circuit according to claim 2, wherein, when the three clock signals are in the output states of the following table, said fetching clock generating means generates the fetching clock signal synchronized with one of the three clock signals in dependence upon the relationship defined by the following table:

| STATE OF THE THREE CLOCK SIGNALS | | | FETCH |
|---|---|---|---|
| FIRST | SECOND | THIRD | CLOCK |
| 0 | 0 | 0 | A |
| 0 | 0 | 1 | B |
| 0 | 1 | 0 | B |
| 0 | 1 | 1 | B |
| 1 | 0 | 0 | C |
| 1 | 0 | 1 | C |
| 1 | 1 | 0 | A |
| 1 | 1 | 1 | C |

5. A circuit according to claim 4, wherein said synchronization and fetching means comprises:
 a fourth D-type flip-flop having a positive output terminal, a clock terminal for receiving the write clock signal, and a data input terminal for receiving the write data, and
 a fifth D-type flip-flop having a data input terminal connected the positive output terminal of the fourth D-type flip-flop, a clock terminal for receiving the fetching clock signal.

6. A circuit according to claim 1, wherein said system clock generating means receives the triple frequency clock signal, generates the three clock signals differing by 120° in phase, and generates a delayed clock signal formed by delaying one of the three clock signals by within 1/6 of the fundamental frequency.

7. A circuit according to claim 6,
wherein the three clock signals include first, second and third clock signals,
wherein said system clock signal generating means is comprised of:
 a first NOR gate,
 a second NOR gate,
 a third NOR gate,
 a fourth NOR gate,
 a fifth NOR gate,
 a first OR gate,
 a second OR gate,
 a first D-type flip-flop,
 a second D-type flip-flop,
 a third D-type flip-flop,
 a shift register, and
 a sixth D-type flip-flop,
wherein said first, second, third, fourth and fifth NOR gates have input terminals and an output terminal,
wherein said first and second OR gates have input terminals and an output terminal,
wherein said first, second, third and sixth D-type flip-flops have a clock terminal, a data input terminal, a positive output terminal, and a negative output terminal, wherein the triple frequency clock signal is input to the clock terminal of said first D-type flip-flop, the negative output terminal of said first D-type flip-flop is connected to the data input terminal of said first D-type flip-flop, and the first frequency divided signal, comprised of the triple frequency clock signal divided into half, is output from the positive output terminal of said first D-type flip-flop, wherein the triple frequency clock signal is input to the clock terminal of said second and third D-type flip-flops and said shift register, the input terminals of said first NOR gate are connected to the negative output terminal of said first D-type flip-flop and the positive output terminal of said third D-type flip-flop, the input terminals of said second NOR gate are connected to the positive output terminal of said first D-type flip-flop and the negative output terminal of said third D-type flip-flop, the input terminals of said third NOR gate are connected to the output terminals of said first and second NOR gates and the negative output terminal of said second D-type flip-flop, the input terminals of said fourth NOR gate are connected to the negative output terminal of said second and third D-type flip-flops, the input terminals of said fifth NOR gate are connected to the positive output terminal of said second and third D-type flip-flops, the input terminals of said first OR gate are connected to the output terminal of said third NOR gate and the negative output terminal of said second D-type flip-flop, the input terminals of said second OR gate are connected to the output terminal of said fourth and fifth NOR gates, the output of said first OR gate is connected to the data input gate of said second D-type flip-flop, the output of said second OR gate is connected to the data input terminal of said third D-type flip-flop, the first clock signal of the three clock signals is output from the positive output terminal of said second D-type flip-flop, the first clock signal is applied to said shift register, and the second and third clock signals of the three clock signals delayed successively 120° from the first clock signal are output from said shift register, and wherein one of the three clock signals is applied to the data input terminal of said sixth D-type flip-flop, an inverted signal of the triple frequency clock signal is applied to the clock terminal of said sixth D-type flip-flop, and the delayed clock signal comprised of the one of the three clock signals delayed within a range of 1/6 of the fundamental frequency is output from said sixth D-type flip-flop.

8. A circuit for fetching run-length-limited (RLL) coded write data upon receiving a write clock signal having a fundamental frequency, a write gate signal and write data, the write data is stored in a disk apparatus having a servo head receiving a servo clock signal, comprising:

triple frequency clock signal generating means for generating a triple frequency clock signal having a frequency three times the fundamental frequency of the write clock signal based on the servo signal from the servo head of the disk apparatus;

system clock signal generating means for receiving the triple frequency clock signal from said triple frequency clock signal generating means and for generating three reference clock signals having a frequency half that of the fundamental frequency of the write clock signal and having output states and further being respectively successively shifted by one clock cycle of the triple frequency clock signal, a first frequency divided clock signal formed by dividing in half the triple frequency clock signal and a second frequency divided clock signal formed by inverting the first frequency divided clock signal, and six synchronization clock signals having a frequency half the fundamental frequency, a 2-bit pulse width, and respectively successively shifted by one clock cycle of the triple frequency clock;

synchronization signal generating means for receiving the write gate signal, the write clock signal, the three reference clock signals from said system clock signal generating means and the six synchronization clock signals, and for generating a load signal having a frequency half the fundamental frequency and synchronized with at least one of the six synchronization clock signals in accordance with the output states of the three reference clock signals at the time of change of the write clock signal directly after the generation of the write gate signal and an encoding clock signal having a frequency 3/2 the fundamental frequency and synchronized with one of the first or second frequency divided clock signals in accordance with the output states of the three reference clock signals;

data shift means for receiving the write data and the write clock signal, and for synchronizing the write data to the write clock signal in phase, and for outputting four pieces of data of 2-bit units each shifted by one bit;

RLL encoding means for receiving the four pieces of data from the data shift means, for RLL encoding the four pieces of data, and for outputting a parallel code data of 3-bits; and synchronization means for receiving the load signal and the encoding clock signal from said synchronization signal generating means and for converting the parallel code data into a 3-bit unit code serial data synchronized with the encoding clock signal.

9. A circuit according to claim 8, wherein said synchronization signal generating means generates the load signal synchronized with one of the six synchronization clock signals in dependence upon the output states of the three reference clock signals, directly after the generation of the write gate signal, as defined by the following table:

| STATE OF REFERENCE CLOCKS | | | LOAD SIGNAL SYNC'ED |
|---|---|---|---|
| A | B | C | WITH SYNC. CLOCK |
| 0 | 0 | 0 | Sync. Clock 1 |
| 0 | 0 | 1 | Sync. Clock 2 |
| 0 | 1 | 1 | Sync. Clock 3 |
| 1 | 0 | 0 | Sync. Clock 4 |
| 1 | 1 | 0 | Sync. Clock 5 |
| 1 | 1 | 1 | Sync. Clock 6 |

10. A write data fetching circuit receiving a write clock signal with a write clock frequency, write data and a write gate signal from a control circuit and receiving a triple frequency clock with a frequency three times that of the write clock frequency, comprising:

system clock generating means for generating first, second and third system clocks, each having output states and each synchronized with the triple frequency clock, the second system clock being delayed in phase by one clock cycle of the triple frequency clock relative to the first system clock, the third system clock being further delayed in phase by one clock cycle of the triple frequency clock relative to the second system clock; and fetch clock selection means, operatively connected to the control circuit and said system clock generating means, for selecting one of the first, second and third system clocks as a fetch clock in dependence upon the output state of the first, second and third system clocks at a rising edge of the write clock signal directly following the generation of the write gate signal.

11. A write data fetching circuit according to claim 10, further comprising encoding clock generating means, operatively connected to said system clock generating means, for generating an encoding clock synchronized with the triple frequency clock and of a frequency 3/2 times that of the write clock frequency.

12. A write data fetching circuit according to claim 11, wherein the relationship between the output states of the first, second and third system clocks and the selecting by said fetch clock selection means is defined in the following table:

| OUTPUT STATES OF THE THREE CLOCK SIGNALS | | | |
|---|---|---|---|
| FIRST | SECOND | THIRD | FETCH CLOCK |
| 0 | 0 | 0 | VFO1FA |
| 0 | 0 | 1 | VFO1FB |
| 0 | 1 | 0 | VFO1FB |
| 0 | 1 | 1 | VFO1FB |
| 1 | 0 | 0 | VFO1FC |
| 1 | 0 | 1 | VFO1FC |
| 1 | 1 | 0 | VFO1FA |
| 1 | 1 | 1 | VFO1FC |

13. A write data fetching circuit according to claim 12, wherein the first, second and third system clocks have a frequency equal to the write clock frequency,
wherein the triple frequency clock is a synchronous with respect to the write clock, and
wherein said encoding means further performs run-length-limited coding of the write data in dependence upon the encoding clock.

14. A write data fetching circuit according to claim 11, wherein said system clock generating means further generates a delayed clock signal by further delaying the phase one of the first, second and third system clocks ½ cycle of the triple frequency clock.

15. A write data fetching circuit according to claim 14, wherein the relationship between the output states of the first, second and third system clocks and the selecting by said fetch clock selection means is defined in the following table:

| OUTPUT STATES OF THE THREE CLOCK SIGNALS | | | |
|---|---|---|---|
| FIRST | SECOND | THIRD (Delayed) | FETCH CLOCK |
| 0 | 0 | 0 | A |
| 0 | 0 | 1 | B |
| 0 | 1 | 0 | B |
| 0 | 1 | 1 | B |
| 1 | 0 | 0 | C |
| 1 | 0 | 1 | C |
| 1 | 1 | 0 | A |
| 1 | 1 | 1 | C |

16. A write data fetching circuit according to claim 15, wherein the first, second and third system clocks have a frequency equal to the write clock frequency,
wherein triple frequency clock is a synchronous with respect to the write clock, and
wherein said encoding means further performs run-length-limited coding of the write data in dependence upon the encoding clock.

17. A write data fetching circuit receiving a write clock signal with a write clock frequency, write data and a write gate signal from a control circuit and receiving a triple frequency clock with a frequency three times that of the write clock frequency, comprising:
system clock generating means for generating first, second and third system clocks, each having output states and each synchronized with the triple frequency clock, the second system clock being delayed in phase by one clock cycle of the triple frequency clock relative to the first system clock, the third system clock being further delayed in phase by one clock cycle of the triple frequency clock relative to the second system clock, and for generating six synchronization clocks, each synchronized with the triple frequency clock and each of the six synchronization clocks being delayed in phase by one clock cycle of the triple frequency clock relative to one of the six synchronization clocks resulting in six synchronization clocks each having a different phase delay; and
LOAD clock section means for selecting one of six synchronization clocks as a load clock in dependence upon the output states of the first, second and third system clocks at a rising edge of the write clock signal directly following the generation of the write gate signal.

18. A write data fetching circuit according to claim 17, further comprising encoding clock generating means, operatively connected to said load clock selection means, for generating an encoding clock synchronized with the triple frequency clock and having a frequency 3/2 times that of the write clock frequency.

19. A write data fetching circuit according to claim 18, wherein the relationship between the output states of the first, second and third system clocks and the selecting by said load clock selection means is defined in the following table:

| OUTPUT STATES OF REFERENCE CLOCKS | | | LOAD SIGNAL SYNC'ED WITH SYNC. CLOCK |
|---|---|---|---|
| A | B | C | |
| 0 | 0 | 0 | Sync. Clock 1 |
| 0 | 0 | 1 | Sync. Clock 2 |
| 0 | 1 | 1 | Sync. Clock 3 |
| 1 | 0 | 0 | Sync. Clock 4 |
| 1 | 1 | 0 | Sync. Clock 5 |
| 1 | 1 | 1 | Sync. Clock 6 |

20. A write data fetching circuit according to claim 19, wherein said circuit further comprises:
data shift means for receiving the write data, the write gate signal and the write clock signal and for generating shifted write data;
encoding means, operatively connected to said data shift means, for encoding the shifted write data into parallel run-length-limited (RLL) data; and
synchronization means, operatively connected to said encoding means and said load clock selection means, for receiving the load clock and the encoding clock and converting the parallel RLL coded data into a serial code data synchronized with the encoding clock,
wherein the first, second and third system clocks have a frequency equal to the write clock frequency,
wherein the six synchronization clocks have a frequency equal to ½ times that of the write clock frequency, and
wherein the triple frequency clock is a synchronous with respect to the write clock.

* * * * *

UNITED STATES PATENT AND TRADEMARK OFFICE
CERTIFICATE OF CORRECTION

PATENT NO. : 4,916,558

DATED : April 10, 1990

INVENTOR(S) : Masahiro NISHIMURA et al.

It is certified that error appears in the above-identified patent and that said Letters Patent is hereby corrected as shown below:

Col. 3, line 21, "freque ncy" should be --frequency--;

line 31, "once" should be ---one--;

line 66, "V$^c$FIGS. 2a to 2a" should be (as a new paragraph) --FIGS. 2a to 2p--.

Col. 4, line 1, "3a3" should be --3i3--;

line 13, "tration" should be --trating--;

line 25, delete "are";

line 34, "FIG" should be --FIGS--;

Col. 5, line 60, "2L" should be --21--.

Col. 6, line 34, "form" should be --from--;

line 53, "WDt" should be --WDT--.

Col. 7, line 40, "WDt" should be --WDT--;

line 50, "causes" should be --cases--;

line 55, "WDt" should be --WDT--.

UNITED STATES PATENT AND TRADEMARK OFFICE
CERTIFICATE OF CORRECTION

PATENT NO. : 4,916,558

DATED : April 10, 1990

INVENTOR(S) : Masahiro NISHIMURA et al.

It is certified that error appears in the above-identified patent and that said Letters Patent is hereby corrected as shown below:

Col. 8, line 8, "tages" should be --tage--;

line 11, "denomitor" should be --denominator--;

line 16, after "realize" insert --a reliable--.

Col. 10, line 2, "clcok" should be --clock--.

Col. 11, line 19, "6C" should be --6c--;

line 54, "a data input terminal,"
should be --an output terminal.--; and
delete "CR is a";

line 55, delete "clear terminal, and Q is an output terminal.";

line 62, "133" should be --131--.

Col. 12, line 17, "form" should be --from--;

line 23, "162$B_3$" should be --163$B_3$--;

line 27, "*Y, *Y," should be --*X, *Y--;

line 29, "and" should be --the--.

UNITED STATES PATENT AND TRADEMARK OFFICE
CERTIFICATE OF CORRECTION

PATENT NO. : 4,916,558
DATED : April 10, 1990
INVENTOR(S) : Masahiro NISHIMURA et al.

It is certified that error appears in the above-identified patent and that said Letters Patent is hereby corrected as shown below:

Col. 13, line 18, "FIG. c)" should be --FIG. 10c)--.

Col. 14, line 8, "prpearing" should be --preparing--.

Col. 15, line 5, "output" should be --outputs--;

line 20, "embodimewnt" should be --embodiment--.

Col. 16, line 2, "base" should be --based--;

line 67, "meansings" should be --meanings--.

Col. 18, line 25, "signals" should be --signal--.

Col. 21, line 41, "dta" should be --data--;

line 62, "writer" should be --write--.

Col. 23, line 56, "form" should be --from--;

line 63, "*VFO3/F" should be --*VFO3/2F--.

Col. 24, line 66, "prepar-" should be --prepared--;

line 67, delete "ing".

Col. 25, line 17, "and" should be --to--;

UNITED STATES PATENT AND TRADEMARK OFFICE
CERTIFICATE OF CORRECTION

PATENT NO. : 4,916,558
DATED : April 10, 1990
INVENTOR(S) : Masahiro NISHIMURA et al.

It is certified that error appears in the above-identified patent and that said Letters Patent is hereby corrected as shown below:

|  |  |
|---|---|
|  | line 54, before "LOAD" insert --the--; |
|  | line 56, "a" should be --at--. |
| Col. 26, | line 3, "sunchronized" should be --synchronized--; |
|  | line 56, "form" should be --from--. |
| Col. 27, | line 23, "numberal" should be --numeral--; |
|  | line 36, "numberal" should be --numeral--; |
|  | line 45, "numberal" should be --numeral--; |
|  | line 66, "form" should be --from--. |
| Col. 28, | line 26, "and" should be --as--. |
| Col. 29, | line 53, "the" (first Occur.) should be --this--. |

UNITED STATES PATENT AND TRADEMARK OFFICE
CERTIFICATE OF CORRECTION

PATENT NO. : 4,916,558

DATED : April 10, 1990

INVENTOR(S) : Masahiro Nishimura et al.

It is certified that error appears in the above-identified patent and that said Letters Patent is hereby corrected as shown below:

Col. 30, line 2, "terminal" should be --terminals--;

line 67, "form" should be --from--.

Col. 31, line 62, "$Z_2$" should be --$Z_3$--.

Signed and Sealed this

Twenty-second Day of October, 1991

Attest:

HARRY F. MANBECK, JR.

*Attesting Officer*  *Commissioner of Patents and Trademarks*